(12) United States Patent
Tanitsu et al.

(10) Patent No.: US 7,515,247 B2
(45) Date of Patent: Apr. 7, 2009

(54) ILLUMINATION OPTICAL SYSTEM, EXPOSURE APPARATUS, AND EXPOSURE METHOD WITH POLARIZED STATE FLUCTUATION CORRECTING DEVICE

(75) Inventors: Osamu Tanitsu, Kumagaya (JP);
Hirohisa Tanaka, Kumagaya (JP);
Kenichi Muramatsu, Sagamihara (JP);
Norio Komine, Sagamihara (JP);
Hisashi Nishinaga, Tokima (JP);
Tomoyuki Matsuyama, Korihashi-machi (JP); Takehito Kudo, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/979,516

(22) Filed: Nov. 5, 2007

(65) Prior Publication Data

US 2008/0094602 A1    Apr. 24, 2008

Related U.S. Application Data

(60) Division of application No. 11/140,103, filed on May 31, 2005, now Pat. No. 7,423,731, which is a continuation-in-part of application No. PCT/JP03/015447, filed on Dec. 2, 2003.

(30) Foreign Application Priority Data

Dec. 3, 2002 (JP) .............................. 2002-351186
Jul. 24, 2003 (JP) .............................. 2003-201079
Sep. 29, 2003 (JP) .............................. 2003-338447

(51) Int. Cl.
*G03B 27/72* (2006.01)

(52) U.S. Cl. ..................................... 355/71

(58) Field of Classification Search ................ 355/71, 355/67, 53; 356/364
See application file for complete search history.

(56) References Cited

U.S. PATENT DOCUMENTS

| | | | |
|---|---|---|---|
| 5,072,126 | A | 12/1991 | Progler |
| 5,559,583 | A | 9/1996 | Tanabe |
| 5,677,755 | A | 10/1997 | Oshida et al. |
| 5,684,567 | A | 11/1997 | Shiozawa |
| 5,969,441 | A | 10/1999 | Loopstra et al. |
| 6,238,063 | B1 | 5/2001 | Tanitsu et al. |
| 6,400,441 | B1 | 6/2002 | Nishi et al. |

(Continued)

FOREIGN PATENT DOCUMENTS

EP    0823662 A2    2/1998

(Continued)

*Primary Examiner*—Hung Henry Nguyen
*Assistant Examiner*—Chia-how Michael Liu
(74) *Attorney, Agent, or Firm*—Oliff & Berridge, PLC

(57) ABSTRACT

An illumination optical system for, when installed in an exposure system, realizing a suitable illumination condition by varying the polarized state of the illumination light according to the pattern characteristics of the mask while suppressing the loss of the intensity of the light. The illumination optical system has a light source unit for supplying a linearly polarized light for illuminating surfaces to be illuminated therewith, and a polarized state changing device for changing the polarized state of the illuminating light from a predetermined polarized state to a nonpolarized state and vice versa. The polarized state changing device is arranged in the optical path between the light source unit and the surfaces to be illuminated. The polarized state changing device can be removed from the illumination optical path and has a depolarizer for selectively depolarizing the incident linearly polarized light.

30 Claims, 30 Drawing Sheets

U.S. PATENT DOCUMENTS

| | | |
|---|---|---|
| 6,483,573 B1 | 11/2002 | Schuster |
| 6,762,824 B2 | 7/2004 | Mori |
| 7,098,992 B2 * | 8/2006 | Ohtsuki et al. ............ 355/69 |
| 2002/0015282 A1 | 2/2002 | Bang |
| 2002/0163741 A1 * | 11/2002 | Shibazaki ............ 359/819 |
| 2003/0025890 A1 | 2/2003 | Nishinaga |
| 2003/0067591 A1 | 4/2003 | Komatsuda |
| 2003/0086071 A1 * | 5/2003 | McGuire, Jr. ............ 355/71 |
| 2004/0036977 A1 | 2/2004 | Tanaka et al. |

FOREIGN PATENT DOCUMENTS

| | | |
|---|---|---|
| EP | 1139521 A1 | 10/2002 |
| JP | A-6-124873 | 5/1994 |
| JP | A 06-140306 | 5/1994 |
| JP | A 06-204121 | 7/1994 |
| JP | A-10-303114 | 11/1998 |
| JP | A-2002-184676 | 6/2002 |
| JP | A 2003-188087 | 7/2003 |
| WO | WO99/49504 | 9/1999 |
| WO | WO 01/20733 * | 3/2001 |

* cited by examiner

ILLUMINATION OPTICAL SYSTEM, EXPOSURE APPARATUS, AND EXPOSURE METHOD WITH POLARIZED STATE FLUCTUATION CORRECTING DEVICE

RELATED APPLICATIONS

This is a Divisional application of Ser. No. 11/140,103 filed May 31, 2005, which is a Continuation-In-Part of International Application No. PCT/JP03/015447 filed Dec. 2, 2003. The disclosure of each prior application is incorporated by reference herein in its entirety. The disclosure of each of the following priority applications is herein incorporated by reference in its entirety: Japanese Patent Application No. 2002-351186 filed Dec. 3, 2002; Japanese Patent Application No. 2003-201079 filed Jul. 24, 2003; and Japanese Patent Application No. 2003-338447 filed Sep. 29, 2003.

BACKGROUND

This invention relates to illumination optical systems, exposure apparatus and exposure methods. In particular, this invention relates to exposure apparatus for manufacturing micro devices, such as semiconductor elements, imaging elements, flat panel displays such as liquid crystal display elements and thin-film magnetic heads, using lithographic processes.

In typical exposure apparatus of this type, a secondary light source, which functions as a substantially planar light source composed of a plurality of light sources, is formed by a light beam from a light source that is transmitted through a fly's-eye lens that functions as an optical integrator. The light beams from the secondary light source are incident to a condenser lens after being regulated through an aperture diaphragm positioned near a rear focal plane of the fly's-eye lens.

The light beams converged by the condenser lens illuminate superimposingly a mask on which a predetermined pattern is formed. The light transmitted through mask pattern forms an image on a wafer through a projection optical system. As a result, the mask pattern is projected and exposed (transferred) onto the wafer. Because the pattern formed on the mask is highly integrated, it is necessary to obtain a uniform illumination distribution on the wafer in order to accurately transfer the micro patterns onto the wafer.

Accordingly, attention has been given to a technology in which a circular secondary light source is formed on the rear focal plane of the fly's-eye lens, and illumination coherency $\sigma$ ($\sigma$=an aperture diaphragm diameter/a pupil diameter of a projection optical system; or $\sigma$=an exit-side numerical aperture of an illumination optical system/an incident-side numerical aperture of the projection optical system) is changed by varying a size of the secondary light source. Moreover, attention has been given to a technology in which a depth of focus and resolution of the projection optical system are improved by forming an annular or quadrupole secondary light source.

In the above-described conventional exposure apparatus, normal circular illumination is performed with a circular secondary light source, and modified illumination (annular or quadrupole illumination) is performed with an annular or quadrupole secondary light source, depending on the characteristics of the mask pattern. However, it is generally the case that, regardless of the characteristics of the mask pattern, the mask is illuminated with light whose polarized state is not changed, that is, light in a nonpolarized state. Appropriate illumination conditions that are required to precisely transfer the mask pattern onto the wafer are not always secured.

SUMMARY OF THE INVENTION

A first object of this invention is to provide an illumination optical system that, when installed on an exposure apparatus, allows the achievement of appropriate illumination conditions by changing the polarized state of the illumination light in accordance with the characteristics of the mask pattern, while controlling a loss of a light amount.

Another object of this invention is to provide an exposure apparatus and an exposure method that uses an illumination optical system that changes the polarized state of the illumination light in accordance with the characteristics of the mask pattern, to perform excellent exposure under appropriate illumination conditions that are accomplished in accordance with the characteristics of the mask pattern.

According to a first aspect, an illumination optical system, arranged in an optical path between a linearly polarized light source and an illuminated surface, includes a polarized state switching device that is positioned in a light path between the light source and the illuminated surface. The polarized state switching device switches the polarized state of the light that illuminates the illuminated surface between a predetermined polarized state and a nonpolarized state. It is preferable that the polarized state switching device is insertable into and removable from an illumination light path and includes a depolarizer that selectively unpolarizes the incident linearly polarized light.

According to a second aspect, an illumination optical system that illuminates an illuminated surface under a predetermined polarized state with light from a light source includes a light directing device that directs the light from the light source to the illuminated surface and is positioned in a light path between the light source and the illuminated surface, and a polarized state fluctuation correcting device that corrects fluctuations in the polarized state on the illuminated surface and that is positioned in the light path between the light source and the illuminated surface.

According to a third aspect, an illumination optical system that illuminates an illuminated surface under a predetermined polarized state with light from a light source includes a light directing device that directs the light from the light source to the illuminated surface and is positioned in a light path between the light source and the illuminated surface, and a polarized state stabilizing device that stabilizes the polarized state on the illuminated surface and that is positioned in the light path between the light source and the illuminated surface.

BRIEF DESCRIPTION OF THE DRAWINGS

The invention will be described in conjunction with the following drawings of exemplary embodiments in which like reference numerals designate like elements, and in which.

DETAILED DESCRIPTION OF EXEMPLARY EMBODIMENTS

Figure 1:
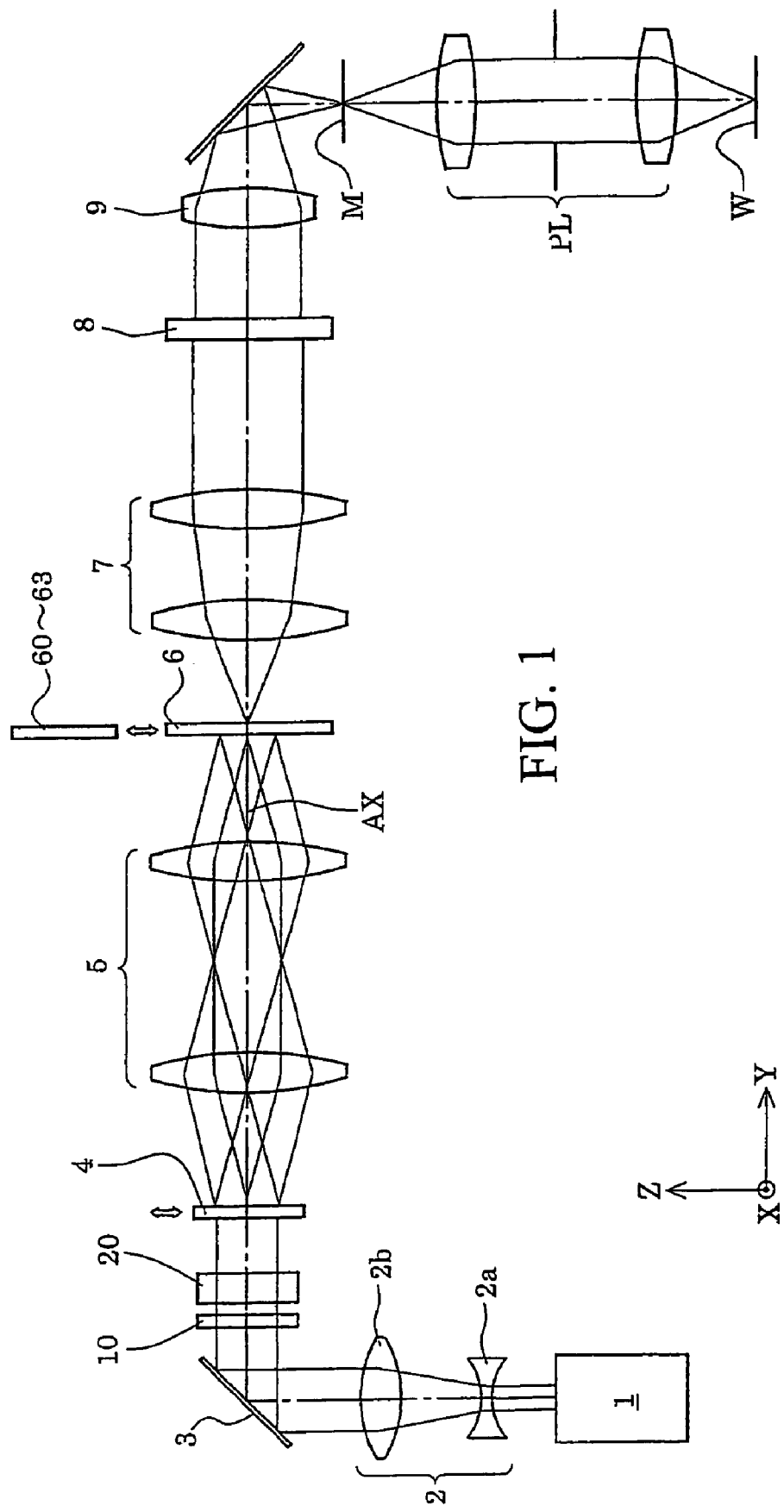
FIG. 1 is a diagram schematically showing a structure of an exposure apparatus equipped with an illumination optical system according to an exemplary embodiment of this invention.

According to a first embodiment, an illumination optical system that has a light source for providing linearly polarized light and that illuminates an illuminated surface with the light from the light source includes a polarized state switching device that is positioned in a light path between the light source and the illuminated surface and that switches the polarized state of the light that illuminates the illuminated surface between a predetermined polarized state and a non-polarized state.

The polarized state switching device is insertable into and removable from an illumination light path and includes a depolarizer that selectively unpolarizes the incident linearly polarized light.

According to the first embodiment, the polarized state switching device varies a polarization plane of the linearly polarized light if the predetermined polarized state is a linearly polarized state. In addition, it is preferable that the polarized state switching device includes a phase member for selectively changing a polarization plane of the incident linearly polarized light. In this case, the phase member has a half-wave plate with a crystal optic axis that is rotatable about an optical axis of the illumination optical system.

In addition, according to the first embodiment, the depolarizer includes a crystal prism having a crystal optic axis that is rotatable about an optical axis of the illumination optical system. In addition, it is preferable that the depolarizer includes a polarized beam splitter and a reflection system that returns the light reflected by the polarized beam splitter back to the polarized beam splitter by reflecting the light plural times in a plane, such that a light path of light that is transmitted through the polarized beam splitter and a light path of light reflected by the polarized beam splitter substantially match each other. It is preferable that the polarized beam splitter and the reflection system are integrally rotatable about the optical axis of the illumination optical system.

In addition, according to the first embodiment, the depolarizer includes a polarized beam splitter and a reflection system that returns the light reflected by the polarized beam splitter back to the polarized beam splitter by reflecting the light plural times in a plane such that a light path of light that is transmitted through the polarized beam splitter and a light path of light reflected by the polarized beam splitter substantially match each other. It is preferable that the polarized beam splitter and the reflection system are integrally insertable into and removable from an illumination light path.

In addition, according to the first embodiment, the polarized state switching device further includes a second phase member for converting incident elliptically polarized light into linearly polarized light. In this case, it is preferable that the second phase member includes a quarter-wave plate having a crystal optic axis that is rotatable about an optical axis of the illumination optical system.

Further, according to the first embodiment, a light transmissive member is positioned in the light path between the light source and the polarized state switching device and is formed by a cubic system (isometric system) crystal material, and the light transmissive member is oriented such that a traveling direction of the light becomes closer to a crystal orientation <111> or <100> than to a crystal orientation <110>. In this case, it is preferable that the light transmissive member is positioned in the light path between the polarized state switching device and the illuminated surface, and is formed by a cubic system crystal material, and the light transmissive member is oriented such that a traveling direction of the light becomes closer to a crystal orientation <111> or <100> than to a crystal orientation <110>.

It is preferable that the light transmissive member includes an optical member fixedly positioned in the light path, and that an optical axis of the optical member substantially matches the crystal orientation <111> or <100>. In addition, it is preferable that the light transmissive member includes a rectangular prism as a rear surface reflection mirror, that an incident surface and an exit surface of the rectangular prism substantially match a crystal plane {100}, and that a reflection surface of the rectangular prism substantially matches a crystal plane {110}. In addition, it is preferable that the light transmissive member includes a plane parallel plate for moving light entering along the optical axis in parallel, and the light transmissive member is provided in the light path and is inclinable with respect to the optical axis. It is preferable that the optical axis of the plane parallel plate substantially matches the crystal orientation <100>.

In addition, according to the first embodiment, the illumination optical system also includes an illumination pupil distribution forming device that forms a predetermined light intensity distribution on or adjacent to a pupil plane of the illumination optical system, a changing device that changes at least one of a shape and a size of the predetermined light intensity distribution, and a light direction optical system that directs a light beam from the predetermined light intensity distribution to the illuminated surface. In this case, it is preferable that the polarized state switching device changes a polarized state of the light that illuminates the illuminated surface in accordance with the change in at least one of the shape and the size of the predetermined light intensity distribution. In addition, it is preferable that the polarized state switching device switches the polarized state of the light that illuminates the illuminated surface between a linearly polarized state and a nonpolarized state in accordance with the change in at least one of the shape and the size of the predetermined light intensity distribution.

In addition, according to the first embodiment, in the predetermined polarized state, an S1 component of a Stokes parameter of the light satisfies a condition $0.6 \leq |S1|$. In addition, it is preferable that in the nonpolarized state, S1 and S2 components of a Stokes parameter of the light satisfy conditions $|S1| \leq 0.1$ and $|S2| \leq 0.1$. Moreover, it is preferable that the illumination optical system further includes a polarized state fluctuation correcting device that corrects fluctuations of the polarized state on the illuminated surface, and that the polarized state fluctuation correcting device is positioned in the light path between the light source and the illuminated surface. In this case, the polarized state fluctuation correcting device includes a polarization monitor positioned in the light path between the polarized state switching device and the illuminated surface to detect the polarized state of the light, and a controller that controls the polarized state switching device in response to an output from the polarization monitor.

In addition, according to the first embodiment, the polarized state switching device includes a half-wave plate having a crystal optic axis that is rotatable about the optical axis of the illumination optical system, and a quarter-wave plate having a crystal optic axis that is rotatable about the optical axis of the illumination optical system. In response to changes in detection results obtained from the polarization monitor when respectively changing the crystal optic axes of the quarter-wave plate and the half-wave plate, the controller adjusts an angular position of the crystal optic axis of the quarter-wave plate to a predetermined position for converting incident elliptically polarized light into linearly polarized light, and an angular position of the crystal optic axis of the half-wave plate to a predetermined position for converting incident linearly polarized light to linearly polarized light that has a polarization plane in a predetermined direction. In this case, it is preferable that the controller adjusts the angular position of the crystal optic axis of the quarter-wave plate to a first angular position, at which a contrast for changes in the S1 component of the Stokes parameter in the detection result becomes substantially maximum, and changes the angular position of the crystal optic axis of the half-wave plate to a second angular position at which the S1 component of the Stokes parameter in the detection result becomes substantially maximum or substantially minimum while the crystal optic axis of the quarter-wave plate is set at the first angular position.

In addition, according to the first embodiment, the polarization monitor is positioned in the light path between the polarized state switching device and the illuminated surface and includes a beam splitter that extracts from the light path reflected light or transmitted light having a polarized state that is different from the polarized state of the incident light and a light intensity detector that detects the intensity of the reflected light or the transmitted light extracted by the beam splitter. The polarized state of the incident light to the beam splitter is detected based on an output of the light intensity detector. In this case, it is preferable that the beam splitter has reflectivity or transmissivity, in which intensity Ip for p-polarized light and intensity Is for s-polarized light included in the reflected light or the transmitted light satisfy a condition that an intensity ratio Ip/Is is less than ½ (Ip/Is<½) or more than 2 (Ip/Is>2).

In addition, according to the first embodiment, the illumination optical system further includes an illumination pupil distribution forming device that forms a predetermined light intensity distribution on or adjacent to a pupil plane of the illumination optical system. The illumination pupil distribution forming device forms two areas having a high light intensity distribution that are spaced along a direction of the pupil plane or a surface adjacent thereto that corresponds to a predetermined first direction on the illuminated surface. The polarized state switching device sets the polarized state of the light that illuminates the illuminated surface from the two areas having a high light intensity distribution to a linearly polarized state that has a polarization plane in a direction substantially orthogonal to the predetermined first direction. In this case, the two areas having a high light intensity distribution are formed symmetrically about the optical axis of the illumination optical system, and a value σo defined by a ratio φo/φp satisfies a condition $0.7 \leq \sigma o$ where φo is a diameter of a circle about the optical axis that circumscribes the two areas having a high light intensity distribution, and φp is a diameter of the pupil plane. It is preferable that the two areas having a high light intensity distribution are formed symmetrically about the optical axis of the illumination optical system, and a value σo defined by a ratio φo/φp and σi defined by a ratio φi/φp satisfy a condition $0.5 \leq \sigma i/\sigma o$ where φo is a diameter of a circle about the optical axis that circumscribes the two areas having a high light intensity distribution, φp is a diameter of the pupil plane, and φi is a diameter of a circle about the optical axis that inscribes the two areas having a high light intensity distribution.

In a second embodiment, an illumination optical system that illuminates an illuminated surface under a predetermined polarized state with light from a light source includes a light directing device that directs the light from the light source to the illuminated surface and is positioned in a light path between the light source and the illuminated surface, and a polarized state fluctuation correcting device that corrects fluctuations in the polarized state on the illuminated surface and is positioned in the light path between the light source and the illuminated surface.

According to the second embodiment, the polarized state fluctuation correcting device includes a polarized state adjusting device that adjusts the polarized state on the illuminated surface and is positioned in the light path between the light source and the illuminated surface, a polarization monitor that detects the polarized state of the light and is positioned in the light path between the light source and the illuminated surface, and a controller that controls the polarized state adjusting device in accordance with an output from the polarization monitor. In this case, it is preferable that the polarized state adjusting device includes an adjustable phase plate positioned in the light path between the light source and the polarization monitor. In addition, according to the second embodiment, it is preferable that the light directing device includes an optical member having characteristics that change the polarized state of incident light and then ejects that light. The optical member may be formed by a crystal optical material.

In a third embodiment, an illumination optical system that illuminates an illuminated surface with light from a light source includes a light directing device that directs the light from the light source to the illuminated surface and is positioned in a light path between the light source and the illuminated surface, and a polarized state stabilizing device that stabilizes the polarized state on the illuminated surface and is positioned in the light path between the light source and the illuminated surface.

According to the third embodiment, the polarized state stabilizing device includes a polarized state adjusting device that adjusts the polarized state on the illuminated surface and is positioned in the light path between the light source and the illuminated surface, a polarization monitor that detects the polarized state of the light and is positioned in the light path between the light source and the illuminated surface, and a controller that controls the polarized state adjusting device in accordance with an output from the polarization monitor. In this case, it is preferable that the light directing device includes an optical member having characteristics that change the polarized state of incident light and then ejects that light. The optical member may be formed by a crystal optical material.

In addition, according to the third embodiment, the polarized state stabilizing device includes a light transmissive member formed by a cubic system crystal material that is positioned in the light path between the light source and the illuminated surface. In this case, it is preferable that the light transmissive member is oriented such that a traveling direction of the light becomes closer to a crystal orientation <111> or <100> than a crystal orientation <110>. In addition, it is preferable that the light transmissive member includes an optical member fixedly positioned in the light path and that an optical axis of the optical member is oriented to substantially match the crystal orientation <111> or <100>. It may instead be preferable that the light transmissive member includes a rectangular prism as a rear surface reflection mirror, that an incident surface and an exit surface of the rectangular prism are oriented to substantially match a crystal plane {100}, and that a reflection surface of the rectangular prism is oriented to substantially match a crystal plane {110}. It may instead be preferable that the light transmissive member includes a plane parallel plate for moving light entering along the optical axis in parallel and that is provided in the light path and is inclinable with respect to the optical axis, and that the optical axis of the plane parallel plate is oriented to substantially match the crystal orientation <100>.

According to a fourth embodiment, a method for adjusting an illumination optical system that illuminates an illuminated surface in a predetermined polarized state by light from a light source includes a wavelength plate setting step that sets a quarter-wave plate in an illumination light path of the illumination optical system such that a crystal optic axis of the quarter-wave plate is set at a predetermined angular position, and sets a half-wave plate in the illumination light path such that a crystal optic axis of the half-wave plate is set at a predetermined angular positioned. Based on a result of detection of the polarized state of the light in the light path between a polarized state switching device and the illuminated surface, the crystal optic axes of the quarter-wave plate and the half-wave plate are respectively changed. The wavelength plate setting step sets the crystal optic axis of the quarter-wave plate at a desired position for converting incident elliptically polarized light into linearly polarized light and the crystal optic axis of the half-wave plate at a standard position for converting incident linearly polarized light into linearly polarized light that has a polarization plane in a predetermined direction.

According to the fourth embodiment, the crystal optic axis of the quarter-wave plate is set at a first angular position, at which a contrast for changes in an S1 component of a Stokes parameter becomes substantially maximum in the detection result, and the crystal optic axis of the half-wave plate is set at a second angular position at which the S1 component of the Stokes parameter becomes substantially maximum or substantially minimum in the detection result while the crystal optic axis of the quarter-wave plate is set at the first angular position. In addition, it is preferable that the method also includes an illumination pupil forming step that forms a predetermined light intensity distribution on or adjacent to a pupil plane of the illumination optical system by the light from the light source, an illumination pupil changing step that changes at least one of a shape and a size of the predetermined light intensity distribution, and a wavelength plate resetting step that resets at least one of the crystal optic axes of the quarter-wave plate and the half-wave plate.

According to a fifth embodiment, an exposure apparatus that includes the illumination optical system described in the first-third embodiments or the illumination optical system adjusted by the adjustment method described in the fourth embodiment is provided.

According to the fifth embodiment, the exposure apparatus also includes a projection optical system that is positioned in the light path between a first plane at which the mask is positioned, and a second plane at which the photosensitive substrate is positioned, and that forms an image of a pattern of the mask onto the second plane, a pupil intensity distribution forming device that forms a predetermined light intensity distribution at a position conjugate to the pupil of the projection optical system or a position adjacent thereto, and a pupil intensity distribution changing device that changes at least one of a shape and a size of the predetermined light intensity distribution. In this case, it is preferable that the exposure apparatus also includes a polarized state changing device that is positioned in the light path between the light source and the illuminated surface and changes the polarized state of the light that illuminates the illuminated surface. The pupil intensity distribution changing device preferably changes at least one of the shape and the size of the predetermined light intensity distribution in accordance with pattern characteristics of the mask. The polarized state changing device preferably changes the polarized state of the light that illuminates the illuminated surface in accordance with at least one of the shape and the size of the predetermined light intensity distribution. In addition, it is preferable that the polarized state changing device includes a polarized state switching device that switches the polarized state of the light that illuminates the illuminated surface between a predetermined polarized state and a nonpolarized state, and that the polarized state switching device switches between the predetermined polarized state and the nonpolarized state in accordance with a change in at least one of the shape and the size of the predetermined light intensity distribution.

Furthermore, according to the fifth embodiment, the pupil intensity distribution forming device forms two areas having a high light intensity distribution that are spaced away from each other along a pitch direction of a line-and-space pattern formed on the mask. The polarized state changing device sets the polarized state of the light that illuminates the illuminated surface from the two areas having a high light intensity distribution to a linearly polarized state that has a polarization plane in a direction orthogonal to the pitch direction. Instead, it may be preferable that the pupil intensity distribution forming device forms one area having a high light intensity distribution substantially about the optical axis of the illumination optical system, and that the polarized state changing device sets the polarized state of the light that illuminates the illuminated surface from the one area having a high light intensity distribution to the linearly polarized state that has a polarization plane in a direction substantially orthogonal to the pitch direction of the line-and-space pattern formed on a phase shift mask as the mask. In this case, it is preferable that the value $\sigma$ that is defined by a ratio $\phi/\phi p$ satisfies a condition $\sigma \leq 0.4$ where $\phi$ is a size of the one area having a high light intensity distribution, and $\phi p$ is a diameter of the pupil plane.

In a sixth embodiment, an exposure method includes an illumination step that illuminates a mask through the illumination optical system of the first-third embodiments or an illumination optical system adjusted in accordance with the adjustment method of the fourth embodiment, and an exposure step that exposes a pattern on the mask onto the photosensitive substrate positioned on the illuminated surface.

According to the sixth embodiment, the exposure method further includes a projection step that forms an image of the pattern on the mask using a projection optical system, a pupil intensity distribution forming step that forms a predetermined light intensity distribution at a position conjugate to the pupil of the projection optical system or a position adjacent thereto, and a pupil intensity distribution changing step that changes at least one of a shape or a size of the predetermined light intensity distribution. In this case, it is preferable that the pupil intensity distribution changing step changes at least one of the shape and the size of the predetermined light intensity distribution in accordance with pattern characteristics of the mask, and that the exposure method also includes a polarized state changing step that changes a polarized state of the light that illuminates the illuminated surface in accordance with a change in the at least one of the shape and the size of the predetermined light intensity distribution.

In addition, according to the sixth embodiment, the pupil intensity distribution forming step forms two areas having a high light intensity distribution spaced away from each other along a pitch direction of a line-and-space pattern formed on the mask, and the exposure method also includes a step that sets the polarized state of the light that illuminates the illuminated surface from the two areas having a high light intensity distribution to a linearly polarized state that has a polarization plane in a direction substantially orthogonal to the pitch direction. In this case, it is preferable that the two areas having a high light intensity distribution are formed symmetrically about the optical axis of the illumination optical system, and that a value $\sigma o$ defined by a ratio $\phi o/\phi p$ satisfies a condition $0.7 \leq \sigma o$ where $\phi o$ is a diameter of a circle about the optical axis that circumscribes the two areas having a high light intensity distribution, and $\phi p$ is a diameter of the pupil plane. In addition, it is preferable that the two areas having a high light intensity distribution are formed symmetrically about the optical axis of the illumination optical system, and that a value $\sigma o$ defined by a ratio $\phi o/$ p and $\sigma i$ defined by a ratio $\phi i/\phi p$ satisfy a condition $0.5 \leq \sigma i/\sigma o$ where $\phi o$ is a diameter of a circle about the optical axis that circumscribes the two areas having a high light intensity distribution, $\phi p$ is a diameter of the pupil plane, and $\phi i$ is a diameter of a circle about the optical axis that inscribes the two areas having a high light intensity distribution.

In a seventh embodiment, an exposure method for exposing a pattern on a mask positioned at a first plane onto a photosensitive substrate positioned at a second plane includes a first step that provides linearly polarized light, a second step that illuminates the mask with the light provided in the first step, a third step that exposes the pattern on the mask illuminated in the second step onto the photosensitive substrate, and a fourth step that switches a polarized state of the light on the second plane between a predetermined polarized state and a nonpolarized state while controlling a loss of a light amount.

According to the seventh embodiment, the fourth step includes a step that varies a polarization plane for linearly polarized light. In addition, it is preferable that the third step includes a step that forms an image of the pattern on the mask onto the second plane using a projection optical system, and that the exposure method also includes a fifth step that forms a predetermined light intensity distribution at a position conjugate to a pupil of the projection optical system or a position adjacent thereto, a sixth step that changes at least one of a shape or a size of the predetermined light intensity distribution, and a seventh step that changes a polarized state of the light that illuminates the illuminated surface in accordance with the change in at least one of the shape and the size of the predetermined light intensity distribution.

In an eighth embodiment, an exposure method for exposing a pattern on a mask positioned at a first plane onto a photosensitive substrate positioned at a second plane includes a first step that provides light, a second step that illuminates the mask with light provided in the first step, a third step that exposes the pattern on the mask illuminated in the second step onto the photosensitive substrate, and a fourth step that corrects fluctuations of a polarized state of the light on the second plane.

According to the eighth embodiment, the exposure method also includes a fifth step that detects the polarized state of the light, and the fourth step includes a step that adjust the polarized state on the second plane based on the polarized state of the light detected in the fifth step.

In a ninth embodiment, an illumination optical system that illuminates an illuminated surface under a predetermined polarized state with light from a light source includes a polarized state changing device that is positioned in a light path between the light source and the illuminated surface and changes the polarized state of the light that illuminates the illuminated surface, and a vertical/horizontal ratio changing device that changes a vertical/horizontal ratio of a light intensity distribution formed on an illumination pupil that is substantially in a Fourier transform plane relationship with the illuminated pupil.

According to the ninth embodiment, the polarized state changing device includes a polarized state switching device that changes the polarized state of the light that illuminates the illuminated surface between the predetermined polarized state and a nonpolarized state. In addition, according to the ninth embodiment, the vertical/horizontal ratio changing device includes an optical element that is positioned at or adjacent to a position that is substantially in the Fourier transform plane relationship with the illumination pupil and has a function to change a power ratio in two orthogonal directions.

In a tenth embodiment, an exposure apparatus is provided that includes the illumination optical system of the ninth embodiment and exposes a pattern on a mask onto a photosensitive substrate positioned on the illuminated surface.

According to the tenth embodiment, the polarized state changing device changes the polarized state of the light in accordance with the pattern characteristics of the mask, and the vertical/horizontal ratio changing device changes the vertical/horizontal ratio of the light intensity distribution formed on the illumination pupil in accordance with the pattern characteristics of the mask.

In an eleventh embodiment, an exposure method for exposing a pattern on a mask positioned at a first plane onto a photosensitive substrate positioned at a second plane includes a first step that provides light having a predetermined polarization, a second step that illuminates the mask with the light provided in the first step, a third step that exposes the pattern on the mask illuminated in the second step onto the photosensitive substrate, a fourth step that changes a polarized state of the light on the second plane, and a fifth step that changes a vertical/horizontal ratio of a light intensity distribution formed on an illumination pupil that is substantially in a Fourier transform plane relationship with the second plane.

According to the eleventh embodiment, the fourth step changes the polarized state of the light in accordance with the pattern characteristics of the mask. In addition, according to the eleventh embodiment, the fifth step changes the vertical/horizontal ratio of the light intensity distribution formed on the pupil plane in accordance with the pattern characteristics of the mask.

In a twelfth embodiment, an illumination optical system that illuminates an illuminated surface with light from a light source includes a polarized state illumination setting device that sets a polarized state of the light that illuminates the illuminated surface to a predetermined polarized state, and an optical integrator positioned in a light path between the light source and the illuminated surface. The optical integrator includes a first one-dimensional cylindrical lens array arranged with a pitch along a predetermined first direction and a second one-dimensional cylindrical lens array arranged with a pitch along a second direction that crosses the first direction.

According to the twelfth embodiment, the first and second one-dimensional cylindrical lens arrays are integrally provided with a single light transmissive substrate. In addition, according to the twelfth embodiment, the illumination optical system also includes a plurality of cylindrical lens array plates having the first and second one-dimensional cylindrical lens arrays, and the plurality of cylindrical lens array plates are positioned with a space from each other along a direction of an optical axis of the illumination optical system. Furthermore, at least one of the pitch along the first direction of the first one-dimensional cylindrical lens array and the pitch along the second direction of the second one-dimensional cylindrical lens array is equal to or less than 2 mm.

In a thirteenth embodiment, an exposure apparatus includes the illumination optical system of the twelfth preferred embodiment and exposes a pattern on a mask onto a photosensitive substrate positioned on the illuminated surface.

In a fourteenth embodiment, an exposure method includes an illumination step that illuminates a mask using the illumination optical system of the twelfth embodiment, and an exposure step that exposes a pattern on the mask onto a photosensitive substrate positioned on the illuminated surface.

Exemplary embodiments of this invention are explained with reference to the attached drawings.

FIG. 1 is a diagram schematically showing a structure of an exposure apparatus equipped with an illumination optical system according to an exemplary embodiment of this invention. In FIG. 1, the Z axis is set in a normal direction of a wafer W, which is a photosensitive substrate. The Y axis is set in a direction on the wafer surface parallel with the plane of FIG. 1. The X axis is set in a direction in the wafer surface perpendicular to the plane of the FIG. 1. In addition, in FIG. 1, the illumination optical system is configured to perform annular illumination.

The exposure apparatus of this embodiment is equipped with a laser light source 1 for providing exposure light (illumination light). A KrF excimer laser light source, which provides light with a wavelength of 248 nm, or an ArF excimer laser light source, which provides light with a wavelength of 193 nm, for example, may be used as the laser light source 1. A light beam with substantially parallel light rays illuminated from the laser light source 1 along the Z direction has a rectangular cross section that is elongated in the X direction and enters into a beam expander 2 formed of a pair of lenses 2a and 2b. The lenses 2a and 2b have negative refractive power and positive refractive power, respectively, in the plane of FIG. 1 (in the YZ plane). Therefore, the light beam that enters into the beam expander 2 is expanded in the plane of FIG. 1 and shaped into a light beam that has a predetermined rectangular cross section.

The light beam with substantially parallel light rays transmitted through the beam expander 2, which functions as a shaping optical system, enters to an afocal zoom lens 5 through a phase member 10, a depolarizer (depolarization element) 20, and a diffractive optical element 4, after being deflected in the Y direction by a folding mirror 3. Structures and functions of the phase member 10 and the depolarizer 20 will be described later. In general, the diffractive optical element is formed by forming steps on a substrate such that the steps have a pitch of approximately the wavelength of the exposure light (illumination light), and have a function to diffract the incident light beam in a predetermined angle. In detail, the diffractive optical element 4 has a function to form a circular light intensity distribution in a far field (or Fraunhofer diffraction region) when a light beam with parallel light rays having a circular cross section enters the diffractive optical element 4.

Therefore, the light beam transmitted through the diffractive optical element 4 forms a circular light intensity distribution, that is, a light beam having a circular cross section, at a pupil position of the afocal zoom lens 5. The diffractive optical element 4 is structured to be removable from the path of the illumination light. The afocal zoom lens 5 is structured such that a magnification can be changed continuously in a predetermined range while maintaining an afocal system (afocal optical system). The light beam transmitted through the afocal zoom lens 5 enters a diffractive optical element 6 for annular illumination. The afocal zoom lens 5 connects, with substantially optical conjugation the origin of divergence by the diffractive optical element 4 and a diffractive surface of the diffractive optical element 6. The numerical aperture of the light beam converged to a point on the diffractive surface or a plane adjacent thereto of the diffractive optical element 6 varies depending on the magnification of the afocal zoom lens 5.

The diffractive optical element 6 for annular illumination functions to form a ring-shaped light intensity distribution in a far field thereof when a light beam having parallel rays is incident thereto. The diffractive optical element 6 is structured so as to be insertable into the path of the illumination light, and replaceable with a diffractive optical element 60 for quadrupole illumination, a diffractive optical element 61 for circular illumination, a diffractive optical element 62 for dipole illumination along the X axis, or a diffractive optical element 63 for dipole illumination along the Y axis. Structures and functions of the diffractive optical element 60 for quadrupole illumination, the diffractive optical element 61 for circular illumination, the diffractive optical element 62 for dipole illumination along the X axis, or the diffractive optical element 63 for dipole illumination along the Y axis will be described later.

The light beam transmitted through the diffractive optical element 6 enters into a zoom lens 7. Near the rear focal plane of the zoom lens 7, an incident surface of a micro lens array (or a fly's-eye lens) 8 is positioned. The micro lens array 8 is an optical element formed of many micro lenses having a positive refractive power arranged densely in a matrix form. In general, a micro lens array is structured by forming a micro lens group by, for example, etching a plane parallel plate.

Each of the micro lenses forming the micro lens array is smaller than each of the lens elements structuring a fly's-eye lens. Moreover, in the micro lens array, many micro lenses (micro refractive surfaces) are integrally formed without being mutually isolated from each other, which is different from the fly's-eye lens, in which lens elements are mutually isolated from each other. However, the micro lens array is a wavefront splitting type optical integrator, which is the same as the fly's-eye lens, in that lens elements having positive refractive power are arranged in a matrix form.

As described above, the light beam from the circular light intensity distribution formed at the pupil position of the afocal zoom lens 5 through the diffractive optical element 4 enters the diffractive optical element 6 as a light beam having various angular components, after exiting from the afocal zoom lens 5. That is, the diffractive optical element 4 forms an optical integrator that functions to form an angular light beam (a non-parallel light beam having an angular distribution). On the other hand, the diffractive optical element 6 has a function as a light beam conversion element that forms a ring-shaped light intensity distribution at a far field thereof, when the light beam with parallel light rays enters the diffractive optical element 6. Therefore, the light beam transmitted through the diffractive optical element 6 forms an annular illumination field about an optical axis AX, for example, in the rear-side focal plane of zoom lens 7 (therefore, an incident surface of the micro lens array 8).

Figure 2A:
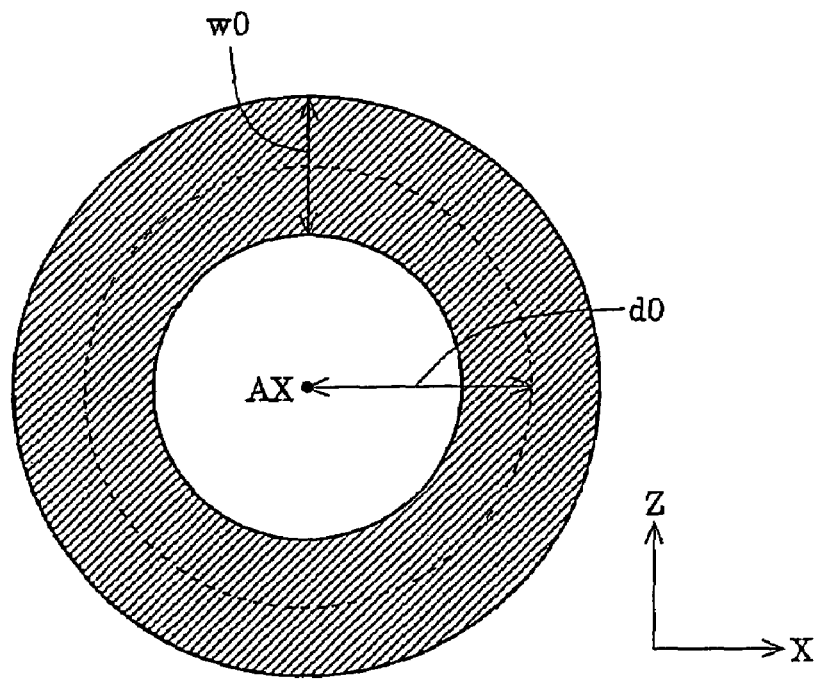
FIG. 2A is a diagram showing an annular secondary light source formed for annular illumination.

An outer diameter of the annular illumination field formed on the incident surface of the micro lens array 8 varies depending on a focal length of the zoom lens 7. As such, the zoom lens 7 brings the diffractive optical element 6 and the incident surface of the micro lens array 8 into a substantial Fourier transform relationship. The light beam that entered the micro lens array 8 is divided two-dimensionally. Many light sources (hereinafter referred to as "secondary light source") in an annular shape, which is the same as the illumination field formed by the incident light beam, are formed on the rear focal plane of the micro lens array 8 as shown in FIG. 2A.

The light beam from the annular secondary light sources formed in the rear focal plane of the micro lens array 8 superimposingly illuminates a mask M, on which a predetermined pattern is formed, after being converged by a condenser optical system 9. The light beam transmitted through the pattern on the mask M forms an image of the pattern of the mask onto a wafer, which is a photosensitive substrate, through a projection optical system PL. Accordingly, by performing batch or scan exposure while two-dimensionally driving and controlling the wafer W in a plane perpendicular to the optical axis AX of the projection optical system PL (XY plane), the pattern on the mask M is successively exposed in each exposure region of the wafer W.

In this embodiment, even if the magnification of the afocal zoom lens 5 is changed, the center height (a distance to a center line of the circular shape from the optical axis AX) d0 of the annular secondary light source does not change, but only the width (½ of a difference between the outer radius (diameter) and the inner radius (diameter)) w0 of the annular secondary light source changes. That is, by changing the magnification of the afocal zoom lens 5, both the size (outer diameter) and the shape (annular ratio: inner diameter/outer diameter) of the annular secondary light source may be changed.

Furthermore, if the focal length of the zoom lens 7 is changed, the center height d0 and the width w0 of the annular secondary light source are both changed without the annular ratio being changed. That is, by changing the focal length of the zoom lens 7, the outer diameter of the annular secondary light source may be changed without the annular ratio thereof being changed. Accordingly, in this embodiment, by appropriately changing the magnification of the afocal zoom lens 5 and the focal length of the zoom lens 7, only the annular ratio of the annular secondary light source may be changed without changing the outer diameter thereof.

Figure 2B:
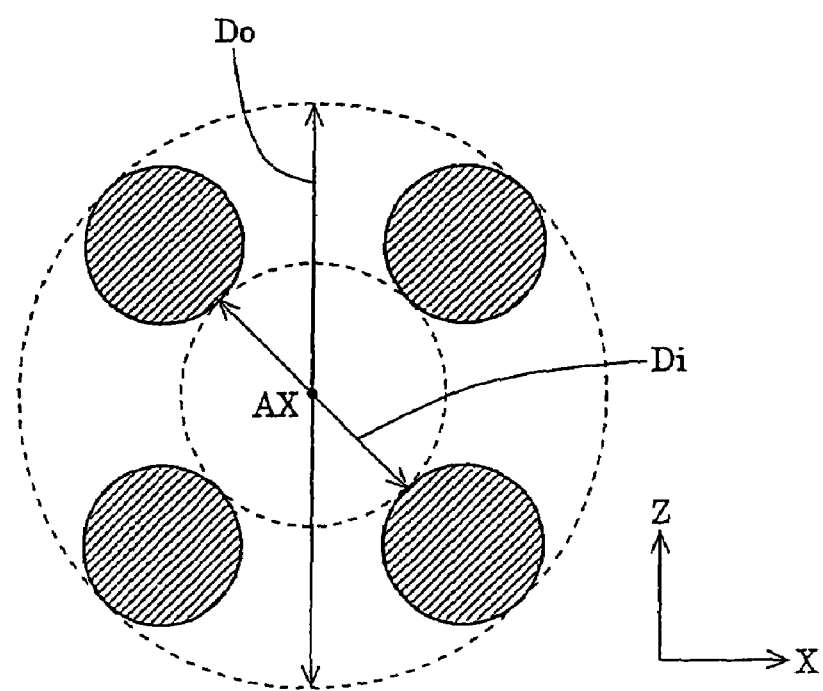
FIG. 2B is a quadrupole secondary light source formed for quadrupole illumination.

Moreover, quadrupole illumination can be achieved by setting the diffractive optical element 60, instead of the diffractive optical element 6, in the illumination light path. The diffractive optical element 60 for quadrupole illumination has a function to form a quadruple light intensity distribution in the far field thereof, when the light beam with parallel light rays enters it. Therefore, the light beam transmitted through the diffractive optical element 60 forms on the incident surface of the micro lens array 8 a quadrupole illumination field comprised of four disc-shaped illumination fields around the optical axis, for example. As a result, as shown in FIG. 2B, a quadrupole secondary light source, which is the same as the illumination field formed on the incident surface of the micro lens array 8, also is formed in the rear focal plane of the micro lens array 8.

Similar to the case of annular illumination, in quadrupole illumination, by changing the magnification of the afocal zoom lens 5, both the outer diameter (diameter of a circle circumscribing the four disc-shaped planar light sources) Do and the annular ratio (a diameter Di of a circle inscribing the four disc-shaped planar light sources/a diameter Do of the circle circumscribing the four disc-shaped planar light sources) of the quadrupole secondary light sources can be changed. In addition, by changing the focal length of the zoom lens 7, the outer diameter of the quadrupole light source can be changed without changing the annular ratio thereof. As a result, by appropriately changing the magnification of the afocal zoom lens 5 and the focal length of the zoom lens 7, only the annular ratio of the quadrupole secondary light source may be changed without changing the outer diameter thereof.

Moreover, by removing the diffractive optical element 4 from the illumination light path and setting the diffractive optical element 61 for circular illumination, instead of the diffractive optical element 6 or 60, in the illumination light path, normal circular illumination may be achieved. In this case, the light beam having a rectangular cross section enters the afocal zoom lens 5 along the optical axis AX. The light beam that enters the afocal zoom lens 5 is expanded or reduced in accordance with the magnification thereof. The light beam then exits from the afocal zoom lens 5 along the optical axis AX while maintaining the rectangular cross section, and enters the diffractive optical element 61.

The diffractive optical element 61 for circular illumination has, similar to the diffractive optical element 4, a function to form a circular light intensity distribution in the far field thereof, when the light beam with parallel light rays having the rectangular cross section enters it. Therefore, the circular light beam formed by the diffractive optical element 61 forms a circular illumination field about the optical axis AX in the incident surface of the micro lens array 8. As a result, a circular secondary light source centered about the optical axis AX also is formed in the rear focal plane of the micro lens array 8. In this case, by changing the magnification of the afocal zoom lens 5 and the focal length of the zoom lens 7, the outer diameter of the circular secondary light source can be appropriately changed.

Figure 3A:
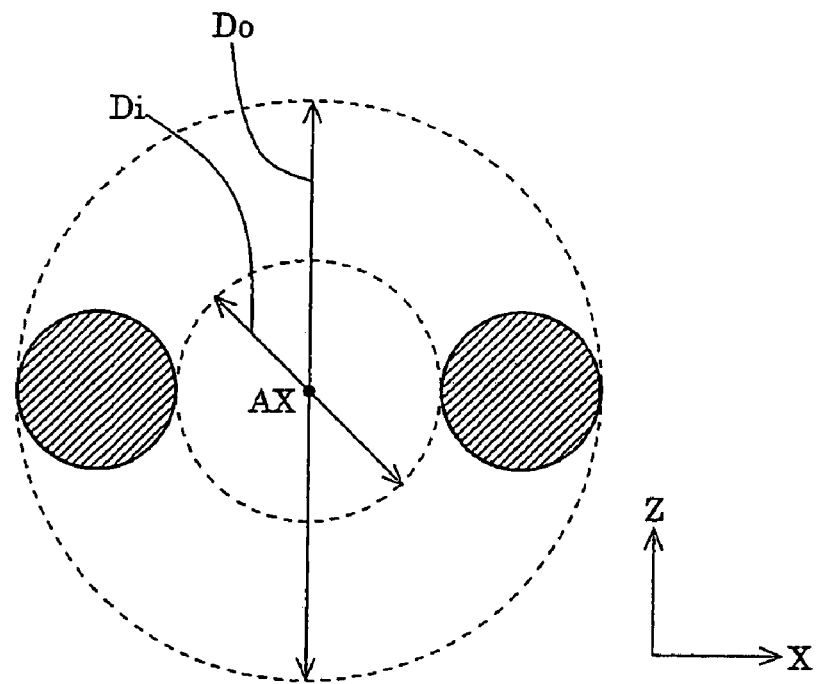
FIGS. 3A and 3B are diagrams showing a dipole secondary light source formed for dipole illumination.

Moreover, dipole illumination in the X direction may be achieved by setting the diffractive optical element 62 in the illumination light path, instead of the diffractive optical elements 6, 60 or 61. The diffractive optical element 62 for dipole illumination in the X direction functions to form a dipole light intensity distribution with illumination fields spaced apart along the X direction in the far field thereof when the light beam with parallel light rays enters it. Therefore, the light beam transmitted through the diffractive optical element 62 forms on the incident surface of the micro lens array 8 a dipole illumination field formed of two circular illumination fields about the optical axis AX, which are spaced apart along the X direction, for example. As such, as shown in FIG. 3A, the dipole secondary light source formed along the X direction, which is the same as the illumination fields formed on the incident surface of the micro lens array 8, also is formed on the rear-side focal plane of the micro lens array 8.

Figure 3B:
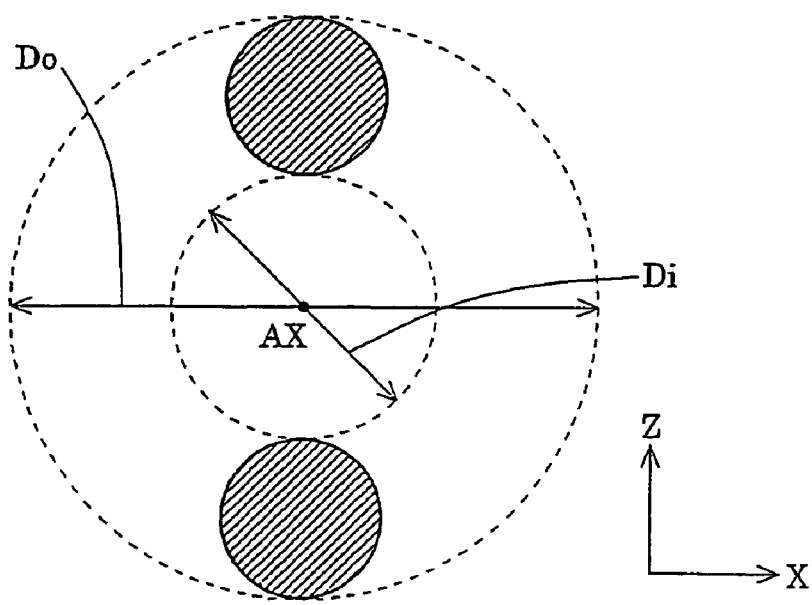

Furthermore, dipole illumination in the Y direction may be achieved by setting the diffractive optical element 63 in the illumination light path, instead of the diffractive optical element 6, 60, 61 or 62. The diffractive optical element 63 for the dipole illumination in the Y direction functions to form a dipole light intensity distribution with illuminated fields spaced apart in the Z direction (corresponding to the Y direction on the mask and the wafer), in the far field thereof when the light beam with parallel light rays enters it. Therefore, the light beam transmitted through the diffractive optical element 63 forms on the incident surface of the micro lens array 8 a dipole illumination field formed of the two circular illumination fields spaced apart along the Z direction, about the optical axis AX, for example. As such, as shown in FIG. 3B, the dipole secondary light source formed along the Z direction, which is the same as the illumination fields formed on the incident surface of the micro lens array 8, also is formed on the rear-side focal plane of the micro lens array 8.

Similar to the case of the quadrupole illumination, in the dipole illumination, by changing the magnification of the afocal zoom lens 5, both the outer diameter (diameter of a circle circumscribing the two disc-shaped planar light sources) Do and the annular ratio (a diameter Di of a circle inscribing the two disc-shaped planar light sources/a diameter Do of the circle circumscribing the two disc-shaped planar light sources) of the dipole secondary light sources may be changed. In addition, by changing the focal length of the zoom lens 7, the outer diameter of the dipole light source may be changed without the annular ratio thereof being changed. As a result, by appropriately changing the magnification of the afocal zoom lens 5 and the focal length of the zoom lens 7, only the annular ratio of the dipole secondary light source may be changed without changing the outer diameter thereof.

Figure 4:
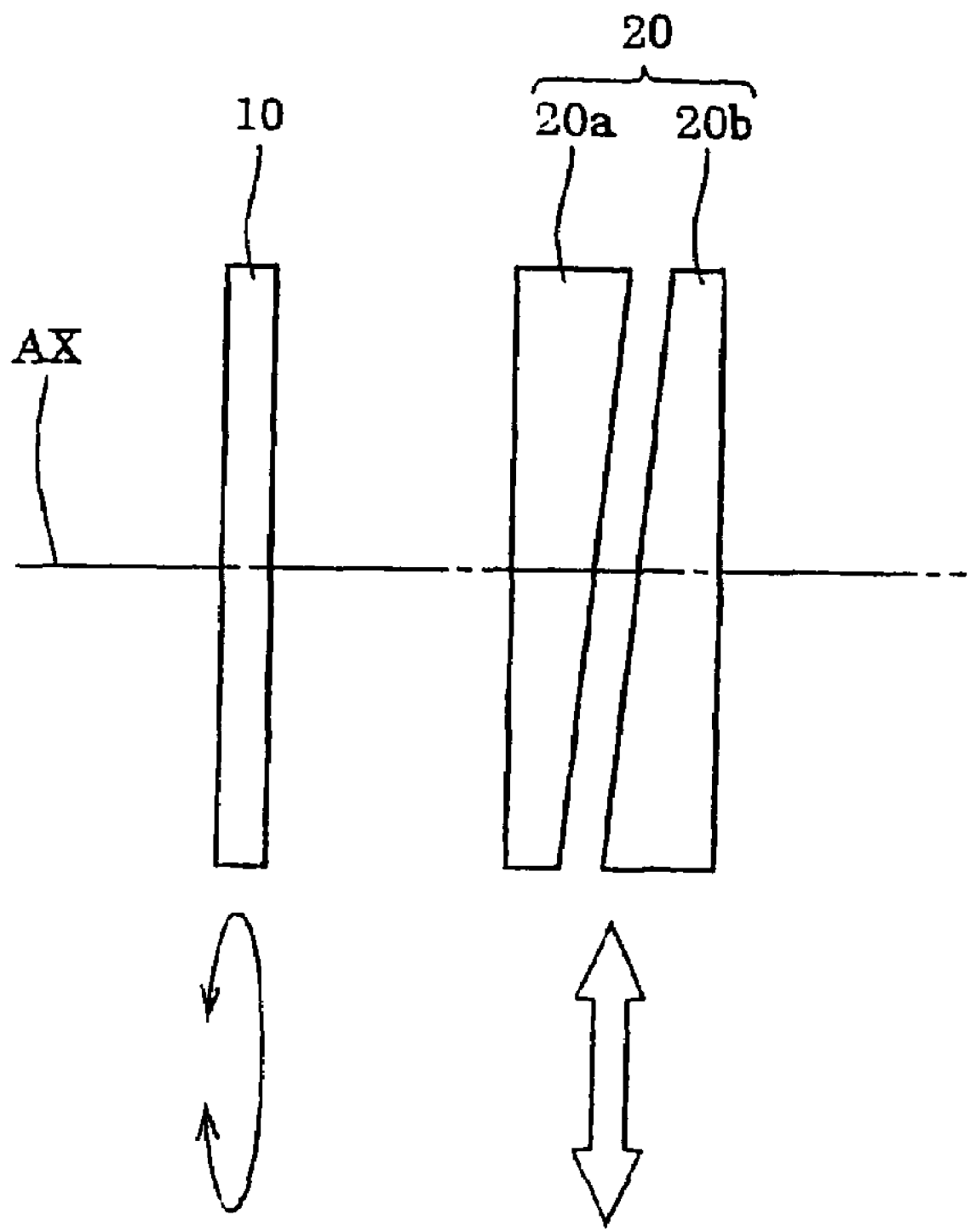
FIG. 4 is a diagram schematically showing a structure of the first phase member and a depolarizer.

FIG. 4 is a diagram schematically showing a structure of the phase member and the depolarizer shown in FIG. 1. Referring to FIG. 1, the phase member 10 is formed from a half-wave plate, structured so that its crystal optic axis is rotatable about the optical axis AX. The depolarizer is formed from a wedge crystal prism 20a and a wedge silica prism 20b, which has a complimentary shape to the crystal prism 20a. As an integral prism assembly, the crystal prism 20a and the silica prism 20b are structured to be removal from the illumination light path. When using a KrF excimer laser light source or an ArF excimer laser light source as the laser light source 1, substantially linearly polarized light enters into the half-wave plate 10 because the light ejected from these light sources typically has a degree of polarization of 95% or more.

If the crystal optic axis of the half-wave plate 10 is configured to form an angle of 0 or 90 degrees with respect to a polarization plane of the incident linearly polarized light, the linearly polarized light that enters the half-wave plate is transmitted through the half-wave plate 10 as is, without changing its polarization plane. If the crystal optic axis of the half-wave plate 10 is configured to form an angle of 45 degrees with respect to a polarization plane of the incident linearly polarized light, the linearly polarized light that enters the half-wave plate 10 is converted to linearly polarized light in which the polarization plane is changed by 90 degrees. Furthermore, if the crystal optic axis of the crystal prism 20a is configured to form an angle of 45 degrees with respect to a polarization plane of the incident linearly polarized light, the linearly polarized light that enters the crystal prism 20a is converted into light having a nonpolarized state (nonpolarized light).

In this embodiment, the crystal optic axis of the crystal prism 20a is configured to form an angle of 45 degrees with respect to a polarization plane of the incident linearly polarized light when the depolarizer 20 is positioned in the illumination light path. If the crystal optic axis of the crystal prism 20a is configured to form an angle of 0 or 90 degrees with respect to a polarization plane of the incident linearly polarized light, the linearly polarized light that enters the crystal prism 20a is transmitted through the crystal prism 20a as is, without changing its polarization plane. Moreover, if the crystal optic axis of the half-wave plate 10 is configured to form an angle of 22.5 degrees with respect to a polarization plane of the incident linearly polarized light, the linearly polarized light that enters the half-wave plate 10 is converted to light having a nonpolarized state that includes a linearly polarized component, by which the light is transmitted through the half-wave plate 10 without changing its polarization plane, and a linearly polarized component by which the polarization plane is change by 90 degrees.

As described above, in this embodiment, the linearly polarized light from the laser light source 1 enters the half-wave plate 10. To simplify explanations described below, it is assumed that P-polarized light (linearly polarized light having a polarization plane in the Z direction at the position of the half-wave plate in FIG. 1; hereinafter referred to as "polarized in Z direction") enters the half-wave plate 10. When the depolarizer 20 is positioned in the illumination light path, if the crystal optic axis of the half-wave plate 10 is configured to form an angle of 0 or 90 degrees with respect to a polarization plane of the incident P-polarized light (polarized in the Z direction), the P-polarized light that enters the half-wave plate 10 is transmitted through the half-wave plate 10 as is and enters the crystal prism 20a without changing its polarization plane. Because the crystal optic axis of the crystal prism 20a is configured to form, an angle of 45 degrees with respect to a polarization plane of the incident P-polarized light (polarized in the Z direction), the P-polarized light (light polarized in the Z direction) that enters the crystal prism 20a is converted into light having a nonpolarized state (a depolarized state).

The nonpolarized light transmitted through the crystal prism 20a illuminates the mask M (and therefore the wafer W) in the nonpolarized state through the silica prism 20b, which functions as a compensator to compensate in the traveling direction of the light. On the other hand, if the crystal optic axis of the half-wave plate 10 is configured to form an angle of 45 degrees with respect to a polarization plane of the incident P-polarized light, the polarization plane for the P-polarized light (polarized in the Z direction) that enters the half-wave plate 10 is changed by 90 degrees and enters the crystal prism 20a as S-polarized light (linearly polarized light having a polarization plane in the X direction at the position of the half-wave plate in FIG. 1; hereinafter referred to as "polarized in the X direction"). Because the crystal optic axis of the crystal prism 20a is also configured to form an angle of 45 degrees with respect to a polarization plane of the incident S-polarized light (polarized in the X direction), the S-polarized (polarized in the X direction) light that enters the crystal prism 20a is converted into nonpolarized light and illuminates the mask M in the nonpolarized state through the silica prism 20b.

On the other hand, when the depolarizer 20 is removed from the illumination light path, if the crystal optic axis of the half-wave plate is configured to form an angle of 0 or 90 degrees with respect to a polarization plane of the incident P-polarized light (polarized in the Z direction), the P-polarized (polarized in the Z direction) light that enters the half-wave plate 10 is transmitted through the half-wave plate 10 as is as P-polarized light (polarized in the Z direction) without its polarization plane being changed. Therefore, the mask M is illuminated by the P-polarized light (polarized in the Z direction). If the crystal optic axis of the half-wave plate 10 is configured to form an angle of 45 degrees with respect to a polarization plane of the incident P-polarized light (polarized in the Z direction), the P-polarized light that enters the half-wave plate 10 becomes S-polarized light as its polarization plane is changed by 90 degrees, and the mask M is illuminated with the S-polarized light (polarized in the X direction).

As described above, according to this invention, the mask M can be illuminated in a nonpolarized state by positioning the depolarizer 20 in the illumination light path. The mask M may be illuminated in a P-polarized state (polarized in the Y direction) by removing the depolarizer 20 from the illumination light path and setting the crystal optic axis of the half-wave plate 10 to form an angle of 0 or 90 degrees with respect to a polarization plane of the incident P-polarized light (polarized in the Z direction). The mask M may be illuminated in the S-polarized state (polarized in the X direction) by removing the depolarizer 20 from the illumination light path and setting the crystal optic axis of the half-wave plate 10 to form an angle of 45 degrees with respect to a polarization plane of the incident P-polarized light (polarized in the Z direction).

In other words, in this embodiment, with the operations of the polarized state switching device that is composed of the half-wave plate 10 and the depolarizer 20, the polarized state for the light that illuminates the mask (and therefore the wafer W), which has a surface to be illuminated, may be switched between the linearly polarized state and the nonpolarized state. In addition, the polarized state may be switched between the P-polarized state and the S-polarized state (between the polarized states that are perpendicular to each other) (polarization planes for the linearly polarized light may be varied) when illuminating the mask M with the linearly polarized light. As a result, in this embodiment, appropriate illumination conditions can be achieved by changing the polarized state for the illumination light while controlling the loss of light amount in accordance with the characteristics of the patterns on the mask M. Therefore, the wafer W can be exposed well under an appropriate illumination condition achieved in accordance with the characteristics of the pattern on the mask M. In particular, when illuminating the mask M with the linearly polarized light, the linearly polarized light from the light source 1 may be directed to the illuminated surface using the polarized state switching device without substantially losing the light amount.

In detail, by setting to the dipole illumination in the X direction, for example, and by illuminating the mask with the light in the linearly polarized state having the polarization plane along the X direction on the mask M, a pattern having extremely narrow line widths in the X direction may be accurately exposed onto a critical layer on the wafer W. Subsequently, by switching to the dipole illumination in the X direction, for example, and by illuminating the mask M with the linearly polarized light that has the polarization plane along the Y direction on the mask M, a pattern having extremely narrow line widths in the Y direction may be accurately exposed onto the critical layer on the wafer W.

Furthermore, after completing the double exposure on the critical layer, a two-dimensional pattern that has relatively wide line widths may be exposed on the non-critical layer (middle layer or rough layer) on the wafer W at a high throughput by, for example, maintaining the dipole illumination, or by switching to the quadrupole, annular, or circular illumination and illuminating the mask with light in the nonpolarized state. However, these are only examples. In general, the wafer W may be exposed well under appropriate illumination conditions by setting the secondary light source at an appropriate shape and size and setting the light that illuminates the mask M in an appropriate polarized state in accordance with the characteristics of the pattern on the mask M.

For practical purposes, scattering of light on a resist layer formed on the wafer W differs when the P-polarized light beam is diagonally incident on the wafer W and when the S-polarized light beam is diagonally incident on the wafer W. In detail, the S-polarized light has higher reflectivity than the P-polarized light so that the P-polarized light beam reaches deeper inside the resist layer than the S-polarized light beam. By using such a difference in the optical characteristics of the P-polarized light and the S-polarized light with respect to the resist layer, and by achieving appropriate illumination conditions by changing the polarized state for the illumination light in accordance with the characteristics of the pattern on the mask M, the wafer W may be exposed well under appropriate illumination conditions.

In the above-described embodiment, the half-wave plate 10, which is a phase member for changing the polarization plane of the incident linearly polarized light as needed, is positioned on the light source side, and the depolarizer 20, which unpolarizes the incident linearly polarized light as need, is positioned on the mask side. However, they are not limited to this arrangement, and the same optical functions and effects may be obtained even if the depolarizer 20 is positioned on the light source side, and the half-wave plate 10 is positioned on the mask side.

Moreover, in the above-described embodiment, the silica prism 20b is used as a compensator to compensate the traveling direction of the light transmitted through the crystal prism 20a. However, the invention is not limited to this, and a wedge-shaped prism may be formed by an optical material, such as quartz or fluorite, which has high durability with respect to the KrF excimer laser beam or the ArF excimer laser beam. This applies similarly in other related exemplary modifications.

Figure 5:
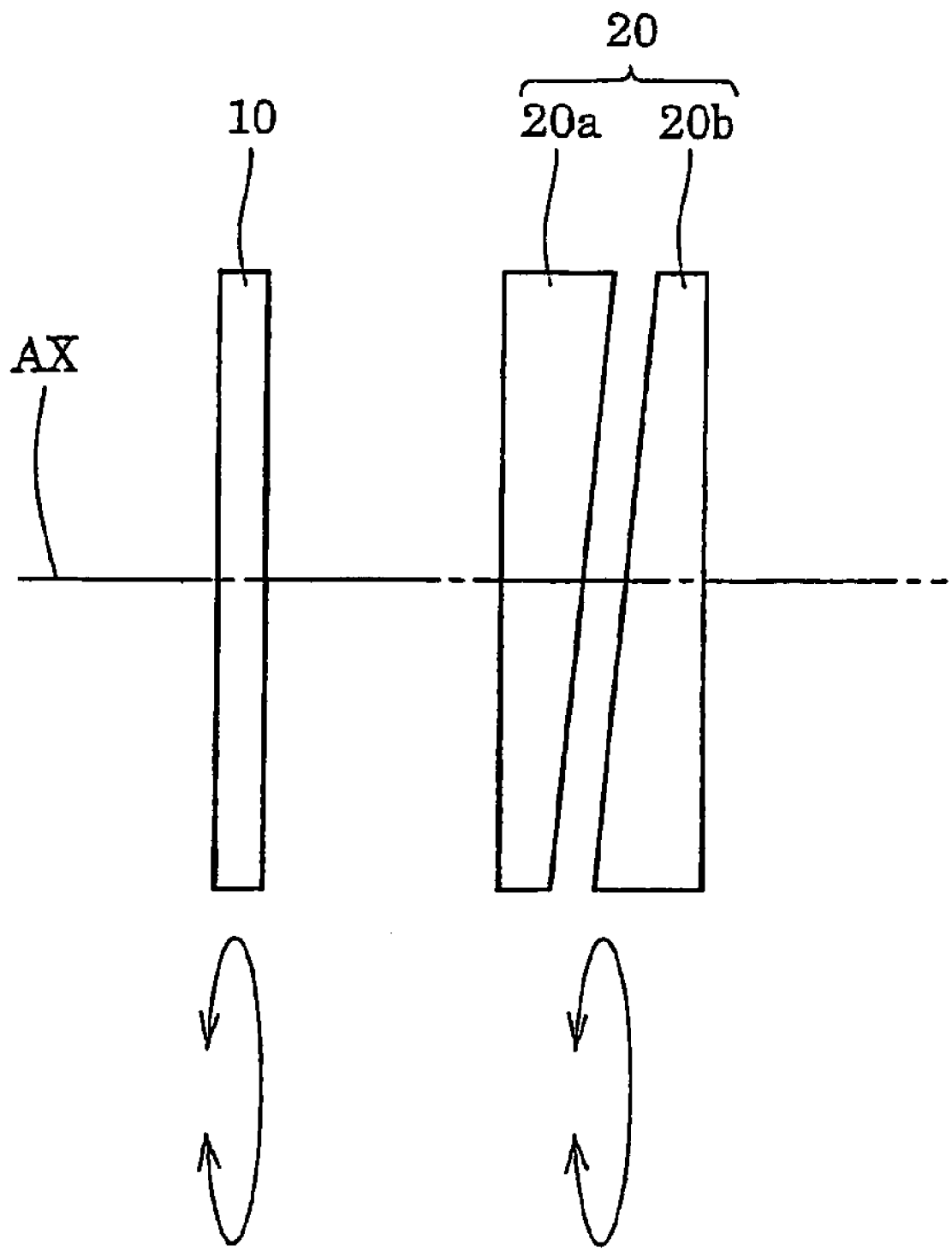
FIG. 5 is a diagram schematically showing a structure of a polarized state switching device according to a first exemplary modification.

FIG. 5 is a diagram schematically showing a structure of a polarized state switching device according to a first exemplary modification. The polarized state switching device according to the first modification shown in FIG. 5 has a structure similar to that of the polarized state switching device according to the embodiment shown in FIG. 4. However, in contrast with the embodiment in FIG. 4, in which the depolarizer 20 is structured to be removable from the illumination light path, the first exemplary modification in FIG. 5 is basically different in that the crystal prism 20a and the silica prism 20b, which together form the depolarizer 20, are structured to be integrally rotatable about the optical axis AX, and that the crystal optic axis of the crystal prism 20a is structured to be rotatable about the optical axis AX. The first exemplary modification shown in FIG. 5 is explained below, focusing on the differences from the embodiment shown in FIG. 4.

In the first exemplary modification, if the crystal optic axis of the half-wave plate 10 is set to form an angle of 45 degrees with respect to a polarization plane of the incident P-polarized light (polarized in the Z direction), the P-polarized light (polarized in the Z direction) that enters the half-wave plate 10 is transmitted through the half-wave plate 10 and enters the crystal prism 20a as is in P-polarization (polarized in the Z direction) without changing the polarization plane of the light. At this time, if the crystal optic axis of the crystal prism 20a is set to form an angle of 45 degrees with respect to a polarization plane of the incident P-polarized light (polarized in the Z direction), the P-polarized light (polarized in the Z direction) that enters the crystal prism 20a is converted into light in the nonpolarized state, and the mask M is illuminated by the light in the nonpolarized state that is transmitted through the quartz prism 20a. Moreover, if the crystal optic axis of the crystal prism 20a is set to form an angle of 0 or 90 degrees with respect to a polarization plane of the incident P-polarized light (polarized in the Z direction), the P-polarized light (polarized in the Z direction) that enters the crystal prism 20a is transmitted through the crystal prism 20a as P-polarized light without changing the polarization plane, and the mask M is illuminated by the light in the P-polarized state (polarized in the Y direction) that is transmitted through the quartz prism 20a.

On the other hand, if the crystal optic axis of the half-wave plate 10 is set to form an angle of 45 degrees with respect to a polarization plane of the incident P-polarized light, the polarization plane for the P-polarized light (polarized in the Z direction) that enters the half-wave plate 10 changes by 90 degrees and enters the crystal prism 20a as it becomes the S-polarized light (polarized in the X direction). At this time, if the crystal optic axis of the crystal prism 20a is set to form an angle of 45 degrees with respect to a polarization plane of the incident P-polarized light (polarized in the Z direction), the S-polarized light (polarized in the X direction) that enters the crystal prism 20a is converted into light in the nonpolarized state and illuminates the mask M in the nonpolarized state through the silica prism 20b. If the crystal optic axis of the crystal prism 20a is set to form an angle of 0 or 90 degrees with respect to a polarization plane of the incident S-polarized light (polarized in the X direction), the S-polarized light (polarized in the X direction) that enters the crystal prism 20a is transmitted as is as S-polarized light (polarized in the X direction) without the polarization plane being changed and illuminates the mask as S-polarized light (polarized in the X direction) through the silica prism 20b.

As described above, in the first exemplary modification of FIG. 5, the polarized state for the light that illuminates the mask is changed between the linearly polarized state and the nonpolarized state by combining the rotation of the half-wave plate 10 about the optical axis AX and the rotation of the crystal prism 20a about the optical axis AX. When illuminating the mask M with the linearly polarized light, the polarized state may be changed between the P-polarized state and the S-polarized state. Moreover, the half-wave plate 10 and the depolarizer 20 are also positioned on the light source side and the mask side, respectively, in the first exemplary modification shown in FIG. 5. The same optical effects and functions may be achieved by positioning the depolarizer 20 and the half-wave plate 10 on the light source side and the mask side, respectively.

Figure 6:
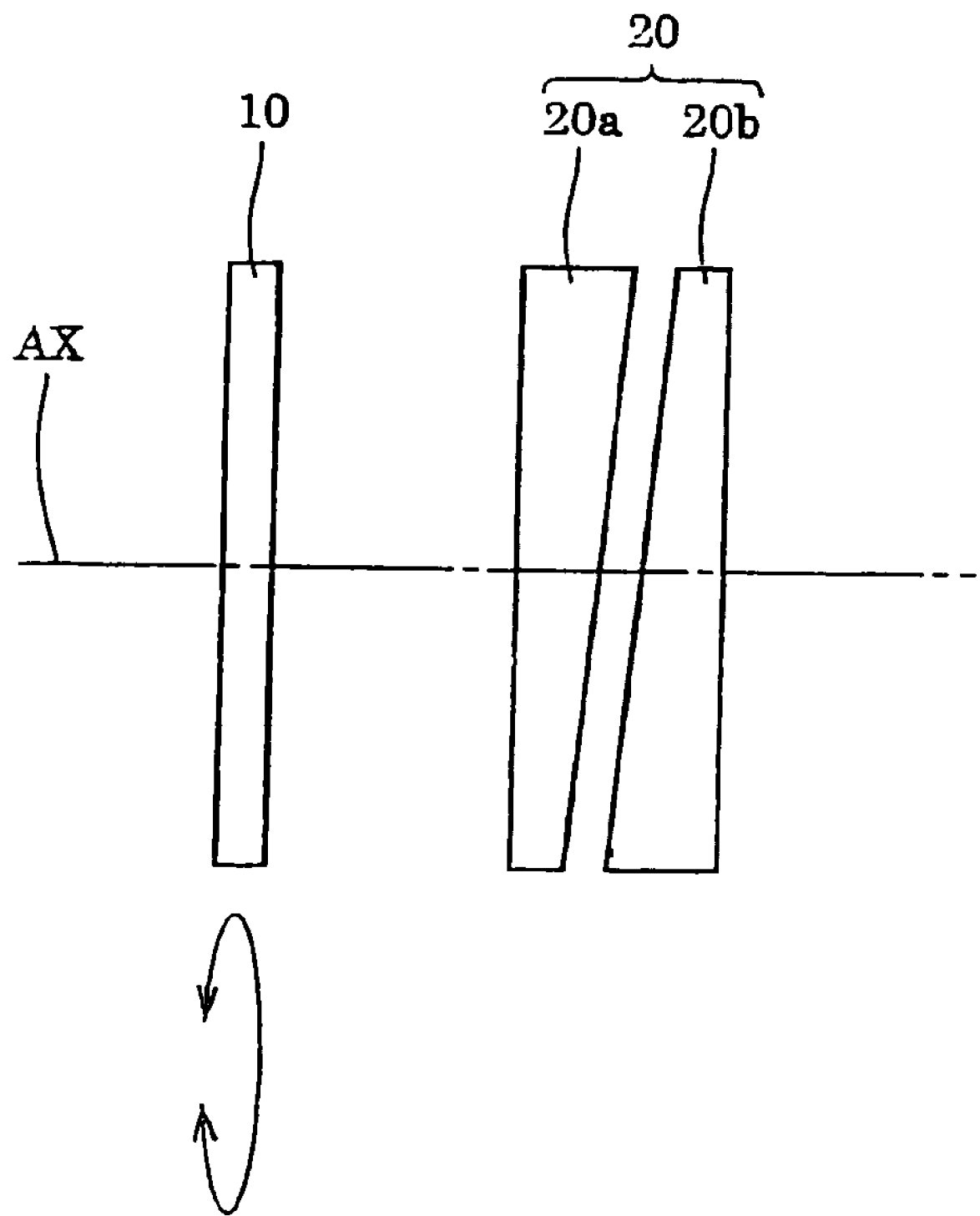
FIG. 6 is a diagram schematically showing a structure of a polarized state switching device according to a second exemplary modification.

FIG. 6 is a diagram schematically showing a polarized state switching device according to a second exemplary modification. The polarized state switching device according to the second modification shown in FIG. 6 has a structure similar to that of the polarized state switching device according to the embodiment shown in FIG. 4. However, in contrast with the embodiment in FIG. 4, in which the depolarizer 20 is structured to be removable from the illumination light path, the second exemplary modification shown in FIG. 6 is basically different in that the depolarizer 20 is fixedly positioned in the illumination light path. The second exemplary modification shown in FIG. 6 is explained below, focusing on the differences from the embodiment shown in FIG. 4.

In the second exemplary modification, the crystal optic axis of the crystal prism 20a is positioned to form an angle of 0 or 90 degrees with respect to a polarization plane of the incident P-polarized light (polarized in the Z direction). Therefore, if the crystal optic axis of the half-wave plate 10 is set to form an angle of 0 or 90 degrees with respect to a polarization plane of the incident P-polarized light (polarized in the Z direction), the P-polarized light (polarized in the Z direction) that enters the half-wave plate 10 is transmitted through the half-wave plate 10 as is as P-polarized light (polarized in the Z direction) and enters the crystal prism 20a, without its polarization plane being changed. Because the crystal optic axis of the crystal prism 20a is fixedly positioned to form an angle of 0 or 90 degrees with respect to a polarization plane of the incident P-polarized light (polarized in the Z direction), the P-polarized light (polarized in the Z direction) that enters the crystal prism 20a is transmitted through the crystal prism 20a as is as P-polarized light (polarized in the Z direction) without changing the angle of the polarization plane, and illuminates the mask M as P polarized light (polarized in the Y direction) through the silica prism 20b.

Moreover, if the crystal optic axis of the half-wave plate 10 is set to form an angle of 0 or 90 degrees with respect to a polarization plane of the incident P-polarized light (polarized in the Z direction), the polarization plane for the P-polarized light (polarized in the Z direction) that enters the half-wave plate 10 is changed by 90 degrees, and the light enters the crystal prism 20a as S-polarized light (polarized in the X direction). Because the crystal optic axis of the crystal prism 20a is positioned to form an angle of 0 or 90 degrees with respect also to a polarization plane of the incident S-polarized light (polarized in the X direction), the S-polarized light (polarized in the X direction) that enters the crystal prism 20a is transmitted through the crystal prism 20a as is as S-polarized light (polarized in the X direction) without changing the angle of the polarization plane and illuminates the mask M as S-polarized light (polarized in the X direction) through the silica prism 20b.

Further, if the crystal optic axis of the half-wave plate 10 is set to form an angle of 22.5 degrees with respect to a polarization plane of the incident P-polarized light (polarized in the Z direction), the polarization plane for the P-polarized light that enters the half-wave plate 10 enters the crystal prism 20a after being converted into light in the nonpolarized state that includes a P-polarized component (polarized in the Z direction), in which the polarization plane for the light transmitted as is without any change, and an S-polarized component (polarized in the X direction), in which the angle of the polarization plane is changed by 90 degrees. Because the crystal optic axis of the crystal prism 20a is positioned to form an angle of 0 or 90 degrees with respect also to the polarization plane of the incident P-polarized component as well as to the polarization plane of the incident S-polarized light (polarized in the X direction), the P-polarized light (polarized in the Z direction) and the S-polarized light (polarized in the X direction) that enters the crystal prism 20a are transmitted through the crystal prism 20a as is without changing the angle of the polarization plane and illuminate the mask M in the nonpolarized state through the silica prism 20b.

As described above, in the second exemplary modification shown in FIG. 6, by appropriately rotating the half-wave plate 10 about the optical axis AX with the depolarizer 20 being fixedly positioned in the illumination light path, the polarized state for the light that illuminates the mask M may be switched between the linearly polarized state and the nonpolarized state, and if illuminating the mask with the linearly polarized light, the polarized state may be changed between the P-polarized state and the S-polarized state. In addition, in the second exemplary modification shown in FIG. 6, the half-wave plate 10 and the depolarizer 20 are also positioned on the light source side and the mask side, respectively. However, the same optical functions and effects may be obtained even if the depolarizer 20 is positioned on the light source side, and the half-wave plate 10 is positioned on the mask side.

Figure 7:
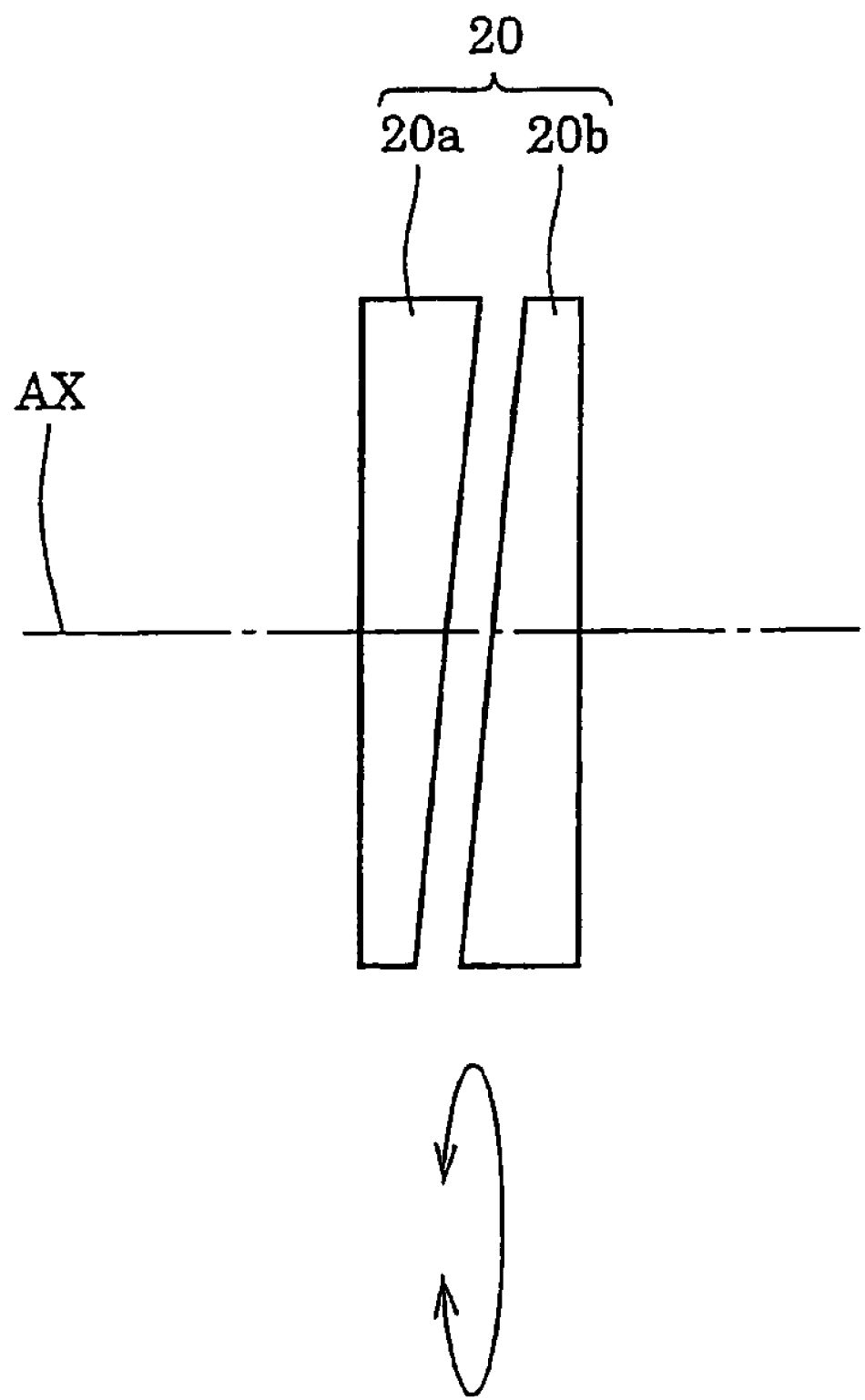
FIG. 7 is a diagram schematically showing a structure of a polarized state switching device according to a third exemplary modification.

FIG. 7 is a diagram schematically showing a structure of a polarized state switching device according to a third exemplary modification. The polarized state switching device according to the third exemplary modification shown in FIG. 7 has a structure similar to the polarized state switching device according to the first exemplary modification shown in FIG. 5. However, in contrast with the first exemplary modification in FIG. 5, in which the polarized state switching device is structured from the half-wave plate 10 and the depolarizer 20, the third exemplary modification shown in FIG. 7 is basically different in that the polarized state switching device is structured from only the depolarizer 20 that is rotatable about the optical axis AX. The third exemplary modification shown in FIG. 7 is explained below, focusing on the differences from the first exemplary modification shown in FIG. 5.

In the third exemplary modification, if the crystal optic axis of the crystal prism 20a is set to form an angle of 45 degrees with respect to a polarization plane of the incident P-polarized light (polarized in the Z direction), the P-polarized light that enters the crystal prism 20a is converted into light in the nonpolarized light and illuminates the mask M in the nonpolarized state through the silica prism 20b. On the other hand, if the crystal optic axis of the crystal prism 20a is set to form an angle of 0 or 90 degrees with respect to a polarization plane of the incident P-polarized light (polarized in the Z direction), the P-polarized light (polarized in the Z direction) that enters the crystal prism 20a is transmitted through the crystal prism 20a as is as P-polarized light (polarized in the Z direction) without changing the polarization plane and illuminates the mask M in the P-polarized state (polarized in the Y direction) through the silica prism 20b.

As described above, in the third exemplary modification shown in FIG. 7, by appropriately rotating the crystal prism 20a about the optical axis AX, the polarized state for the light that illuminates the mask M may be switched between the linearly polarized state and the nonpolarized state. Moreover, in the third exemplary modification shown in FIG. 7, the same optical operational effects may be obtained by structuring the depolarizer 20 to be rotatable about the optical axis AX and removable from the illumination light path and by setting the depolarizer 20 to be removed from the illumination light path to allow illumination of the mask M in the P-polarized state.

Figure 8:
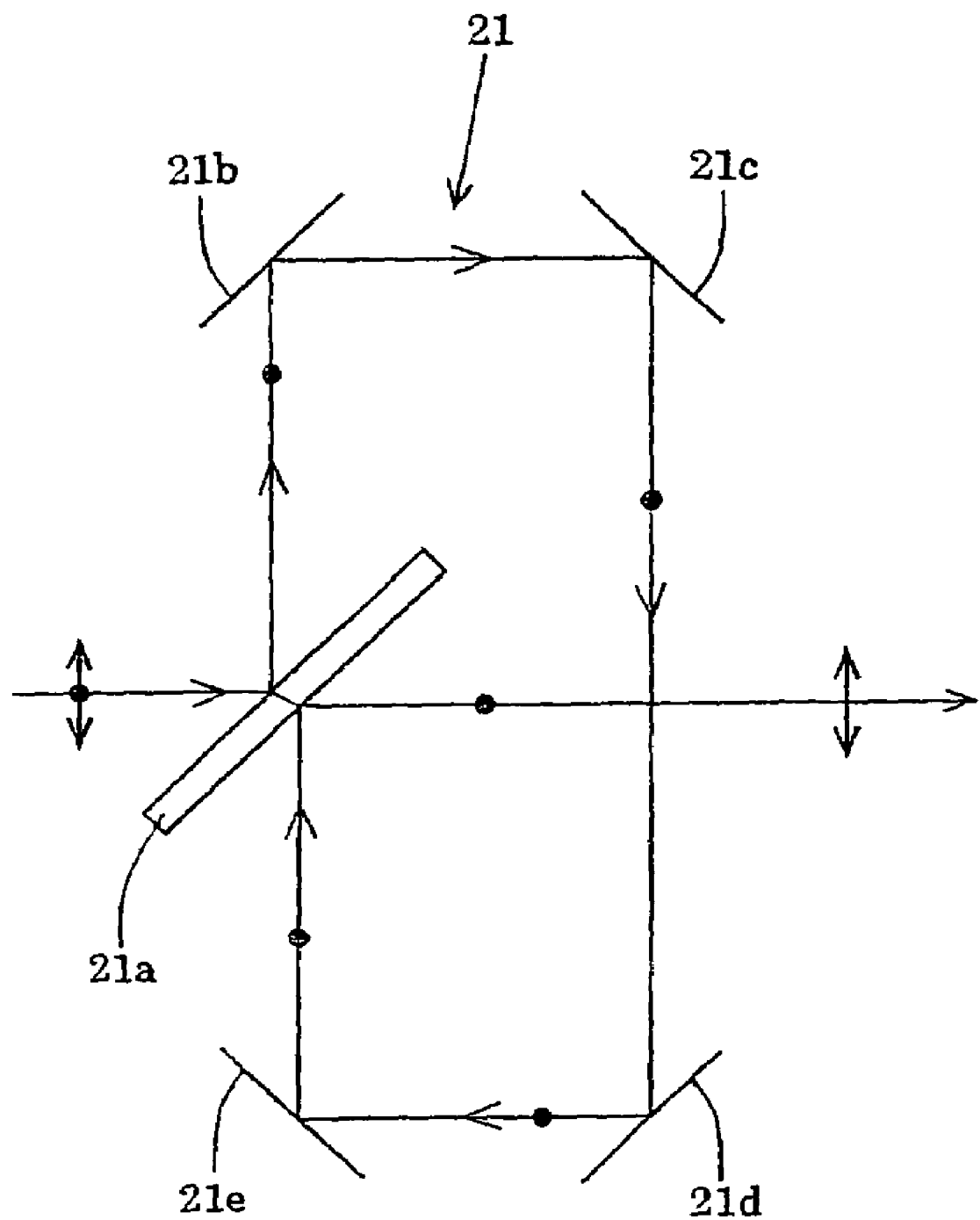
FIG. 8 is a diagram schematically showing a structure of a depolarizer according to an exemplary modification.

FIG. 8 is a diagram schematically showing a structure of the depolarizer according to an exemplary modification. In the above-described embodiment and first-third exemplary modifications, the depolarizer 20 adapts a structure having the crystal prism 20a. However, as shown in the exemplary modification shown in FIG. 8, the depolarizer 21 may be structured from a polarized beam splitter 21a and a reflection system (21b-21e). According to FIG. 8, the depolarizer 21 is equipped with the polarized beam splitter 21a positioned in the illumination light path. Of the light that enters the polarized beam splitter 21a, the P-polarized light (polarization directions indicated by bidirectional arrows in the figure) with respect to a polarization separation surface of the polarized beam splitter 21a is transmitted through the polarized beam splitter 21a.

On the other hand, the S-polarized light (polarization direction indicated by dots in the figure) with respect to the polarization separation surface of the polarized beam splitter 21a is, after being reflected by the polarized beam splitter 21a, returned to the polarized beam splitter 21a as light that has been reflected four times in a plane parallel to the surface of FIG. 8 by actions of the reflection system structured from four reflection mirrors 21b-21e. The reflection system (21b-21e) is structured such that the path of the P-polarized light that is transmitted through the polarized beam splitter 21a and the path of the S-polarized light that is eventually reflected by the polarized beam splitter 21a substantially match each other. As a result, the P-polarized light that is transmitted through the polarized beam splitter 21a and the S-polarized light that is eventually reflected by the polarized beam splitter 21a are ejected from the depolarizer 21 substantially on the same light path. However, the S-polarized light is delayed compared to the P-polarized light by the length of the light path created by the reflection system (21b-21e).

The depolarizer 21 structured from the polarized beam splitter 21a and the reflection system (21b-21e) has optical functions that are basically equivalent to those of the depolarizer 20 structured from the crystal prism 20a and the silica prism 20b. Therefore, the depolarizer 20 in the exemplary embodiment and the first to third exemplary modifications may be replaced with the depolarizer 21 according to the exemplary modification shown in FIG. 8. That is, when using the depolarizer 21 in the exemplary embodiment shown in FIG. 4, the polarized beam splitter 21a and the reflection system (21b-21e) may be structured to be integrally insertable into and removable from the illumination light path.

When using the depolarizer 21 in the first exemplary modification shown in FIG. 5 or the third exemplary modification shown in FIG. 7, the polarized beam splitter 21a and the reflection system (21b-21e) may be structured to be integrally rotatable about the optical axis AX. Furthermore, when using the depolarizer 21 in the second exemplary modification shown in FIG. 6, the polarized beam splitter 21a and the reflection system (21b-21e) may be positioned fixedly in the illumination light path.

By using the depolarizer 21 according to the exemplary embodiment shown in FIG. 8, the coherency of the laser beam that illuminates the mask M may be reduced, and therefore, a speckle contrast on the wafer may be reduced, by setting the length of the light path on the reflection system (21b-21e) substantially longer than a coherence length. Detailed structures of and various examples of modifications for a depolarizer, which has a polarized beam splitter and a reflection system and are adaptable in this invention, are described in Japanese Laid-Open Patent Application No. 11-174365, Japanese Laid-Open Patent Application No. 11-312631, Japanese Laid-Open Patent Application No. 2000-223396 and U.S. Pat. No. 6,238,063. The disclosure of U.S. Pat. No. 6,238,063 is incorporated herein by reference in its entirety.

Figure 9:
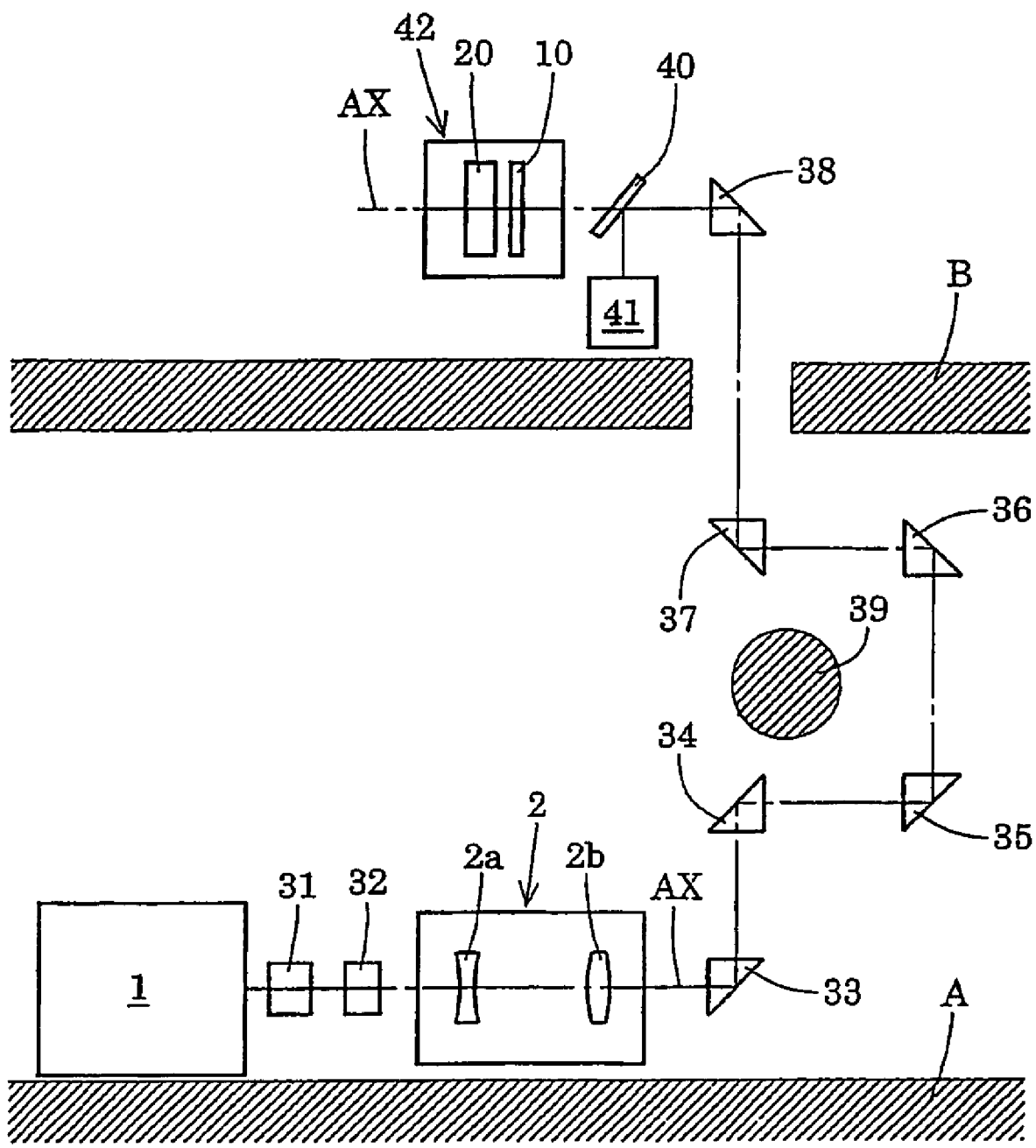
FIG. 9 is a diagram schematically showing an internal structure of a beam matching unit positioned between the light source and the polarized state switching device shown in FIG. 1.

FIG. 9 is a diagram schematically showing an internal structure for a beam matching unit positioned between the light source and the polarized state switching device shown in FIG. 1. In the beam matching unit BMU shown in FIG. 9, the beam with parallel light rays provided from the laser light source 1 (e.g., KrF excimer laser light source or ArF excimer laser light source) enters the beam expander 2 after being transmitted through a pair of deviation prisms 31 and a plane parallel plate 32. The laser light source 1 may be provided on a base plate A on a lower level, for example.

One of the pair of deviation prisms 31 is structured to be rotatable about the optical axis AX. Therefore, by relatively rotating the pair of deviation prisms 31 about the optical axis AX, the angle of the beam with parallel light rays with respect to the optical axis AX may be adjusted. That is, the pair of deviation prisms 31 forms a beam angle adjustment device for adjusting an angle of the beam with parallel light rays provided from the laser light source 1 with respect to the optical axis AX. In addition, the plane parallel plate 32 is structured to be rotatable about two axes that are orthogonal to each other and that extend in a plane perpendicular to the optical axis AX.

Accordingly, by rotating the plane parallel plate 32 about each of the axes to incline the plane parallel plate 32 with respect to the optical axis AX, the beam with parallel light rays can be moved in parallel to the optical axis AX. That is, the plane parallel plate 32 forms a beam parallel movement device for moving the beam with parallel light rays provided from the laser light source 1 in parallel to the optical axis AX. As a result, the beam with parallel light rays from the light source 1, which is transmitted through the pair of deviation prisms 31 and the plane parallel plate 32, enters a first rectangular prism 33 after being expanded and formed into a beam with parallel light rays having a predetermined cross-sectional shape through the beam expander 2.

The beam with parallel light rays deflected in a vertical direction by the first rectangular prism 33, which functions as a back surface reflection mirror, enters a sixth rectangular prism 38 as a beam with parallel light rays after passing through an opening on the base plate B on an upper level, after being sequentially reflected by the second rectangular prism 34 to the fifth rectangular prism 37, which also function as back surface reflection mirrors. As shown in FIG. 9, the second rectangular prism 34 to the fifth rectangular prism 37 are arranged in such a manner that the beam with parallel light rays deflected in the vertical direction by the first rectangular prism 33 to be directed to the sixth rectangular prism is transmitted around pipes 39 for supplying pure water or ventilating air, for example.

The beam deflected in a horizontal direction by the sixth rectangular prism 38, which functions as a back side reflection mirror, enters a half mirror 40. The beam reflected by the half mirror 40 is lead to a displacement and inclination detection system 41. On the other hand, the beam transmitted through the half mirror 40 is lead to a polarized state switching device 42 formed by the half-wave plate 10 and the depolarizer 20. By the displacement and inclination detection system 41, displacement and inclination of the beam with parallel light rays that enters the polarized state switching device 42 (and subsequently the diffractive optical element 4, which functions as an optical integrator), is detected with respect to the optical axis AX.

If, for example, the ArF excimer laser light source is used as the laser light source 1, it is generally the case that a required durability is secured for light transmissive members that receive illumination of light having high energy density by using fluorite for those members. In this case, as described below, the polarization plane for the linearly polarized light may change in a short or long term when the light is transmitted through the light transmissive members formed by fluorite. If the polarization plane for the linearly polarized light is changed by the light transmissive members formed by fluorite, the crystal prism 20a does not function as the non-polarized element.

Figure 10:
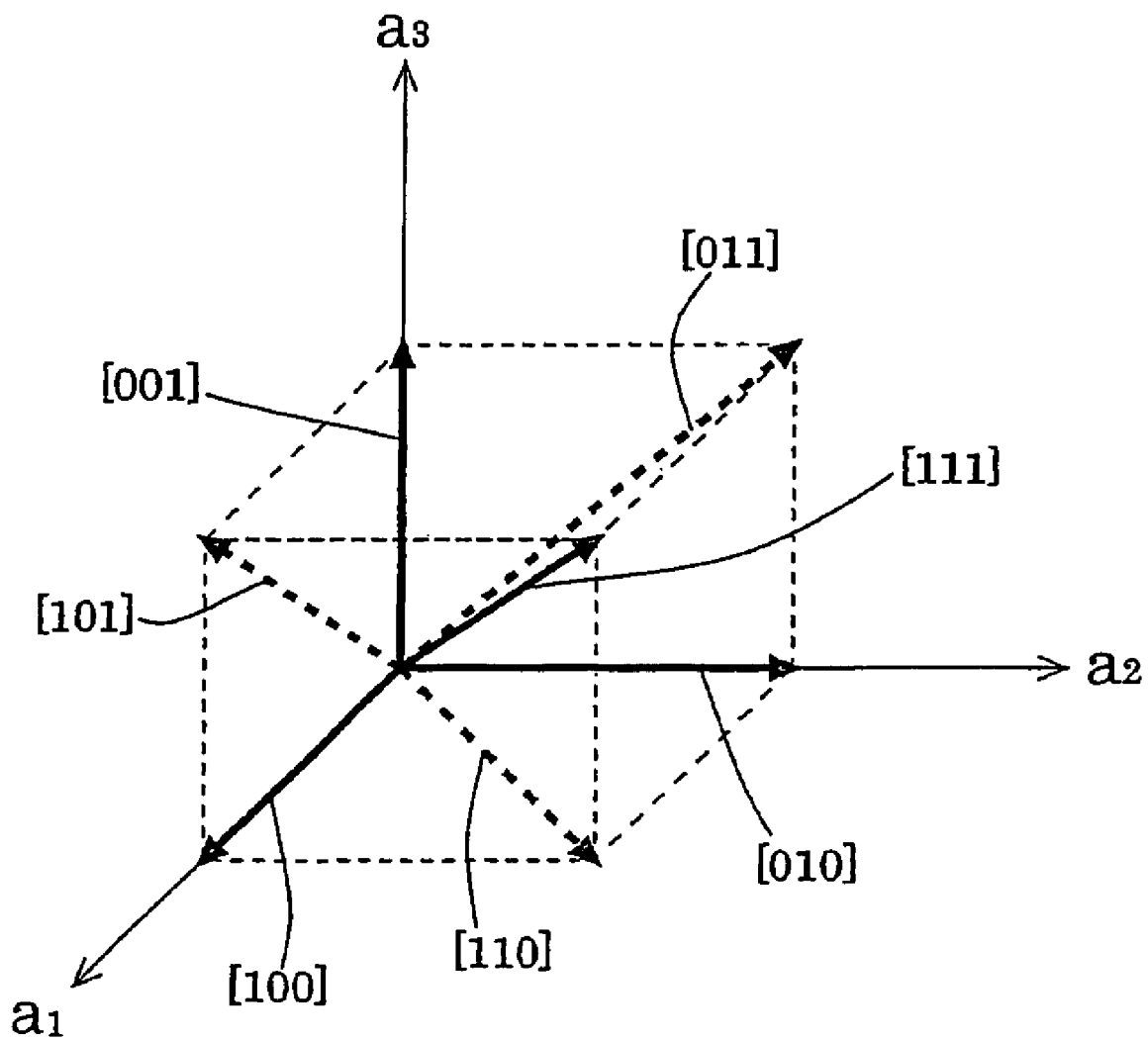
FIG. 10 is a diagram explaining a fluorite crystal orientation.

FIG. 10 is a diagram explaining the crystal orientation of fluorite. As shown in FIG. 10, the crystal orientation of fluorite is described with reference to the cubic crystal axes $a_1$, $a_2$ and $a_3$. That is, crystal orientations [100], [010] and [001] are provided along the orientation axes $+a_1$, $+a_2$ and $+a_3$, respectively. In addition, a crystal orientation [101] is provided in a direction extending 45 degrees from the crystal orientations [100] and [001] in the $a_1a_3$ plane. A crystal orientation [110] is provided in a direction extending 45 degrees from the crystal orientations [100] and [010] in the $a_1a_2$ plane. A crystal orientation [011] is provided in a direction extending 45 degrees from the crystal orientations [010] and [001] in the $a_2a_3$ plane. Furthermore, a crystal orientation [111] is provided in a direction forming equivalent acute angles with respect to the crystal axes +$a_1$, +$a_2$ and +$a_3$. In FIG. 10, only crystal orientations in a space are provided by the crystal axes +$a_1$, +$a_2$ and +$a_3$. However, similar crystal orientations may be provided in other spaces.

As verified by applicants, the polarization plane for the linearly polarized light is not substantially changed by the light transmissive members formed by fluorite as long as the traveling direction of the light is substantially matched with the crystal orientation [111] or a crystal orientation equivalent thereto in the crystal structure. Similarly, the polarization plane for the linearly polarized light is not substantially changed by the light transmissive members formed by fluorite as long as the traveling direction of the light is substantially matched with the crystal orientation [100] or a crystal orientation equivalent thereto in the crystal structure. On the other hand, if the traveling direction of the light is substantially matched with the crystal orientation [110] or a crystal orientation equivalent thereto in the crystal structure, the polarization plane for the linearly polarized light is changed through the light transmissive member formed by fluorite in a short or long term.

In this specification, "a crystal orientation equivalent to a certain crystal orientation in the crystal structure" device a crystal orientation equivalent in the crystal structure to a crystal orientation in which indexes for the crystal orientation is reordered and in which signs for at least a part of the indexes are reversed, that is, when the crystal orientation is [uvw], then equivalent orientations are [uwv], [vuw], [vwu], [wuv], [wvu], [-uvw], [-uwv], [-vuw], [-vwu], [-wuv], [-wvu], [u-vw], [u-wv], [v-uw], [v-wu], [w-uv], [w-vu], [uv-w], [uw-v], [vu-w], [vw-u], [wu-v], [wv-u], [-u-vw], [-u-wv], [-uv-w], [-uw-v], [-v-uw], [-v-wu], [-vu-w], [-vw-u], [-w-uv], [-w-vu], [-wu-v], [-wv-u], [u-v-w], [u-w-v], [v-u-w], [v-w-u], [w-u-v], [w-v-u], [-u-v-w], [-u-w-v], [-v-u-w], [-v-w-u], [-w-u-v], and [-w-v-u]. Moreover, in this specification, the crystal orientation [uvw] and the crystal orientations equivalent to the crystal orientation [uvw] in the crystal structure is referred to as a crystal orientation <uvw>. Furthermore, a plane orthogonal to the crystal orientation [uvw] and the crystal orientation equivalent to the crystal orientation [uvw] in the crystal structure, is referred to as a crystal plane (uvw), and a crystal plane equivalent to the crystal plane (uvw) in the crystal structure is referred to as a crystal plane {uvw}.

In this exemplary embodiment, the traveling direction of the light is configured to be closer to the crystal orientations <111> and <100> than to the crystal orientation <110> in the light transmissive member formed by fluorite that is positioned in the light path between the laser light source 1 and the polarized state switching device 42. In detail, if the optical member, such as lens components (2a, 2b) that form the beam expander 2, securely positioned in the light path is formed by fluorite, the optical axis of the optical member is configured to substantially match the crystal orientation <111> or <100>.

In this case, because the laser light is transmitted substantially along the crystal orientation <111> or <100>, the polarization plane for the linearly polarized light that is transmitted through the lens components (2a, 2b) is not changed substantially. Similarly, if the pair of deviation prisms 31 is formed by fluorite, changes in the polarization plane for the transmitted linearly polarized light may be substantially avoided by configuring the optical axis of the pair of the deviation prisms 31 substantially match the crystal orientation <111> or <100>.

Moreover, if the rectangular prisms 33-38, which function as back surface reflection mirrors, are formed by fluorite, an incident surface and an exit surface of the rectangular prisms 33-38 are configured to substantially match the crystal plane {100}, and reflection surfaces of the rectangular prisms 33-38 are configured to substantially match the crystal plane {110}. In such a case, because the laser beam is transmitted substantially along the crystal orientation <100>, the polarization plane for the linearly polarized light transmitted through the rectangular prisms 33-38 does not substantially change.

Furthermore, if the plane parallel plate 32, which functions as the beam parallel movement device, that is provided in the light path inclineably with respect to the optical axis AX and that moves in parallel the light beam incident along the optical axis AX, is formed by fluorite, the optical axis of the plane parallel plate 32 is configured to substantially match with the crystal orientation <100>. This is because the crystal orientations <100> and <110> form an angle of 45 degrees, while the crystal orientations <111> and <100> form an angle of about 35 degrees.

If the optical axis of the plane parallel plate 32 is substantially matched with the crystal orientation <111>, that is, substantially matched with the crystal plane {111} of the optical plane thereof, the traveling direction of the laser light transmitted through the plane parallel plate 32 comes close to the crystal orientation <110> when the plane parallel plate 32 is inclined at the maximum level (e.g., about 32 degrees) with respect to the optical axis AX. However, if the optical axis of the plane parallel plate 32 is substantially matched with the crystal orientation <100>, that is, if the optical plane thereof is substantially matched with the crystal plane {100}, a condition in which the traveling direction of the laser light transmitted through the plane parallel plate 32 is away from the crystal orientation <110> at some level, may be secured even when the plane parallel plate 32 is inclined at the maximum level (e.g., about 32 degrees) with respect to the optical axis AX. As a result, by substantially matching the optical axis of the plane parallel plate 32 with the crystal orientation <100>, changes in the polarization plane for the linearly polarized light transmitted through the plane parallel plate 32 may be avoided regardless of the position of the plane parallel plate.

In the above descriptions, the traveling direction of the light is configured to come closer to the crystal orientation <111> or <100> than to the crystal orientation <110> to avoid changes in the polarization plane for the linearly polarized light transmitted through the light transmissive member positioned in the light path between the laser light source 1 and the polarized state switching device. However, the invention is not limited to this. Similar configurations may be implemented for the light transmissive member positioned in the light path between the polarized state switching device 42 and the mask M, which is an illuminated body (and therefore the wafer W), such that the changes in the polarization plane for the linearly polarized light that originate in fluorite may be avoided throughout the entire illumination light path.

Moreover, in the above descriptions, the traveling direction of the light is configured to be closer to the crystal orientations <111> or <100> than to the crystal orientation <110> in order to avoid changes in the polarization plane for the linearly polarized light transmitted through the light transmissive member formed by fluorite. However, the invention is not limited to fluorite. Similar configuration may be implemented for a light transmissive member formed by a cubic system crystal material, such as calcium fluoride, barium fluoride, and magnesium fluoride, to avoid changes in the polarization plane for the linearly polarized light originated in such a crystal material.

A plurality of rectangular prisms 33-38 (there are 6 in FIG. 9 as an example) are provided for the beam matching unit BMU shown in FIG. 9. In general, even if the laser light source 1 is a KrF excimer laser light source or an ArF excimer laser light source, the linearly polarized light is changed to elliptically polarized light due to the total reflection by the rectangular prisms that function as back surface reflection mirrors when linearly polarized light enters the rectangular prisms, if the polarization plane for the incident linearly polarized light does not match the P-polarization plane or the S-polarization plane (if the incident linearly polarized light is not P-polarized or S-polarized with respect to the reflection surface). The polarized state switching device 42 in the exemplary embodiment functions under the assumption that linearly polarized light is entering it, and thus may not achieve the desired functions if elliptically polarized light enters.

Figure 11:
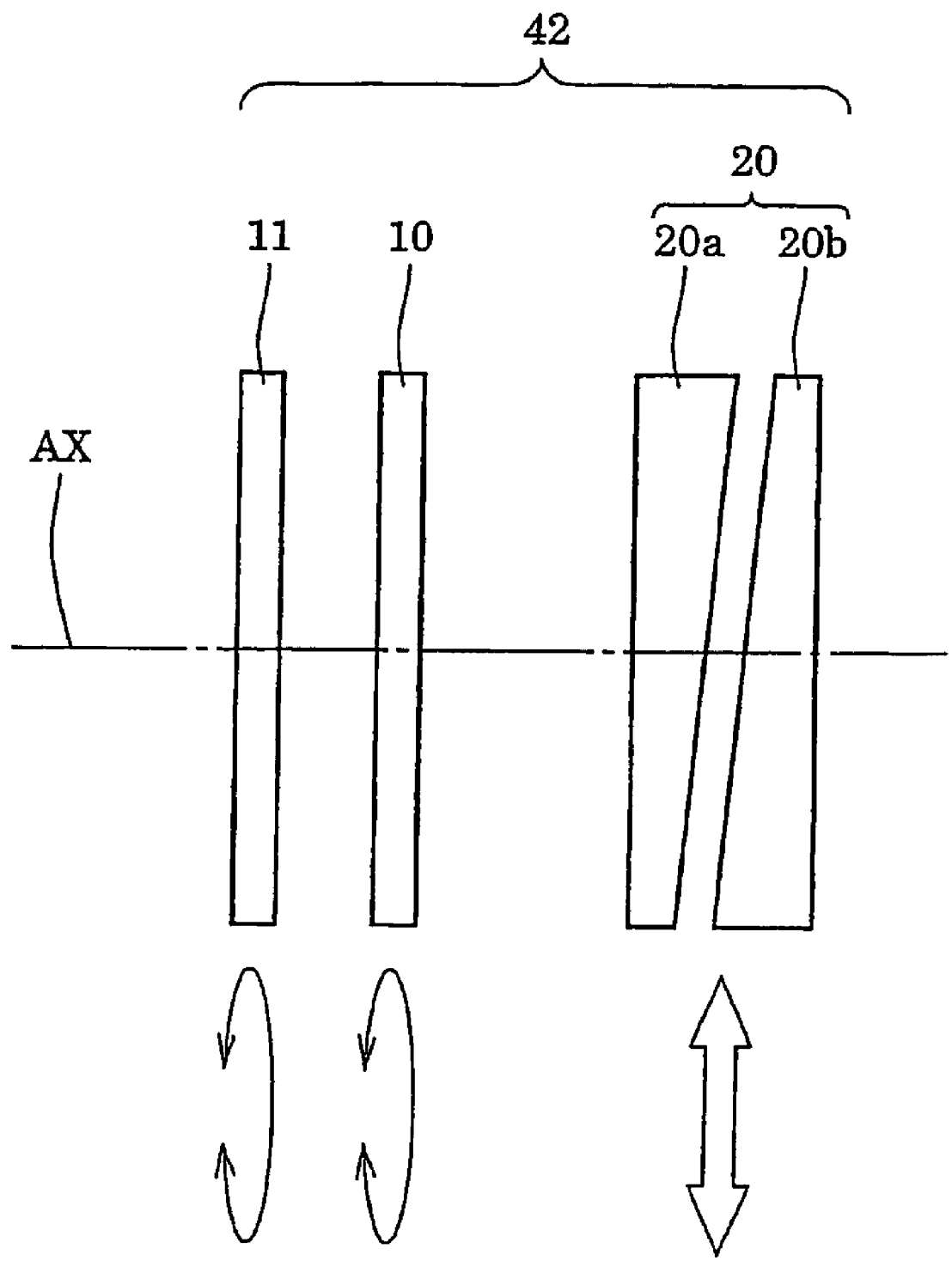
FIG. 11 is a diagram schematically showing an example in which a quarter-wave plate, which converts elliptically polarized light to linearly polarized light, is additionally provided for the polarized state switching device.

In the exemplary embodiment, as shown in FIG. 11, it may be preferable to additionally provide a quarter-wave plate 11 as a second phase member for converting the incident elliptically polarized light into linearly polarized light, on the light source side (left side in FIG. 11) of the half-wave plate 10 in the polarized state switching device 42. The quarter-wave plate 11 may be structured with its crystal optic axis being rotatable about the optical axis AX, for example. In this case, by configuring the crystal optic axis for the ¼ wavelength 11 in accordance with the characteristics of the incident elliptically polarized light, the linearly polarized light enters the half-wave plate 10 to maintain the proper functions of the polarized state switching device 42, even if elliptically polarized light originating from the rectangular prism, for example, enters the polarized state switching device 42. In FIG. 11, the quarter-wave plate 11 is positioned on the light source side of the half-wave plate 10. However, the quarter-wave plate 11 may be positioned on the mask side (right side in FIG. 11) of the half-wave plate.

In the above descriptions, a method for avoiding changes in the polarization plane for linearly polarized light that is transmitted through the light transmissive members formed with fluorite, and a method for maintaining the proper functioning of the polarized state switching device even if elliptically polarized light enters the polarized state switching device as a result of the rectangular prisms, is applied in the embodiments shown in FIGS. 1-4. However, the invention is not limited to these embodiments. These methods may be applied similarly to the exemplary modifications of FIGS. 5-8.

Moreover, in the above descriptions, to avoid changes in the polarization plane (changes in polarized state) for the linearly polarized light that is transmitted through the light transmissive members formed with a cubic system crystal material, such as fluorite, the crystal orientation of such a crystal material is taken into account. Instead of or in addition to this method, the light transmissive members formed by the cubic system crystal material may be kinematically held by using the method disclosed in U.S. Patent Publication US2002/0163741A (or WO02/16993), each of which is incorporated herein by reference in its entirety. As a result, even if the light transmissive members expand due to heat generated when the light having high energy density is transmitted through the light transmissive members formed with the cubic system crystal material, such as fluorite, generation of applied double refraction that occurs in the light transmissive members may be controlled, and changes in the polarization plane (changes in the polarized state) for the linearly polarized light that is transmitted though the light transmissive members may be controlled.

Figure 14:
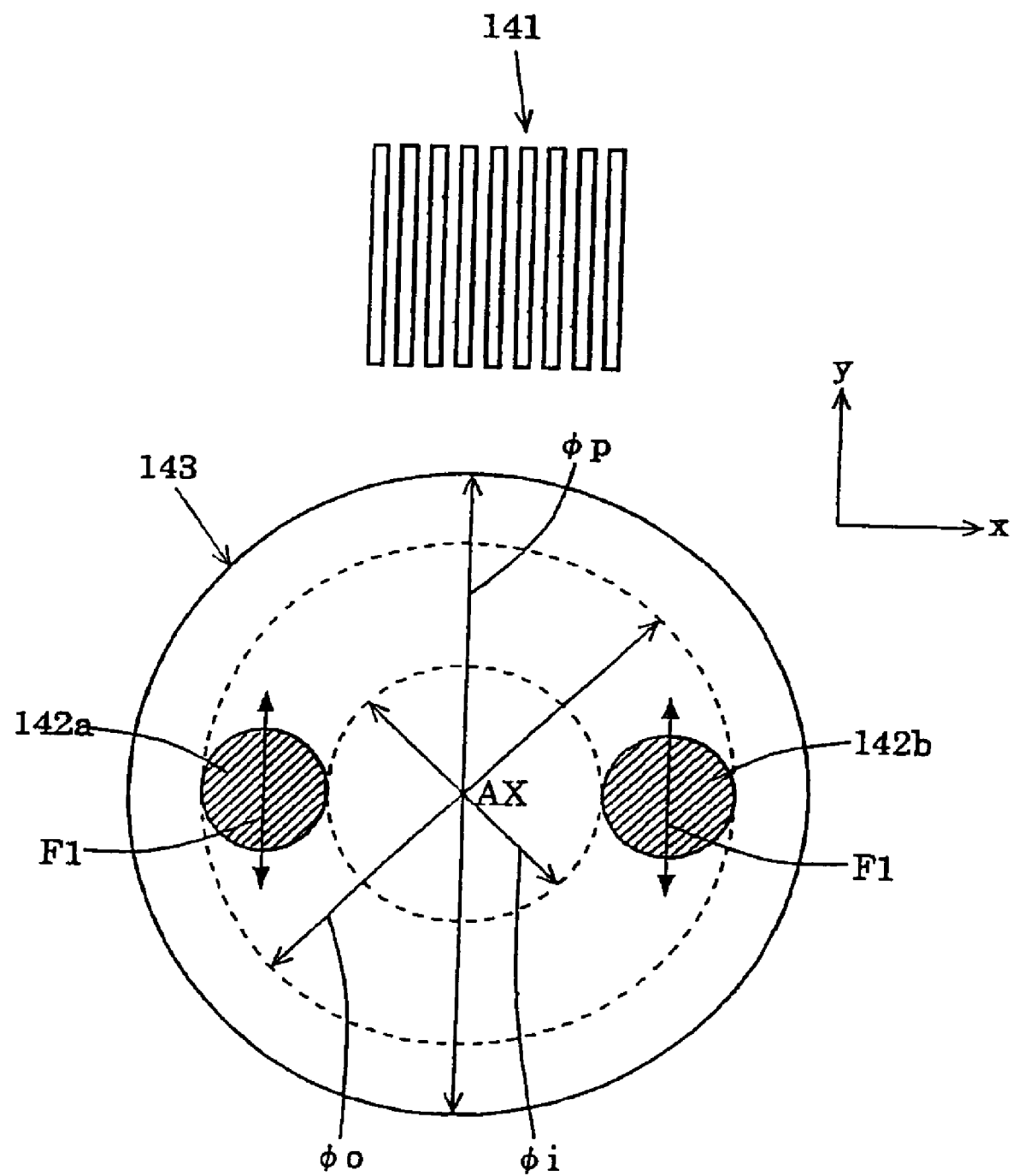
FIG. 14 is a diagram schematically explaining an example in which a mask is illuminated with light in the linearly polarized state under dipole illumination.

Next, improvement of image forming characteristics for the projection optical system (e.g., depth of focus and resolution) to perform well and accurate transferring of the mask pattern by illuminating the mask with the light having a predetermined polarized state for different types of mask patterns is described in detail using examples. First, for dipole illumination (generally, illumination that forms two separated areas having a high light intensity distribution near or adjacent to the pupil plane), for example, the image forming characteristics of the projection optical system for a mask pattern 141 can be improved by forming two planar light sources 142a and 142b that are spaced away from each other in the pitch direction (X direction: corresponding to the X direction on the mask) of a line-and-space pattern 141 formed on the mask as shown in FIG. 14, and by illuminating the mask with light in the linearly polarized state that has polarization planes (indicated by bi-directional arrows F1 in the figure) in a direction (Y direction: corresponding to the Z direction on the pupil plane) orthogonal to the direction (X direction: corresponding to the X direction on the pupil plane) in which the two planar light sources 142a and 142b are spaced away from each other. For a two-dimensional mask pattern, in which patterns in the vertical direction and patterns in the horizontal direction are mixed, the pattern transfer may be performed at high throughput by illuminating the mask with light in the nonpolarized state, without generating line width problems between the patterns in the vertical direction and the patterns in the horizontal direction.

To sufficiently improve the image forming characteristics for the projection optical system under the above-described dipole illumination, it is preferable to form the two planar light sources 142a and 142b symmetrically about the optical axis AX and to satisfy the following condition (1):

$$0.7 \leq \sigma o \quad (1)$$

For the condition (1), σo is a value (normally called an outside σ) defined by φo/φp. As shown in FIG. 14, φo is a diameter of a circle circumscribing the two planar light sources 142a and 142b about the optical axis AX, and φp is a diameter of a pupil plane 143. To further improve the image forming characteristics of the projection optical system, it is preferable to set the lower value of the condition (1) at 0.9.

Moreover, to sufficiently improve the image forming characteristics of the projection optical system under the above-described dipole illumination, it is preferable to form the two planar light sources 142a and 142b symmetrically about the optical axis AX and to satisfy the following condition (2):

$$0.5 \leq \sigma i / \sigma o \quad (2)$$

For the condition (2), σi is a value (normally called an inside σ) defined by φi/φp, and σo is the outside a defined by φo/φp. As shown in FIG. 14, φi is a diameter of a circle inscribing the two planar light sources 142a and 142b about the optical axis AX. To further improve the image forming characteristics of the projection optical system, it is preferable to set the lower value of the condition (2) at 0.67 (≈⅔).

Figure 15:
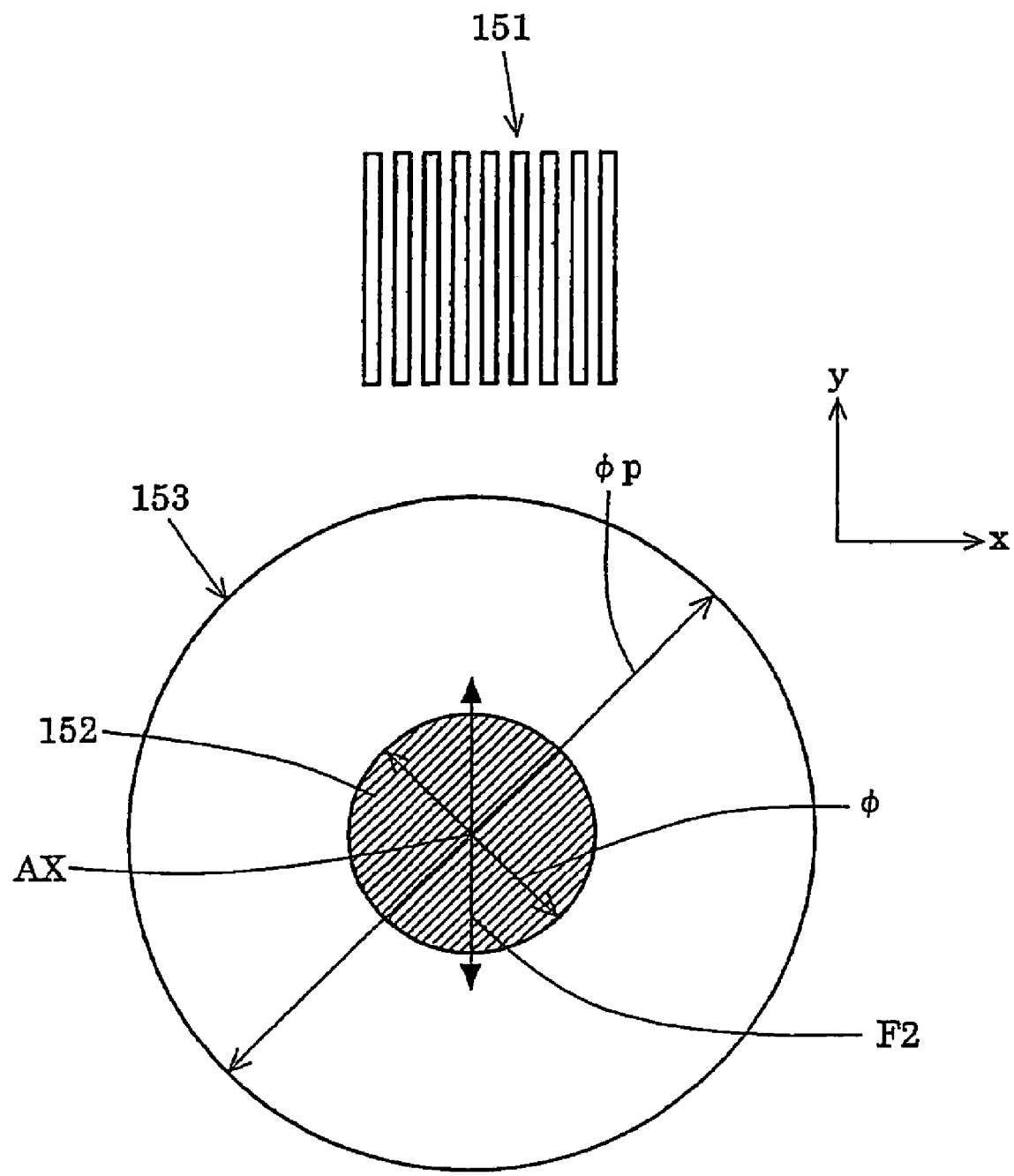
FIG. 15 is a diagram schematically explaining an example in which a mask is illuminated with light in the linearly polarized state under circular illumination.

Next, for the circular illumination (generally, illumination that forms one area having a high light intensity distribution, having a center that is substantially on the optical axis on or adjacent to the pupil plane), for example, the image forming characteristics of the projection optical system with respect to the mask pattern 151 may be improved by using a phase shift mask as the mask and by illuminating the mask with the light in the linearly polarized state that has the polarization plane in the direction (Y direction: corresponding to the Z direction on the pupil plane) orthogonal to the pitch direction (X direction: corresponding to the X direction on the mask) of the line-and-space pattern 151 formed on the phase shift mask, as shown in FIG. 15. In addition, in the circular illumination, similar to the case of the dipole illumination, the pattern may be transferred at high throughput by illuminating the mask with the light in the nonpolarized state, for example.

In particular, to sufficiently improve the image forming characteristics of the projection optical system in the above-described circular illumination, it is preferable to meet the following condition (3).

$$\sigma \leq 0.4 \quad (3)$$

In the condition (3), σ is a value (normally called a value σ) defined by $\phi/\phi p$. As shown in FIG. 15, $\phi$ is a diameter of a circular planar light source 152 (generally the size of the area with a high light intensity distribution), and $\phi p$ is a diameter of the pupil plane 153 as described above. To further improve the image forming characteristics of the projection optical system, it is preferable to set the upper limit value for the condition (3) at 0.3.

Next, conditions that the light that is substantially in the linearly polarized state or substantially in the nonpolarized state should satisfy for this invention are described. First, it is preferable that component S1 of the Stokes parameter for the light that is substantially in the linearly polarized state herein, satisfies the following condition (4):

$$0.6 \leq |S1| \quad (4)$$

In addition, it is preferable that components S1 and S2 of the Stokes parameter for the light that is substantially in the nonpolarized state herein, satisfy the following conditions (5) and (6):

$$|S1| \leq 0.1 \quad (5)$$

$$|S2| \leq 0.1 \quad (6)$$

To make the light that is substantially in the linearly polarized state sufficiently closer to being linearly polarized, it is preferable to set the lower limit value of the condition (4) at 0.8. For example, if an ArF excimer laser that provides light with a wavelength of 193 nm is used as the light source, and if a numerical aperture for the projection optical system PL on the image side is 0.92, a depth of focus DOF (166 nm) in the nonpolarized state may be improved to a depth of focus DOF (202 nm) for the vertical patterns, with an exposure amount error of 2% and a line width error of ±10% when $\phi o$ and $\phi i$ are set to 0.93 and 0.73, respectively, in the dipole illumination shown in FIG. 14 using a 6% halftone reticle (mask error: ±2 nm) having a line-and-space pattern at 65 nm. If the condition (4), that is, the degree of polarization, exceeds 0.8, the change in line width due to changes in the degree of polarization may be substantially ignored. In the above-described conditions, the generated line width difference is only 0.2 nm between the degrees of polarization of 0.8 (|S1|=0.8) and 1.0 (|S1|=1.0). This difference may be substantially ignored. In other words, the values for the condition (4) may fluctuate in the range of the degree of polarization between 0.8 and 1.0.

Moreover, to make the light substantially in the nonpolarized state closer to the sufficiently nonpolarized light, it is preferable to set the upper values for both of the conditions (5) and (6) at 0.04. If the conditions (5) and (6), that is, the degrees of polarization, are lower than 0.1, the line width difference due to the polarization may be reduced to less than 2 nm (the value σ is set at 0.2 (small σ illumination) in the circular illumination shown in FIG. 15 using a phase shift mask having patterns isolated by 50 nm, with the light source wavelength of 193 nm and the image-side numerical aperture for the projection optical system PL at 0.78). If the conditions (5) and (6), that is, the degrees of polarization, are lower than 0.4, the line width difference due to the polarization under the above-described conditions may be reduced lower than 0.7 nm. Moreover, for the conditions (5) and (6), even if the degree of polarization is high when microscopically viewing the area in the planar light source, the light is considered to be substantially nonpolarized if the polarized state changes with minute frequency within the area. Therefore, for calculating the polarization degree distribution in the planar light source, a moving average may be used in an area of a size where the value σ becomes 0.1.

For the circular and annular illuminations, differences in the pattern line width are generated between the vertical and horizontal directions if a desired nonpolarized state, in which the degree of remaining polarization is sufficiently low, is not achieved. In addition, for the dipole illumination, for example, improvement of the image forming characteristics for patterns with a narrow line width having a predetermined pitch direction may not be accomplished if the desired linearly polarized state that has the polarization plane in a predetermined direction is not achieved. Therefore, in the exemplary modification of this embodiment, a polarization monitor is provided to detect the polarized state of the light that illuminates the mask M as the illuminated surface (and therefore also the wafer W).

Figure 16:
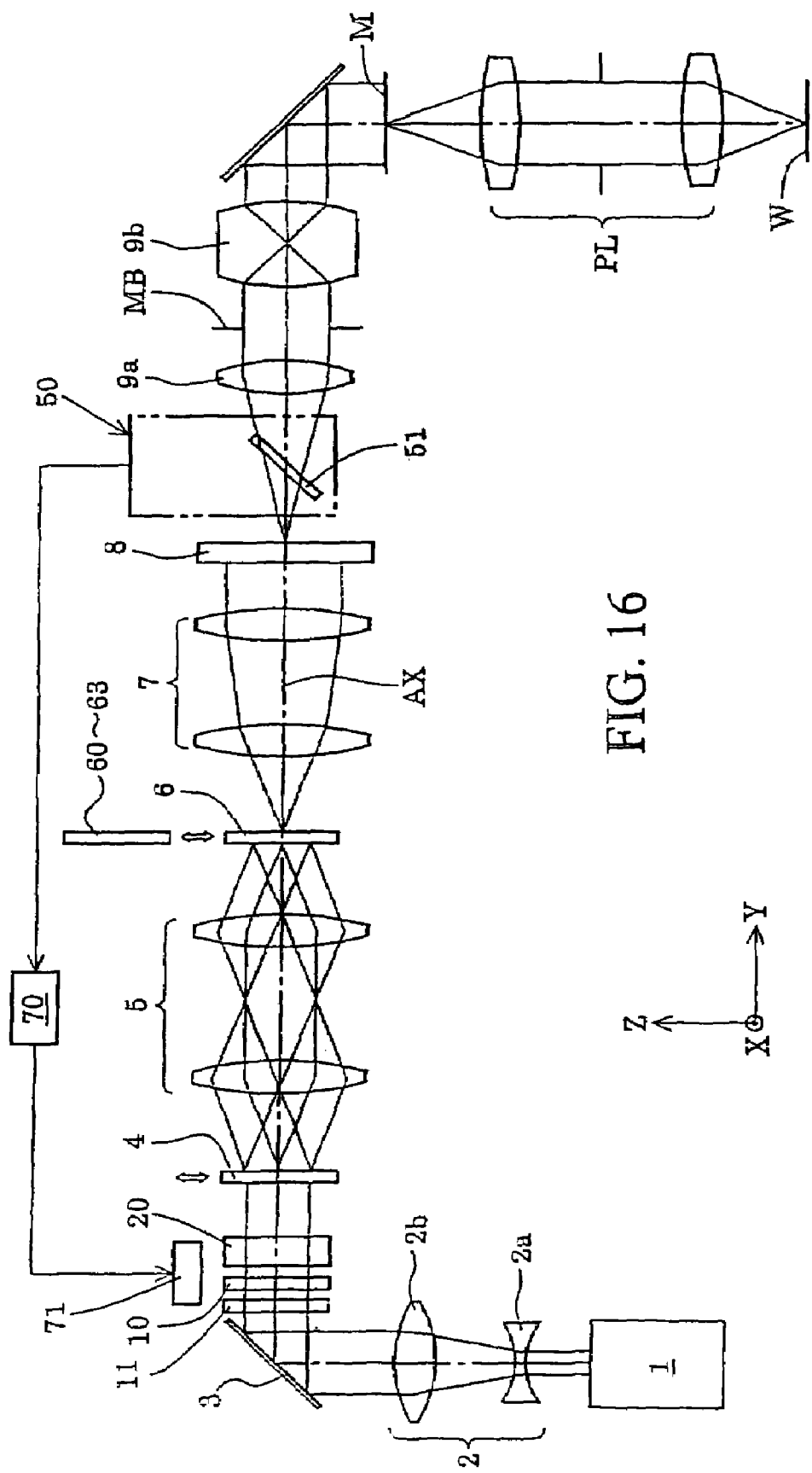
FIG. 16 is a diagram schematically showing a structure in which the exposure apparatus shown in FIG. 1 is additionally provided with a polarization monitor for detecting the polarized state of the illumination light.

FIG. 16 is a diagram schematically showing a structure of the exposure apparatus shown in FIG. 1 that is additionally provided with a polarization monitor for detecting the polarized state of the illumination light. In the exposure apparatus according to an exemplary modification shown in FIG. 16, the structure between the micro lens array 8 and the mask M is different from that of the exposure apparatus shown in FIG. 1. That is, in this exemplary modification, the light beam from the secondary light source (generally, a predetermined light intensity distribution formed on or adjacent to the pupil plane of the illumination optical system) formed on the rear focal plane of the micro lens array illuminates superimposingly a mask blind MB after being transmitted through a beam splitter 51 and a condenser optical system 9*a*.

Accordingly, a rectangular illumination field corresponding to the shape and focal length of each micro lens forming the micro lens array 8 is formed on the mask blind MB that functions as an illumination field diaphragm. Internal structures and functions of the polarization monitor 50 that includes a beam splitter 51 will described later. The light beam transmitted through the rectangular opening (light transmissive part) of the mask blind MB illuminates superimposingly the mask M, on which a predetermined pattern is formed, after being converged by the image forming optical system 9*b*. As a result, the image forming optical system 9*b* forms an image of the rectangular opening of the mask blind MB on the mask M.

Moreover, in the exposure apparatus according to the exemplary modification shown in FIG. 16, the structures between the folding mirror 3 and the diffractive optical element 4 are different from those in the exposure apparatus shown in FIG. 1. That is, in this exemplary modification, the polarized state switching device (quarter-wave plate 11, half-wave plate 10 and depolarizer 20) shown in FIG. 11 is provided instead of the polarized state switching device (half-wave plate 10 and the depolarizer 20) shown in FIG. 1. As described below, the output of the polarization monitor 50 is supplied to a control system 70. In addition, the control system 70 drives the polarized state switching device (11, 10, 20) via a drive system 71. In the polarized state switching device having the structure shown in FIG. 11, an additional quarter-wave plate may be used instead of the half-wave plate 10.

Figure 17:
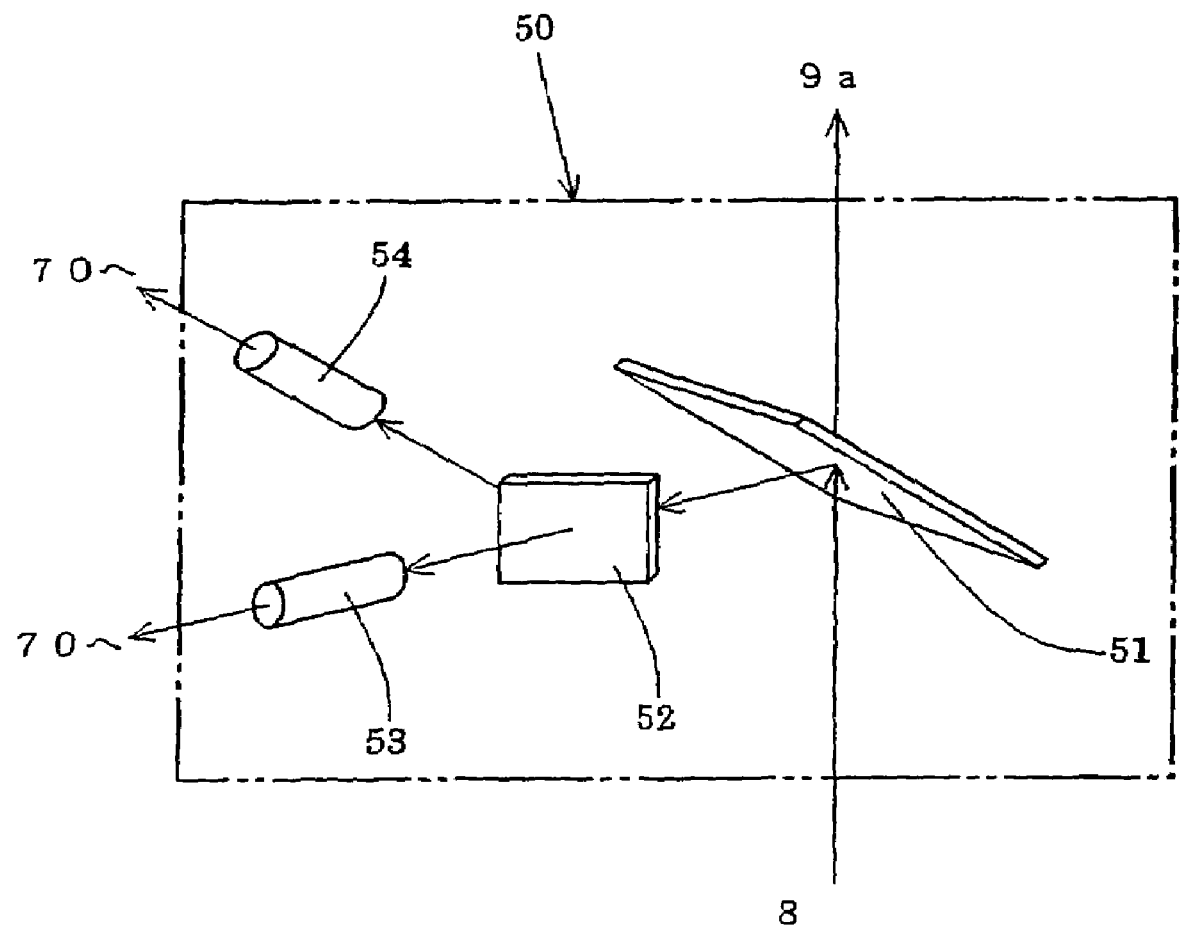
FIG. 17 is a perspective view schematically showing an internal structure of the polarization monitor shown in FIG. 16.

FIG. 17 is a perspective diagram schematically showing an internal structure of the polarization monitor shown in FIG. 16. In FIG. 17, the polarization monitor 50 is provided with the first beam splitter 51 positioned in the light path between the micro lens array 8 and the condenser optical system 9a. The first beam splitter 51 has a form of an uncoated plane parallel plate (i.e., bare glass) formed by a silica glass and has a function to extract from the light path the reflected light having a polarized state different from the polarized state of the incident light.

The light extracted by the first beam splitter 51 from the light path enters the second beam splitter 52. Similar to the first beam splitter 51, the second beam splitter 52 has a form of an uncoated plane parallel plate formed by silica glass, for example, and has a function to generate the reflected light in a polarized state different from the polarized state of the incident light. The first beam splitter 51 and the second beam splitter 52 are configured such that P-polarized light for the first beam splitter becomes S-polarized light for the second beam splitter, and S-polarized light for the first beam splitter 51 becomes P-polarized light for the second beam splitter.

The light transmitted through the second beam splitter 52 is detected by the first light intensity detector 53. The light reflected by the second beam splitter 52 is detected by the second light intensity detector 54. The outputs from the first light intensity detector 53 and the second light intensity detector 54 are both supplied to the control system 70. As discussed above, the control system 70 drives the quarter-wave plate 11, the half-wave plate, and the depolarizer 20, which form the polarized state switching device, via the drive system 71 as needed.

As described above, the reflectivity for P-polarized light and the reflectivity for S-polarized light are substantially different for the first beam splitter 51 and the second beam splitter 52. Therefore, in the polarization monitor 50, the light reflected from the first beam splitter 51 includes the S-polarized component of approximately 10% of the light incident to the first beam splitter 51 (S-polarization for the first beam splitter, which is the P-polarized component for the second beam splitter), for example, and the P-polarized component of approximately 1% of the light incident to the first beam splitter (P-polarization for the first beam splitter, which is the S-polarized component for the second beam splitter), for example.

Moreover, the light reflected from the second beam splitter 52 includes the P-polarized component of approximately 0.1%, which is 1% of the 10% of the light incident to the first beam splitter 51 (P-polarization for the first beam splitter, which is the S-polarized component for the second beam splitter), for example, and the S-polarized component of approximately 0.1%, which is 1% of the 10% of the light incident to the first beam splitter (S-polarization for the first beam splitter, which is the P-polarized component for the second beam splitter), for example.

Accordingly, in the polarization monitor, the first beam splitter 51 functions to extract from the light path the reflected light in a polarized state that is different from the polarized state of the incident light. As a result, although there is a slight effect by changes in polarization due to the polarization characteristics of the second beam splitter, the polarized state (degree of polarization) of the light incident to the first beam splitter 51, and thus the polarized state of the light illuminating the mask M, may be detected based on the output of the first light intensity detector 53 (information related to the strength of the light transmitted through the second beam splitter, that is, the information related to the intensity of the light in the polarized state that is substantially the same as that for the light reflected from the first beam splitter 51).

Furthermore, in the polarization monitor 50, the P-polarized light and the S-polarized light for the first beam splitter are configured to be S-polarized light and P-polarized light for the second beam splitter, respectively. As a result, the amount (intensity) of the light incident to the first beam splitter, and thus of the light illuminating the mask M, may be detected based on the output of the second light intensity detector 54 (information related to the intensity of the light sequentially reflected by the first beam splitter 51 and the second beam splitter 52), without being substantially affected by the changes in the polarized state for the light incident to the first beam splitter.

As such, using the polarization monitor 50, the polarized state of the light incident to the first beam splitter 51 may be detected, and thus a determination may be subsequently made as to whether the light illuminating the mask M is in the desired nonpolarized state or linearly polarized state. In addition, when the control system 70 confirms that, based on the detection result by the polarization monitor 50 that the light illuminating the mask M (and subsequently the wafer W) has not been in the desired nonpolarized state or linearly polarized state, the quarter-wave plate 11, the half-wave plate 10 and the depolarizer 20, which form the polarized state switching device, are driven via the drive system 71 for adjustment, so that the condition of the light illuminating the mask M may be adjusted to the desired nonpolarized state or linearly polarized state.

As described above, the polarization monitor 50, the control system 70, the drive system 71, and the polarized state switching device (11, 10, 20) which has a function to adjust the polarized state on the illuminated surface, are positioned in the light path between the light source 1 and the mask M and form a polarized state fluctuation correction device that corrects the fluctuation of the polarized state on the mask M. In this case, it is preferable to avoid, as much as possible, positioning optical members that have characteristics to change and eject the polarized state of the incident light, such as an optical member formed by a crystal optical material, such as fluorite that has double refractivity (birefringence), or a quartz that has optical activity (rotary polarization, optical rotation), in the light path between the polarization monitor 50 and the mask M. Moreover, in the light path between the polarization monitor 50 and the light source 1 also, it is preferable to avoid, as much as possible, positioning optical members that have characteristics to change the polarized state of the light that is ejected. However, to secure the durability of the optical member with respect to the illumination of light, it may be necessary to consider the effects from the changes in polarization caused by the optical members, such as the diffractive optical elements 4 and 6, if such optical members are formed by fluorite or crystal.

Furthermore, in the above-descriptions, if the first light intensity detector 53 is structured such that the light reflected from the first beam splitter 51 directly enters the first light intensity detector 53, the polarized state of the light incident to the first beam splitter 51 may be detected highly accurately without having the output of the first light intensity detector 53 being affected by the polarization fluctuation due to the polarization characteristics of the second beam splitter 52. In addition, without being limited to the structure shown in FIG. 17, there are various exemplary modifications for the detailed structure of the polarization monitor 50. Moreover, in the above description, the polarized state switching device is structured by the quarter-wave plate 11, the half-wave plate 10 and the depolarizer 20. However, the polarized state switching device may be structured by the half-wave plate 10 and the depolarizer 20. In such a case, the control system 70 drives the half-wave plate 10 and the depolarizer 20 via the drive system 71 as needed.

In the above-descriptions, to highly accurately detect the polarized state of the light incident to the first beam splitter 51, it is preferable that the first beam splitter 51 and the second beam splitter 52 have reflective characteristics such that the reflectivity for the P-polarized light is sufficiently different from the reflectivity for the S-polarized light. In detail, it is preferable that the first beam splitter 51 and the second beam splitter 52 have reflective characteristics such that the P-polarized light intensity Ip and the S-polarized light intensity Is, which are included in the light reflected from the first beam splitter 51, satisfy a condition that an intensity ratio Ip/Is is less than ½ (Ip/Is<½) or more than 2 (Ip/Is>2).

In addition, in the above descriptions, beam splitters that have a form of a plane parallel plate are used to extract the reflected light from the light path. However, the invention is not limited to this. The polarized state of the light incident to the beam splitter may be detected by using a beam splitter that extracts from the light path the light transmitted in a polarized state different from the polarized state of the incident light and based on the intensity of the transmitted light extracted from the light path by the beam splitter. In such a case, it is preferable that the beam splitter has transmissive characteristics such that the P-polarized light intensity Ip and the S-polarized light intensity Is, which are included in the light reflected from the beam splitter, satisfy a condition that the intensity ratio Ip/Is is less than ½ (Ip/Is<½) or more than 2 (Ip/Is>2).

As described above, it is possible that linearly polarized light from the laser light source 1 is changed to elliptically polarized light and enters the polarized state switching device (11, 10, 20) due to effects of the total reflection by the rectangular prisms. In addition, it is possible that linearly polarized light from the laser light source 1 is changed to elliptically polarized light and enters the polarized state switching device (11, 10, 20) due to effects by an optical member, such as one formed by fluorite, which has characteristics to change the polarized state of the incident light.

In this case, in order to convert the elliptically polarized state incident to the quarter-wave plate 11 into linearly polarized light, its crystal optic axis should be set at a predetermined angular position in accordance with the orientation of the long axis of the incident elliptically polarized light. In addition, in order to convert the linearly polarized light incident to the half-wave plate 10 into linearly polarized light having a polarization plane in a predetermined direction, the crystal optic axis should be set at a predetermined angular position in accordance with the orientation of the polarization plane of the incident linearly polarized light. A method of adjusting the crystal optic axis for the quarter-wave plate and the crystal optic axis for the half-wave plate is explained before with the polarized state switching device (11, 10, 20) shown in FIG. 11 as an example. The below adjustment method may be generally applicable in any optical system equipped with a half-wave plate and a quarter-wave plate, in which the crystal optic axes thereof are structured to be rotatable about the optical axis.

Figure 18:
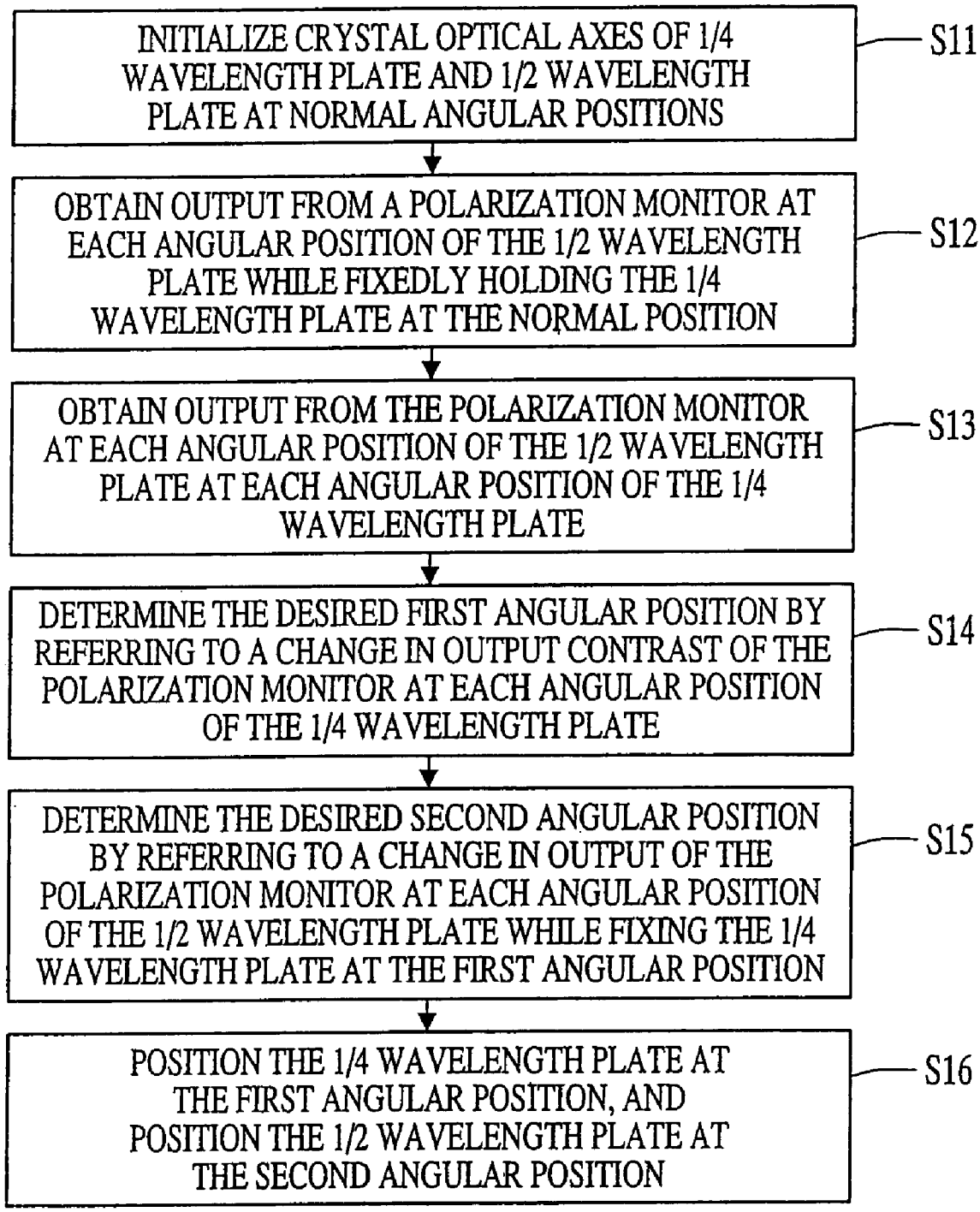
FIG. 18 is a flow chart of a method for adjusting a crystal optic axis for the quarter-wave plate and a crystal optic axis for a half-wave plate in the polarized state switching device shown in FIG. 11.

FIG. 18 is a flow chart of a method for adjusting the crystal optic axes of the quarter-wave plate and of the half-wave plate in the polarized state switching device shown in FIG. 11. As described in FIG. 18, the depolarizer 20 is removed from the light path, and the crystal optic axes of the quarter-wave plate 11 and of the half-wave plate 10 are initially set at the normal angular position, such as −45 degrees (S11). Next, while the crystal optic axis of the quarter-wave plate 11 is fixed at the normal angular position of −45 degrees, outputs are obtained from the polarization monitor 50 at each angular position of the crystal optic axis of the half-wave plate 10 as the crystal optic axis of the half-wave plate 10 is rotated by +5 degrees, for example, from the normal angular position of −45 degrees to an angular position of +45 degrees (S12).

Figure 19:
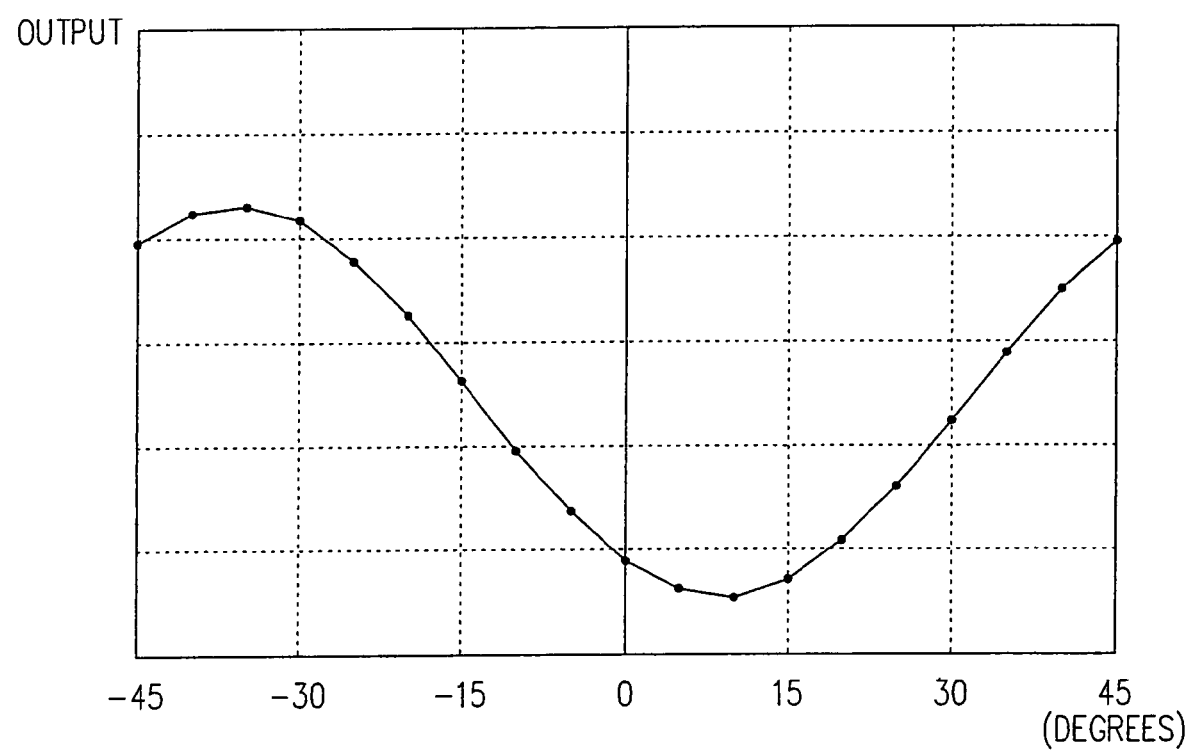
FIG. 19 is a diagram showing changes in output of the polarization monitor at each angular position of the crystal optic axis for the half-wave plate when the crystal optic axis for the quarter-wave plate is fixed at a normal angular position of −45 degrees.

FIG. 19 is a graph showing the changes in the output of the polarization monitor at various angular positions of the crystal optic axis of the half-wave plate. In FIG. 19, the horizontal axis indicates the angular position (degrees) of the crystal optic axis of the half-wave plate 10, and the vertical axis indicates the output (values for the Stokes parameter S1 component) of the polarization monitor 50. Next, as the crystal optic axis of the quarter-wave plate 11 is rotated by +15 degrees, for example, from the normal angular position of −45 degrees to an angular position of +45 degrees, outputs from the polarization monitor 50 are obtained at each angular position of the crystal optic axis of the half-wave plate 10 for each angular position of the crystal optic axis of the quarter-wave plate 10, as the crystal optic axis of the half-wave plate 10 is rotated by +5 degrees, for example, from the normal angular position of −45 degrees to an angular position of +45 degrees (S13).

Figure 20:
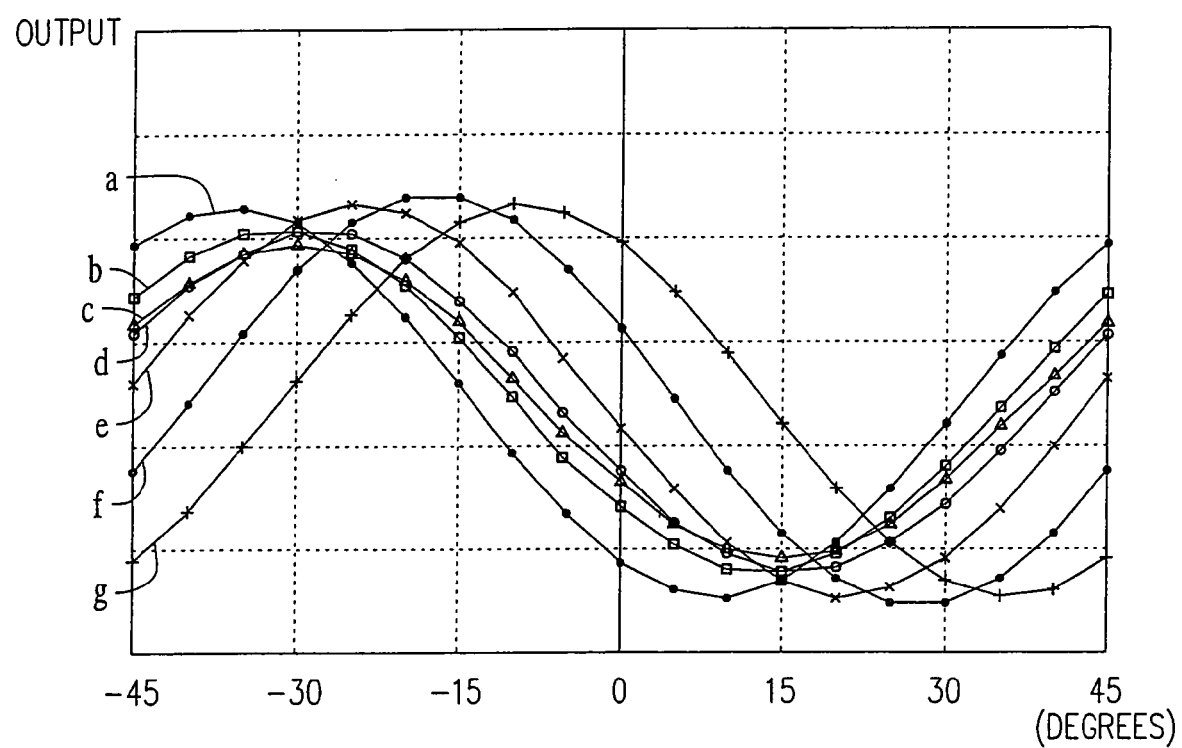
FIG. 20 is a diagram showing changes in output of the polarization monitor at each angular position of the crystal optic axis for the half-wave plate when the crystal optic axis for the quarter-wave plate is set at various angular positions.

FIG. 20 is a graph showing the changes in the output of the polarization monitor at various angular positions of the crystal optic axis of the half-wave plate for each angular position of the crystal optic axis of the quarter-wave plate. In FIG. 20, letter "a" indicates that the crystal optic axis of the quarter-wave plate is at the normal angular position of −45 degrees. Letter "b" indicates that the crystal optic axis of the quarter-wave plate 11 is at the angular position of −30 degrees. Letter "c" indicates that the crystal optic axis of the quarter-wave plate 11 is at the angular position of −15 degrees. Letter "d" indicates that the crystal optic axis of the quarter-wave plate 11 is at the angular position of 0 degrees. Letter "e" indicates that the crystal optic axis of the quarter-wave plate 11 is at the angular position of +15 degrees. Letter "f" indicates that the crystal optic axis of the quarter-wave plate 11 is at the angular position of +30 degrees. Letter "g" indicates that the crystal optic axis of the quarter-wave plate is at the normal angular position of +45 degrees. In addition, similar to FIG. 19, the horizontal axis indicates the angular position (degrees) of the crystal optic axis of the half-wave plate 10, and the vertical axis indicates the output of the polarization monitor 50.

Figure 21:
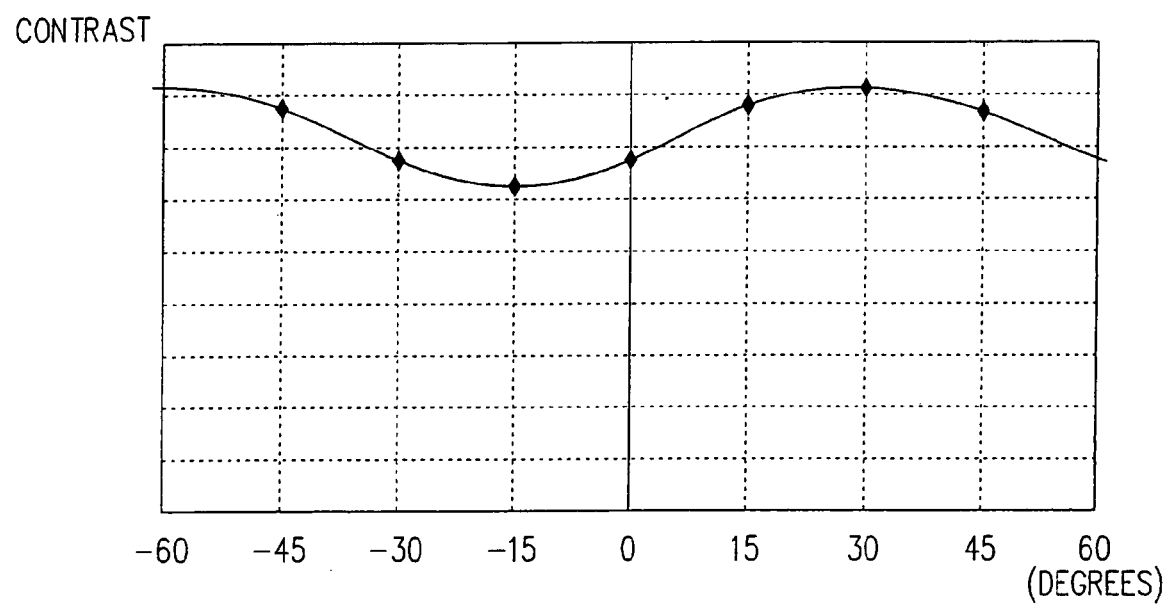
FIG. 21 is a diagram showing changes in output contrast of the polarization monitor at various angular positions for the crystal optic axis for the quarter-wave plate.

FIG. 21 is a graph showing the changes in output contrast of the polarization monitor at various angular positions of the crystal optic axis of the quarter-wave plate. In FIG. 21, the horizontal axis indicates the angular position (degrees) of the crystal optic axis of the quarter-wave plate 11, and the vertical axis indicates the output color contrast (contrast of the changes in the Stokes parameter S1 component) of the polarization monitor 50. The output contrast at each angular position of the crystal optic axis of the quarter-wave plate 11, for example, is a value defined using the maximum and minimum values of the curves showing the output changes indicated by letters a-g in FIG. 20 and by an equation contrast=(maximum value−minimum value)/(maximum value+minimum value).

The elliptically polarized light incident to the quarter-wave plate 11 is converted to linearly polarized light when the crystal optic axis of the quarter-wave plate 11 is set such that the output contrast becomes largest in FIG. 21. Therefore, in the adjustment method of this embodiment, the angular position of the crystal optic axis of the quarter-wave plate 11, at which the output contrast becomes largest (the angular position of +30 degrees according to FIG. 21), is determined as the desired first angular position for converting elliptically polarized light into linearly polarized light, by referring to the changes in the output contrast of the polarization monitor 50 at each angular position of the crystal optic axis of the quarter-wave plate 11 (S14).

Figure 22:
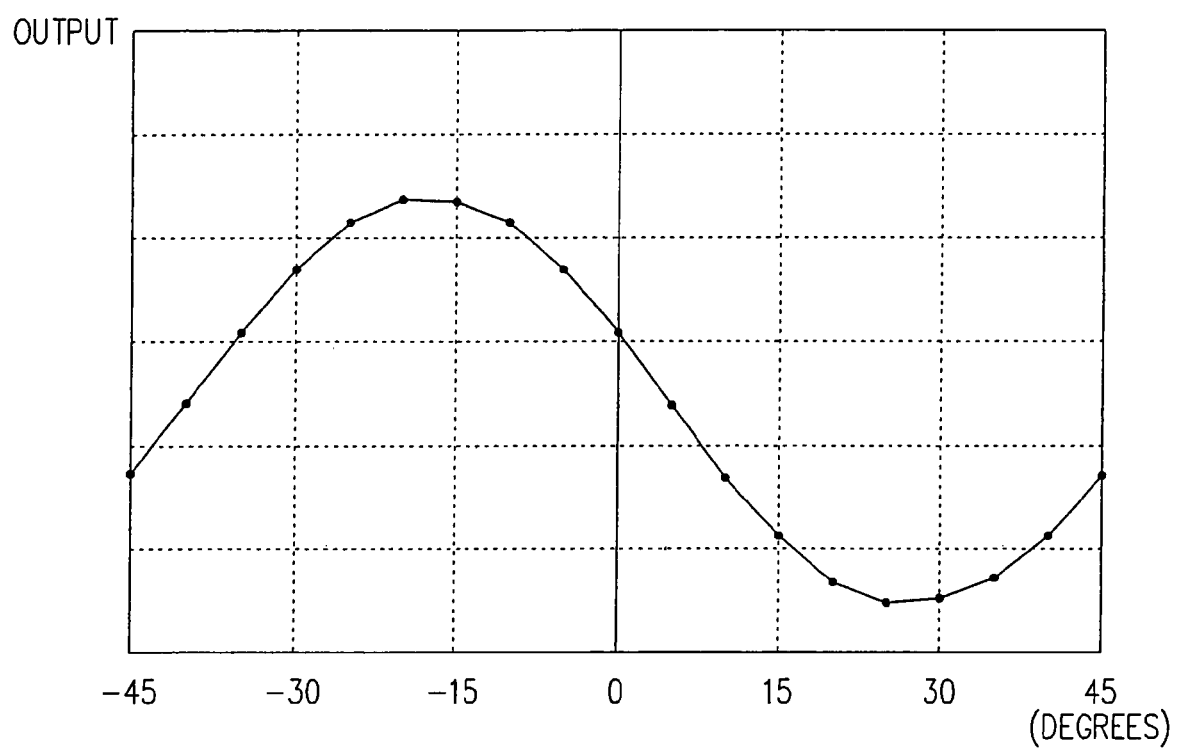
FIG. 22 is a diagram showing changes in output of the polarization monitor at each angular position of the crystal optic axis for the half-wave plate when the crystal optic axis of the quarter-wave plate is fixed at the first angular position for converting the elliptically polarized light to a linearly-polarized light.

FIG. 22 is a graph showing the changes in the output of the polarization monitor at various angular positions of the crystal optic axis of the half-wave plate when the crystal optic axis of the quarter-wave plate is fixed at the first angular position, which is for converting elliptically polarized light into linearly polarized light. In FIG. 22, the horizontal axis indicates the angular position (degrees) of the crystal optic axis of the half-wave plate 10, and the vertical axis indicates the output of the polarization monitor 50. If the crystal optic axis of the half-wave plate 10 is configured such that the output of the polarization monitor 50 becomes the maximum or minimum in FIG. 22, linearly polarized light incident to the half-wave plate 10 is converted to linearly polarized light having V-polarization (vertical polarization) or H-polarization (horizontal polarization).

In the adjustment method of this embodiment, by referring to the changes in the output of the polarization monitor 50 at various crystal optic axes of the half-wave plate 10 when the crystal optic axis of the quarter-wave plate 11 is fixed at the first angular position, the angular position of the crystal optic axis of the half-wave plate 10 at the time when the output of the polarization monitor becomes maximum or minimum (angular position of −17.5 or +27.5 degrees or adjacent thereto according to FIG. 22) is determined as the desired second angular position for converting the incident linearly polarized light into linearly polarized light having V- or H-polarization (S15).

Finally, the control system 70, via the drive system 71, adjusts the angular position of the crystal optic axis of the quarter-wave plate 11 at the first angular position for converting the incident elliptically polarized light into linearly polarized light, and the angular position of the crystal optic axis of the half-wave plate 10 at the second angular position for converting the incident linearly polarized light into the linearly polarized light (e.g., V- or H-polarization) that has a polarized plane in the predetermined direction (S16). Because the above-described first and second angular positions may change in response to changes in illumination conditions (changes in the shape or size of the light intensity distribution formed on the pupil plane of the illumination optical system or adjacent thereto), it is preferable to reset the crystal optic axes of the quarter-wave plate 11 and the half-wave plate 10 as needed. In the above embodiment, the quarter-wave plate and the half-wave plate are used for the polarized state switching device. However, two quarter-wave plates may be used for the polarized state switching device.

Figure 23:
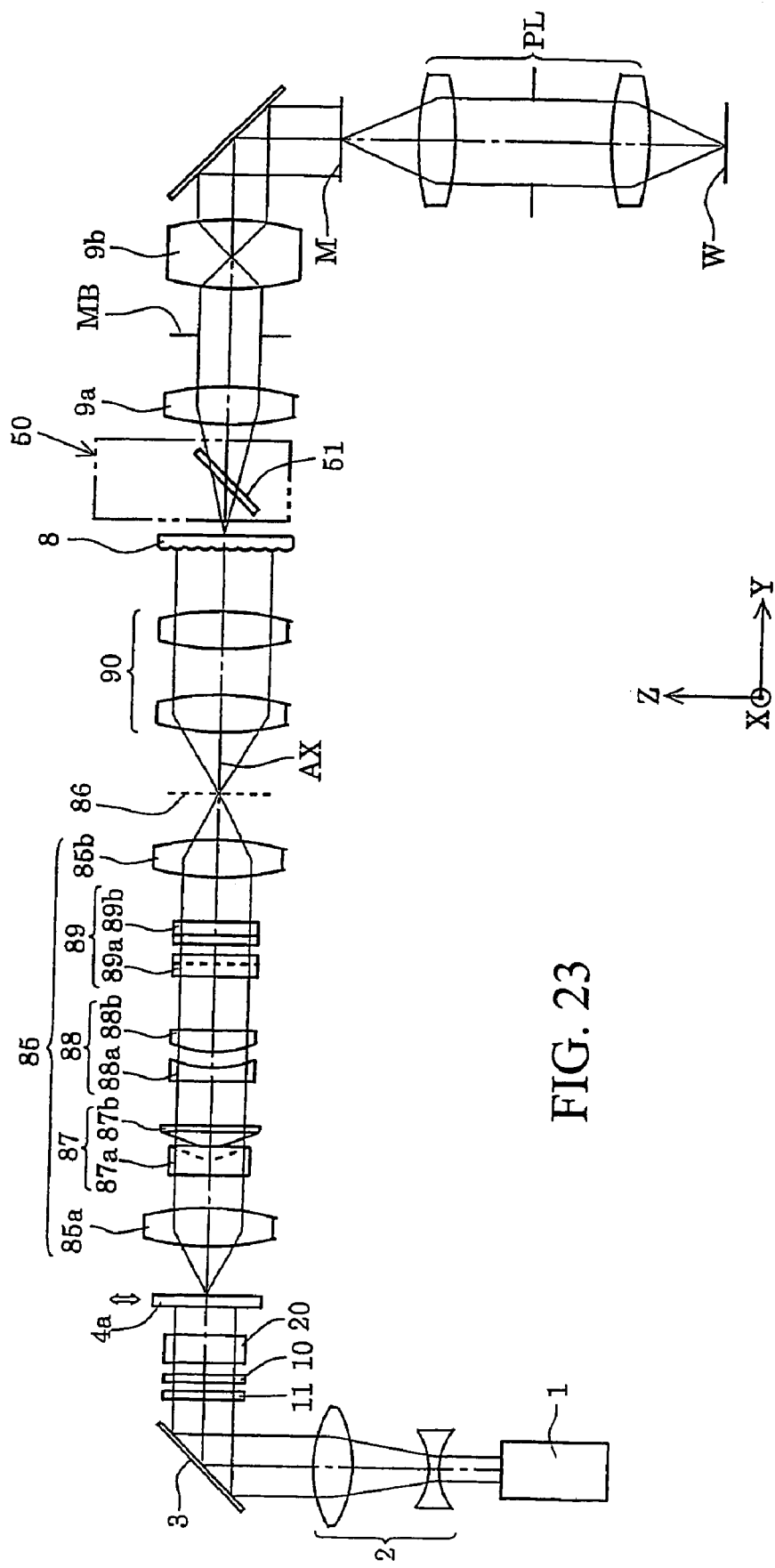
FIG. 23 is a diagram schematically showing a structure of an exposure apparatus having an illumination pupil distribution forming device, which has a different structure from the exposure apparatus shown in FIG. 1 or FIG. 16.

The above explanations are based on an exposure apparatus equipped with an illumination optical system in which an illumination pupil distribution forming device for forming a predetermined light intensity distribution on the pupil plane or adjacent thereto based on the light beam from a light source as shown in FIG. 1 or 16 includes two diffractive optical elements (4, 6). However, this invention is not limited to the structures shown in FIG. 1 or 16. There are various modifications for the structures of illumination optical systems to which this invention may be applied. FIG. 23 is a diagram schematically showing a structure of an exposure apparatus that has an illumination pupil distribution forming device having a structure different from ones shown in FIG. 1 or 16.

The exposure apparatus according to the exemplary modification shown in FIG. 23 has a structure similar to that for the exposure apparatus shown in FIG. 16. However, the structures of the illumination pupil distribution forming device, that is, the structure between the diffractive optical element 4 and the micro lens array 8 is different. The structure and functions of the exemplary modification shown in FIG. 23 are described below, focusing on the difference from the exposure apparatus shown in FIG. 16. In the exposure apparatus according to the exemplary modification shown in FIG. 23, the light beam that is transmitted through the diffractive optical element 4a for annular illumination, for example, enters an afocal lens (relay optical system) 85. The afocal lens 85 is an afocal system (afocal optical system) configured such that the position of a front focal point and the position of the diffractive optical element 4a substantially match each other, and such that the position of a rear focal point and the position of a predetermined plane 86 shown by dotted lines in the figure substantially match each other.

Therefore, a light beam with substantially parallel light rays that enters the diffractive optical element 4a exits from the afocal lens as a light beam with substantially parallel light rays after forming an annular light intensity distribution on the pupil plane of the afocal lens 85. On the pupil or adjacent thereto in the light path between a front lens group 85a and a rear lens group 85b of the afocal lens 85, a conical axicon system 87, a first cylindrical lens pair 88, and a second cylindrical lens pair 89 are positioned in order from the light source side. The detailed structure and functions thereof will be described later. The basic structure and functions are described below, without reference to the functions of the conical axicon system 87, the first cylindrical lens pair 88, and the second cylindrical lens pair 89 to simplify the explanations.

The light beam transmitted through the afocal lens 85 enters the micro lens array 8, which functions as an optical integrator, through a zoom lens (variable power optical system) for varying the σ value. The predetermined plane 86 is positioned adjacent to the front side focal point of the zoom lens 90. The incident surface of the micro lens array 8 is positioned adjacent to the rear focal point of the zoom lens 90. In other words, the zoom lens 90 positions the predetermined plane 86 and the incident surface of the micro lens array 8 in a substantial Fourier transform relationship and thus positions the pupil plane of the afocal lens 85 and the incident surface of the micro lens array 8 substantially in optical conjugation. Therefore, similar to the pupil plane of the afocal lens 85, on the incident surface of the micro lens array 8, an annular illumination field about the optical axis AX, for example, is formed. The total shape of the annular illumination field varies similarly depending on the focal length of the zoom lens 90.

Each micro lens forming the micro lens array 8 has a rectangular cross section similar to the shape of the illumination field to be formed on the mask M (and thus the shape of the exposure region to be formed on the wafer W). The light beam that enters the micro lens array 8 is two-dimensionally divided by the large number of micro lenses. On the rear focal plane (and thus the illumination pupil) is formed a secondary light source having a light intensity that is substantially the same as the illumination field formed by the light beam incident to the micro lens array 8, that is, a secondary light source formed by a substantial planar light source in an annular shape about the optical axis AX.

Figure 24:
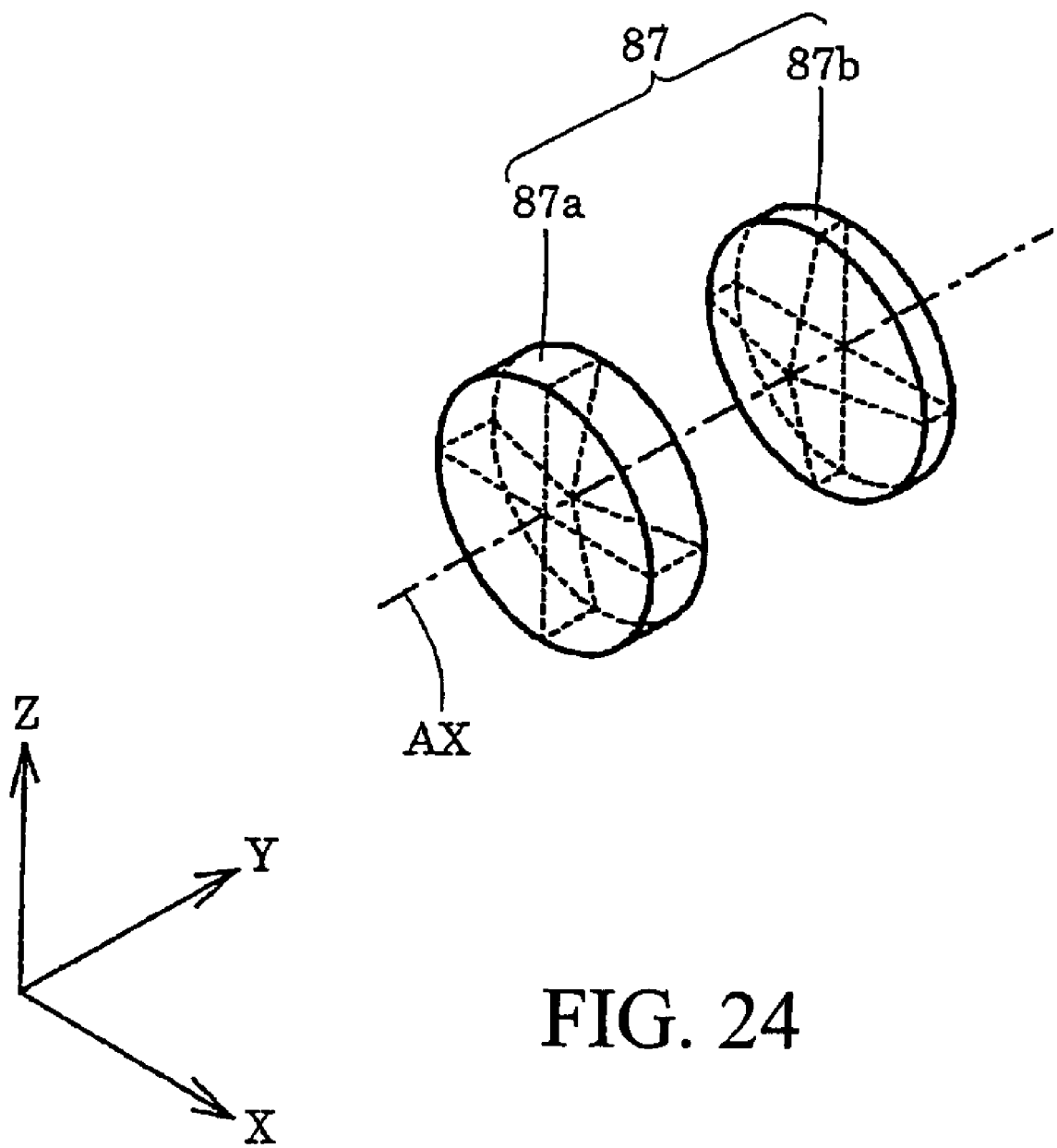
FIG. 24 is a diagram schematically showing a structure of a conical axicon system positioned in a light path between a front-side lens group and a rear-side lens group of an afocal lens shown in FIG. 23.

FIG. 24 is a diagram schematically showing the structure of the conical axicon system provided in the light path between the front and rear lens groups of the afocal lens shown in FIG. 23. The conical axicon system 87 is structured from, in order from the light source side, the first prism member 87a, having a flat surface that faces to the light source side and a concave conical refractive surface that faces to the mask side, and the second prism member 87b, having a flat surface that faces to the mask side and a convex conical refractive surface that faces to the light source side.

The concave conical refractive surface of the first prism member 87a and the convex conical refractive surface of the second prism member 87b are formed complementarily so as to be contactable to each other. In addition, at least one of the first prism member 87a and the second prism member 87b is structured so as to be movable along the optical axis AX so that the space between the concave conical refractive surface of the first prism member 87a and the convex conical refractive surface of the second prism member 87b is variable.

When the concave conical refractive surface of the first prism member 87a and the convex conical refractive surface of the second prism member 87b are in contact with each other, the conical axicon system 87 functions as a plane parallel plate. Therefore, the annular secondary light source formed is not affected. However, when the concave conical refractive surface of the first prism member 87a and the convex conical refractive surface of the second prism member 87b are separated, the conical axicon system 87 functions as a so-called beam expander. Therefore, the angle of the light beam incident to the predetermined plane 86 varies in accordance with the changes of the space in the conical axicon system 87.

Figure 25:
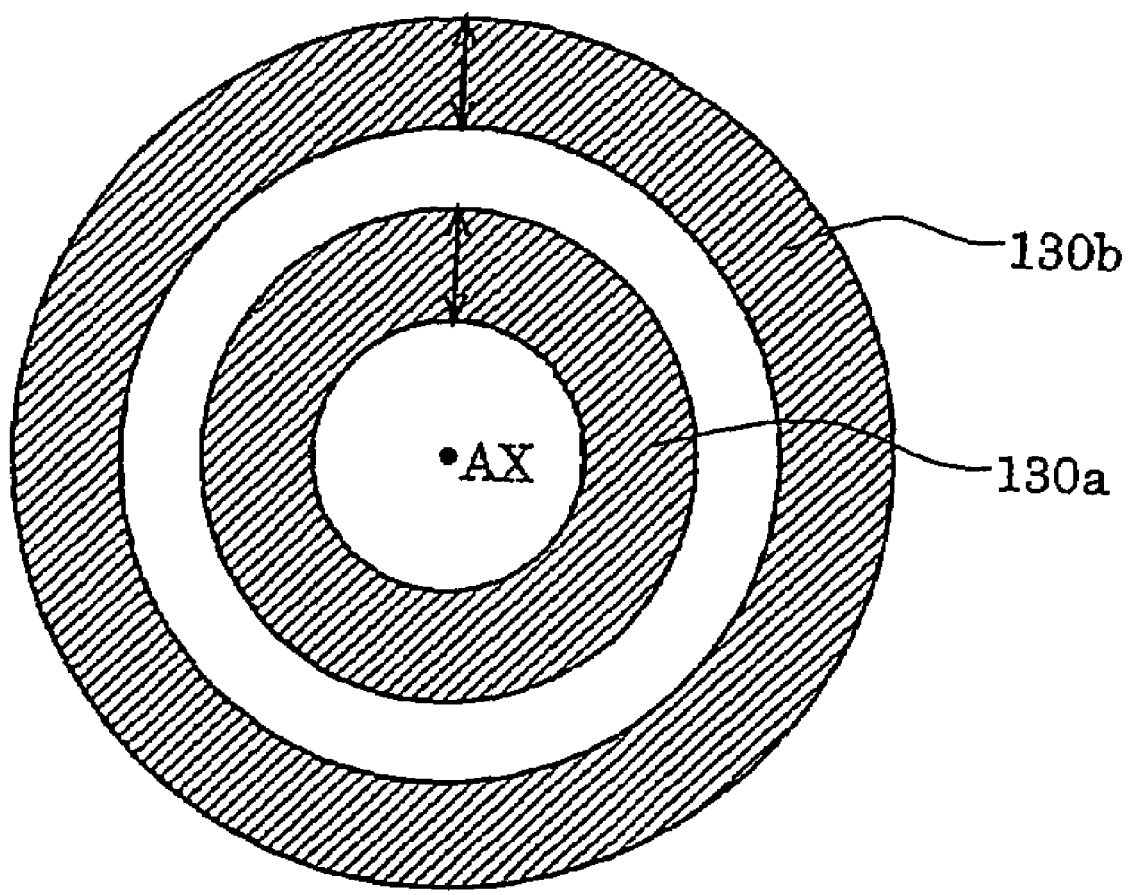
FIG. 25 is a diagram explaining functions of the conical axicon system with respect to the secondary light source formed with an annular illumination in the exemplary modification shown in FIG. 23.

FIG. 25 is a diagram that explains functions of the conical axicon system with respect to the secondary light source formed in annular illumination in the exemplary modification shown in FIG. 23. In the annular illumination in the exemplary modification shown in FIG. 23, by increasing the space in the conical axicon system 87 from zero to a predetermined value, the smallest annular secondary light source 130a, which is formed when the space in the conical axicon system 87 is zero and when the focal length of the zoom lens 90 is set at the smallest value (hereinafter referred as "normal state"), is changed to an annular secondary light source 130b, of which both outer and inner diameters are expanded, without changing the width (½ of the difference between the outer and inner diameters as indicated by arrows). In other words, the annular ratio (inner diameter/outer diameter) and the size (outer diameter) are both changed by the operation of the conical axicon system 87 without changing the width of the annular secondary light source.

Figure 26:
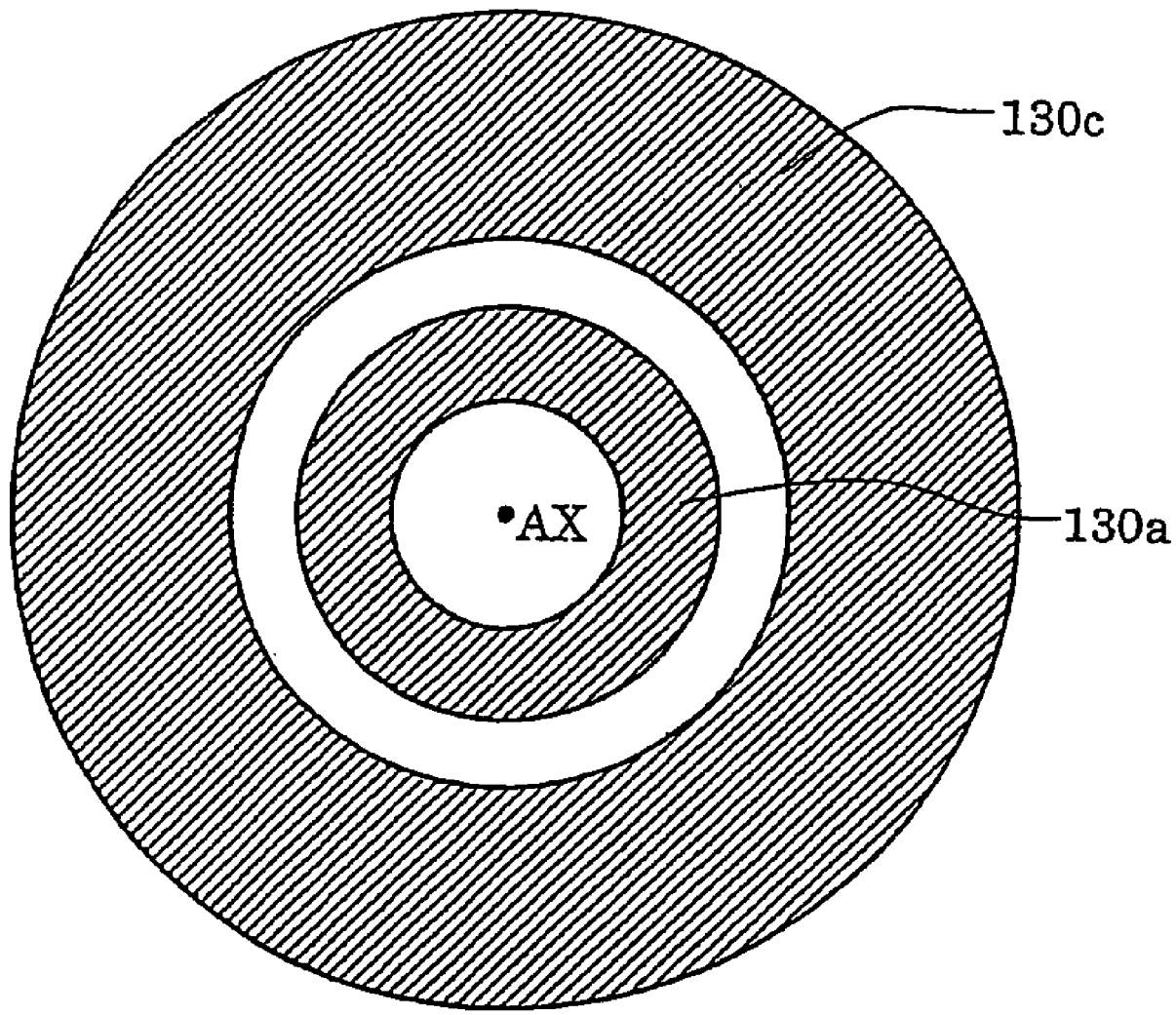
FIG. 26 is a diagram explaining functions of a zoom lens with respect to the second light source formed with the annular illumination in the exemplary modification shown in FIG. 23.

FIG. 26 is a diagram explaining the function of the zoom lens with respect to the secondary light source formed in the annular illumination in the exemplary modification shown in FIG. 23. In the annular illumination in the exemplary modification shown in FIG. 23, the annular secondary light source 130a formed in the normal state is changed to an annular secondary light source 130c, having a total shape that is expanded similarly by expanding the focal length of the zoom lens 90 from the smallest value to a predetermined value. In other words, both the width and the size (outer diameter) of the annular secondary light source are changed by the operation of the zoom lens 90 without changing the annular ratio.

Figure 27:
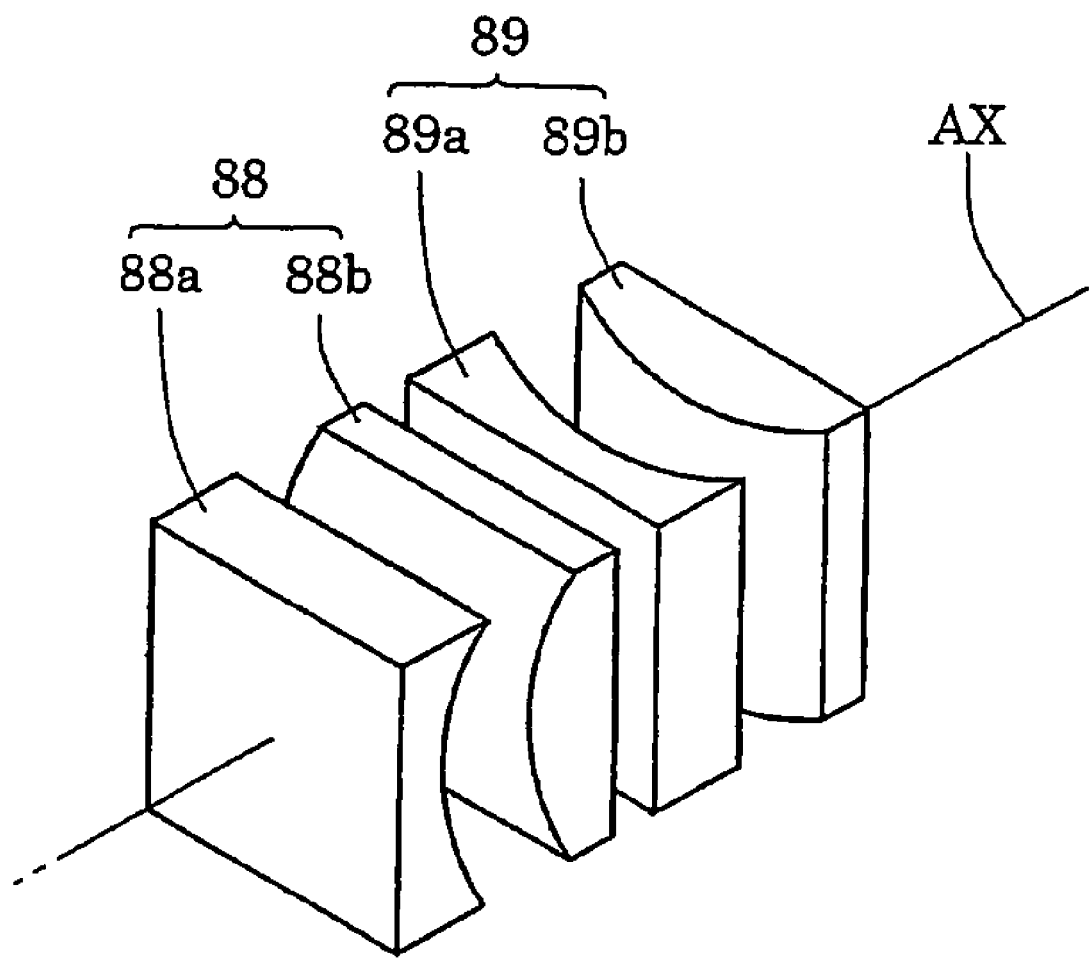
FIG. 27 is a diagram schematically showing a structure of the first cylindrical lens pair and the second cylindrical lens pair, which are positioned in the light path between the front-side lens group and the rear-side lens group of the afocal lens shown in FIG. 23.

FIG. 27 is a diagram schematically showing a structure of the first and second cylindrical lens pairs provided in the light path between the front and rear lens groups of the afocal lens shown in FIG. 23. In FIG. 27, the first cylindrical lens pair 88 and the second cylindrical lens pair 89 are provided in order from the light source side. The first cylindrical lens pair 88 is structured by, from the light source side, the first cylindrical negative lens 88a having negative refractive power in the YZ plane and no refractive power in the XY plane, and the first cylindrical positive lens 88b having positive refractive power in the YZ plane and no refractive power in the XY plane, for example.

On the other hand, the second cylindrical lens pair 89 is structured by, from the light source side, the second cylindrical negative lens 89a having negative refractive power in the XY plane and no refractive power in the YZ plane, and the second cylindrical positive lens 89b having the positive refractive power in the XY plane and no refractive power in the YZ plane, for example. The first cylindrical negative lens 88a and the first cylindrical positive lens 88b are structured so as to be integrally rotatable about the optical axis AX. Similarly, the second cylindrical negative lens 89a and the second cylindrical positive lens 89b are structured so as to be integrally rotatable about the optical axis AX.

Accordingly, in a state shown in FIG. 27, the first cylindrical lens pair 88 functions as a beam expander having power in the Z direction, and the second cylindrical lens pair 89 functions as a beam expander having power in the X direction. In the exemplary modification shown in FIG. 23, the power for the first cylindrical lens pair 88 and the power for the second cylindrical lens pair 89 are set to be the same.

Figure 28:
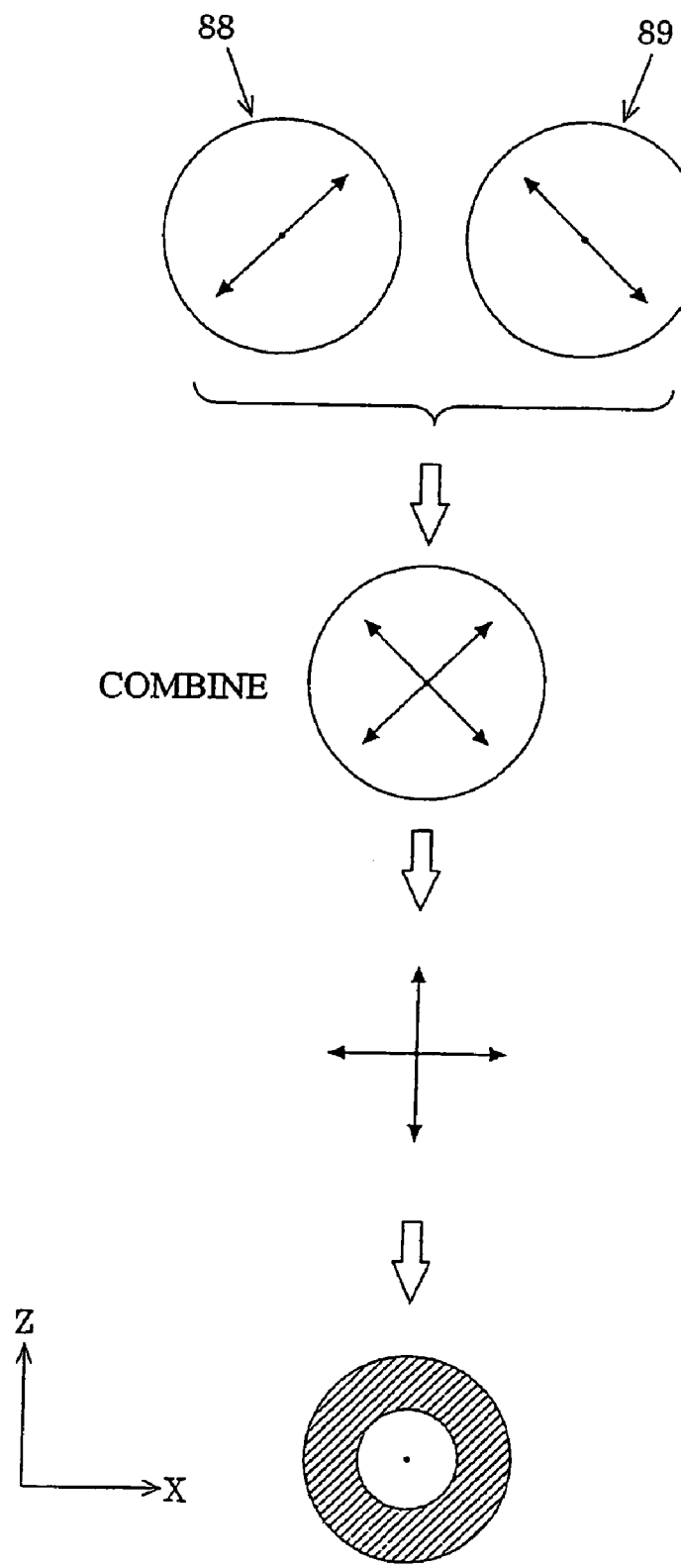
FIG. 28 is a diagram explaining the functions of the first cylindrical lens pair and the second cylindrical lens pair with respect to the secondary light source formed with the annular illumination of the exemplary modification shown in FIG. 23.
Figure 29:
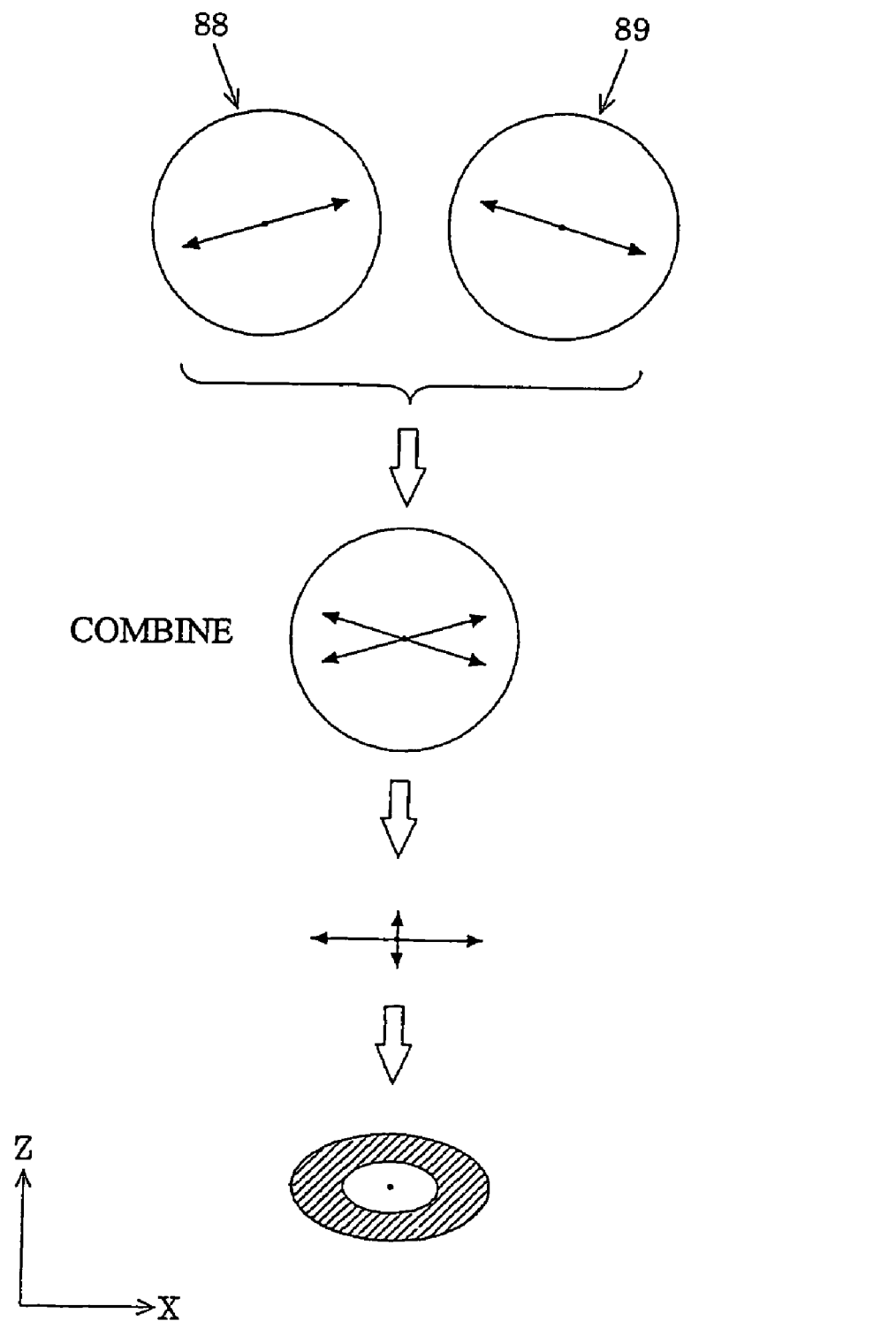
FIG. 29 is a diagram explaining the functions of the first cylindrical lens pair and the second cylindrical lens pair with respect to the secondary light source formed with the annular illumination in the exemplary modification shown in FIG. 23.
Figure 30:
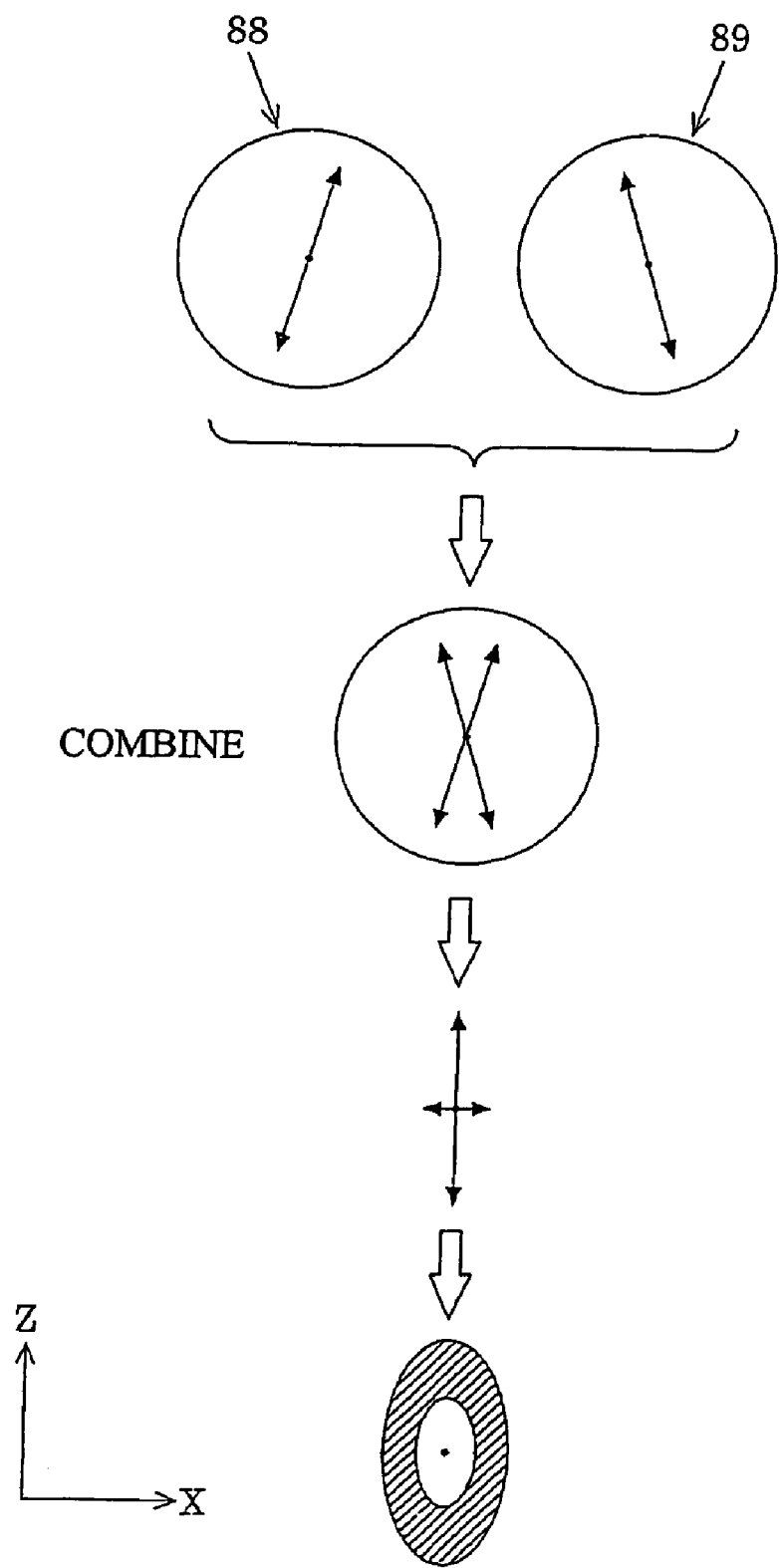
FIG. 30 is a diagram explaining the functions of the first cylindrical lens pair and the second cylindrical lens pair with respect to the secondary light source formed with the annular illumination in the exemplary modification shown in FIG. 23.

FIGS. 28-30 are diagrams explaining the operation of the first and second cylindrical lens pairs with respect to the secondary light source formed in the annular illumination in the exemplary modification shown in FIG. 23. In FIG. 28, the direction of the power of the first cylindrical lens pair 88 is set to form an angle of +45 degrees from the Z axis about the optical axis AX, and the direction of the power of the second cylindrical lens pair 89 is set to form an angle of −45 degrees from the Z axis about the optical axis AX.

Therefore, the directions of the power of the first cylindrical lens pair 88 and the second cylindrical lens pair 89 intersect at right angles to each other, and the power in the Z direction and the power in the X direction become the same in a combined system of the first cylindrical lens pair 88 and the second cylindrical lens pair 89. As a result, in a perfect circle state shown in FIG. 28, the light beam that is transmitted through the combined system of the first cylindrical lens pair 88 and the second cylindrical lens pair 89 is expanded with the same power in the Z and X directions. Therefore, a perfect annular secondary light source is formed on the illumination pupil.

In FIG. 29, the direction of the power of the first cylindrical lens pair 88 is set to form an angle of +80 degrees, for example, with respect to the Z direction about the optical axis AX, and the direction of the power of the second cylindrical lens pair 89 is set to form an angle of −80 degrees, for example, with respect to the Z direction about the optical axis AX. Therefore, the power in the X direction becomes larger than the power in the Z direction in the combined system of the first cylindrical lens pair 88 and the second cylindrical lens pair 89. As a result, in a horizontally elliptical state shown in FIG. 29, the light beam that is transmitted through the combined system of the first cylindrical lens pair 88 and the second cylindrical lens pair 89 is expanded with larger power in the X direction than in the Z direction. Therefore, a horizontally long annular secondary light source that is elongated in the X direction is formed on the illumination pupil.

In FIG. 30, the direction of the power of the first cylindrical lens pair 88 is set to form an angle of +10 degrees, for example, with respect to the Z direction about the optical axis AX, and the direction of the power of the second cylindrical lens pair 89 is set to form an angle of −10 degrees, for example, with respect to the Z direction about the optical axis AX. Therefore, the power in the Z direction becomes larger than the power in the X direction in the combined system of the first cylindrical lens pair 88 and the second cylindrical lens pair 89. As a result, in a vertically elliptical state shown in FIG. 30, the light beam that is transmitted through the combined system of the first cylindrical lens pair 88 and the second cylindrical lens pair 89 is expanded with larger power in the Z direction than in the X direction. Therefore, a vertically long annular secondary light source that is elongated in the Z direction is formed on the illumination pupil.

Further, by setting first cylindrical lens pair 88 and the second cylindrical lens pair 89 in any state between the perfect circular state shown in FIG. 28 and the horizontally elliptical state shown in FIG. 29, horizontally annular secondary light sources in accordance with various vertical/horizontal ratios can be formed. In addition, by setting first cylindrical lens pair 88 and the second cylindrical lens pair 89 in any state between the perfect circular state shown in FIG. 28 and the vertically elliptical state shown in FIG. 30, vertically annular secondary light sources in accordance with various vertical/horizontal ratios can be formed. In the exemplary modification shown in FIG. 23, circular illumination and various modified illuminations may be achieved by setting a diffractive optical element for the circular illumination or a diffractive optical element for multi-pole (e.g., quadrupole) illumination, instead of the diffractive optical element 4a for annular illumination. Therefore, in the exemplary modifications shown in FIGS. 23-30, the polarized state for the illumination light can be changed in accordance with the pattern characteristics of the mask M, and the vertical/horizontal ratio of the secondary light source formed on the illumination pupil may be adjusted as needed. As such, excellent exposure may be performed with an appropriate illumination condition achieved in accordance with the pattern characteristics of the mask M.

In addition, in each of the above-described embodiments and exemplary modifications, if there are fluctuations in uneven illumination on the illuminated surface, fluctuations in the light intensity distribution on the pupil plane, and/or fluctuations in telecentricity on the illuminated surface when switching between the linearly polarized state and the non-polarized state or between the X-polarized state and the Y-polarized state, it is preferable to reduce the fluctuations in the uneven illumination, the fluctuations in the light intensity distribution on the pupil plane, and/or the fluctuations in the telecentricity by controlling the uneven illumination, the light intensity distribution on the pupil plane and/or the telecentricity in accordance with the changes in the polarized state on the illuminated surface.

For example, the uneven illumination on the illuminated surface can be controlled by changing the lens position and orientation of at least a part of the plurality of lens elements forming the condenser optical system 9 shown in FIG. 1 or the condenser optical system 9a shown in FIG. 16 or 23. In addition, in the light path between the condenser optical system 9 and the mask M shown in FIG. 1 or in the light path between the condenser optical system 9 and the mask blind MB shown in FIG. 16 or 23, a density filter plate disclosed in Japanese Laid-Open Patent Application No. 2002-100561 (and corresponding U.S. Patent Publication No. 2003/0025890A, which is incorporated herein by reference in its entirety) or disclosed in Japanese Laid-Open Patent Application No. 2003-92253 (and corresponding U.S. Patent Publication No. 2003/0067591A. which is incorporated herein by reference in its entirety) may be positioned. By controlling rotational angle and position of the density filter plate, the uneven illumination on the illuminated surface can be controlled. Moreover, instead of or in the proximity of the mask blind MB shown in FIG. 16 or 23, a variable blade disclosed by Japanese Laid-Open Patent Application No. 2002-184676, for example, may be provided. The uneven illumination on the illuminated surface can also be controlled by setting the variable blade such that the width of the exposure region in the scanning direction may be different from that in the non-scanning direction.

Furthermore, the light intensity distribution on the pupil plane can be controlled by positioning the density filter plate disclosed in the above Japanese Laid-Open Patent Application No. 2002-100561 (U.S. Patent Publication No. 2003/0025890A) and Japanese Laid-Open Patent Application No. 2003-92253 (U.S. Patent Publication No. 2003/0067591A) adjacent to the illumination pupil, such as adjacent to the exit side of the micro lens array 8.

The telecentricity can be controlled by changing the lens position and orientation of at least a part of the plurality of lens elements forming the condenser optical system 9 shown in FIG. 1 or the condenser optical system 9a shown in FIG. 16 or 23.

In addition, by pre-calculating the relationships between the configuration of the polarized state switching device (insertion/removal of the depolarizer, a rotational angle of the half-wave plate, and a rotational angle of the quarter-wave plate) and the condition of the uneven illumination on the illuminated surface, the light intensity distribution on the pupil plane and the telecentricity, the uneven illumination on the illuminated surface, the light intensity distribution on the pupil plane and the telecentricity can be controlled in accordance with the configuration of the polarized state switching device. Furthermore, by measuring the uneven illumination on the illuminated surface, the light intensity distribution on the pupil plane, and the telecentricity on the illuminated surface or a surface optically conjugate to the illuminated surface, the uneven illumination on the illuminated surface, the light intensity distribution on the pupil plane, and the telecentricity may also be controlled in accordance with the result of the measurement.

In the above-described embodiments and exemplary modifications, the micro lens array 8, which is formed by a plurality of micro lenses having positive refractive power densely arranged in a matrix, is used as an optical integrator. However, instead of the micro lens array 8, a cylindrical micro lens array, which has a first one-dimensional cylindrical lens array arranged in a pitch along a predetermined first direction and a second one-dimensional cylindrical lens array arranged in a pitch along a second direction orthogonal to the first direction, may be used. It is preferable that the first and second one-dimensional cylindrical lens arrays of the cylindrical micro lens array are provided integrally with a single light transmissive substrate, and more particularly preferable that a plurality of cylindrical lens array plates having the first and second one-dimensional cylindrical lens arrays are provided and positioned spaced from each other along the direction of the optical axis. In addition, it is preferable that at least one of the pitch of the first one-dimensional cylindrical lens array in the first direction and the pitch of the second one-dimensional lens array in the second direction is less than 2 mm.

With this structure, unlike the ordinary fly's-eye lens, for which each refractive surface is formed in two-dimensional curvature (spherical shape), each refractive surface of the first and second one-dimensional cylindrical lens arrays of the cylindrical micro lens array is formed in one-dimensional curvature (cylindrical shape). Therefore, highly precision processes become easy, and thus, the manufacturing cost may be decreased. In particular, for the cylindrical micro lens array, in which the smallest pitch is 2 mm or less, the reduction in the manufacturing cost is significant. In addition, such a cylindrical micro lens array can be manufactured by grinding, etching, and/or tool-pressing processes.

By use of a cylindrical micro lens array that is highly precise in shape and manufactured at low cost, illumination with excellent uniformity may be achieved. Therefore, in combination with an enormous improvement in image forming characteristics using polarized illumination, micro patterns may be formed with high transfer accuracy throughout the entire exposure regions.

A cylindrical micro lens array is proposed in the specification and drawings of Applicant's Japanese Patent Application No. 2002-152634 (and corresponding U.S. Patent Publication No. 2004/0036977A). The present specification incorporates by reference the disclosure of U.S. Patent Publication No. 2004/0036977A in its entirety.

In the exposure apparatus according to the above-described embodiments, micro devices (semiconductor elements, imaging elements, liquid crystal display elements, thin film magnetic heads, etc.) may be manufactured by illuminating a mask (reticle) by an illumination optical system and exposing a transfer pattern formed on the mask onto a photosensitive substrate using a projection optical system. An exemplary method for obtaining a semiconductor device, as the micro device, by forming a predetermined circuit pattern on a wafer or the like, as the photosensitive substrate, using the exposure apparatus according to the above-described embodiments is explained below with reference to a flow chart shown in FIG. 12.

Figure 12:
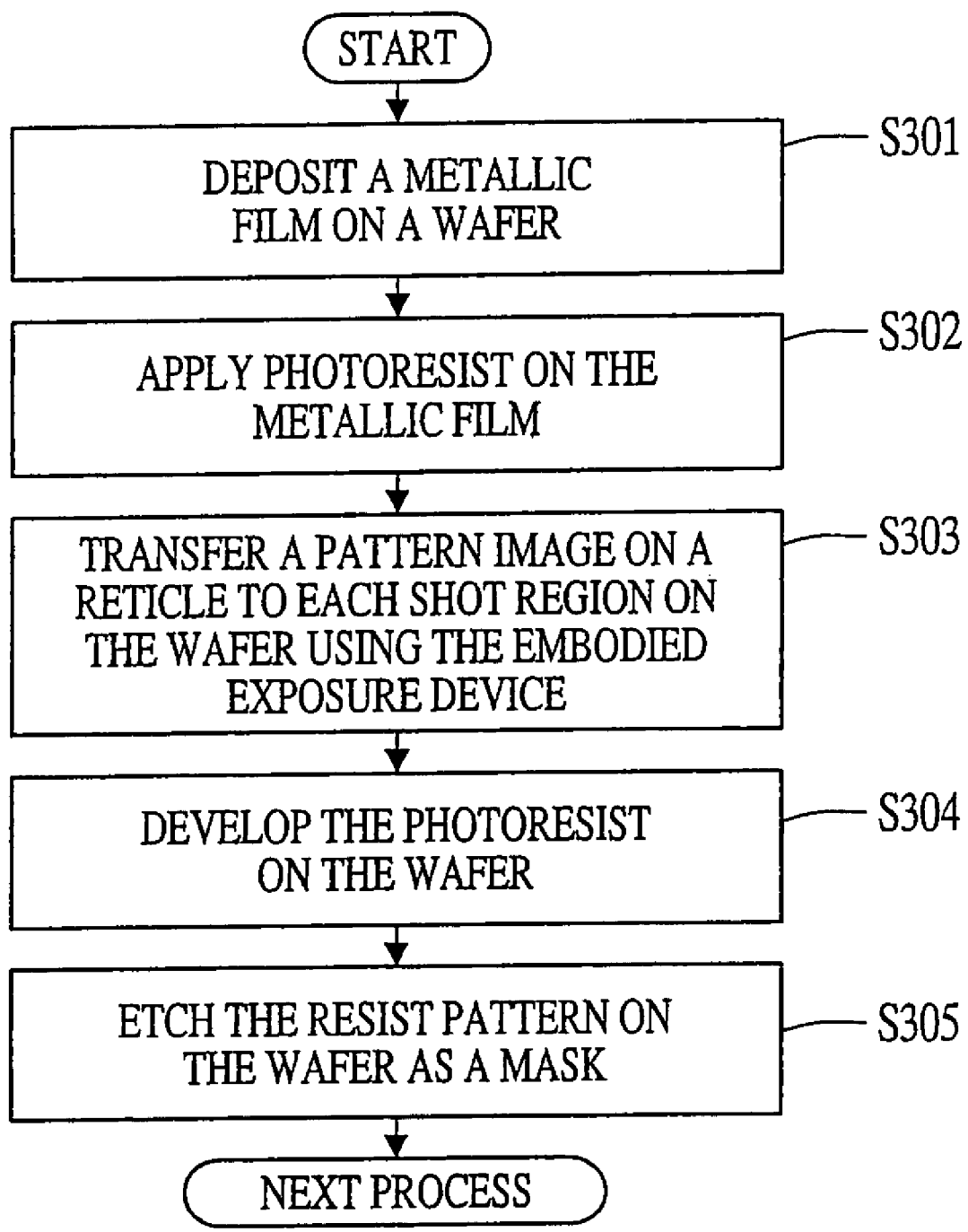
FIG. 12 is a flow chart of a method used for obtaining a liquid crystal display element as a micro device.

First, in step 301 in FIG. 12, a metallic film is vapor-deposited on the wafers of one lot. In next step 302, photoresist is applied onto the metallic film on the wafers of one lot. Thereafter, in step 303, using the exposure apparatus of the above-described embodiments, an image of a pattern on a mask is sequentially exposed and transferred onto each shot region on the wafers of one lot through a projection optical system. Then, after the photoresist on the wafers of one lot is developed in step 304, by etching the resist pattern on the wafers of one lot as a mask, a circuit pattern corresponding to the pattern on the mask is formed in each shot region on each wafer in step 305. By forming a circuit pattern on an upper layer, for example, a device such as a semiconductor device can be manufactured. According to the above-described method for manufacturing semiconductor devices, the semiconductor devices having an extremely micro circuit pattern may be obtained at good throughput.

Figure 13:
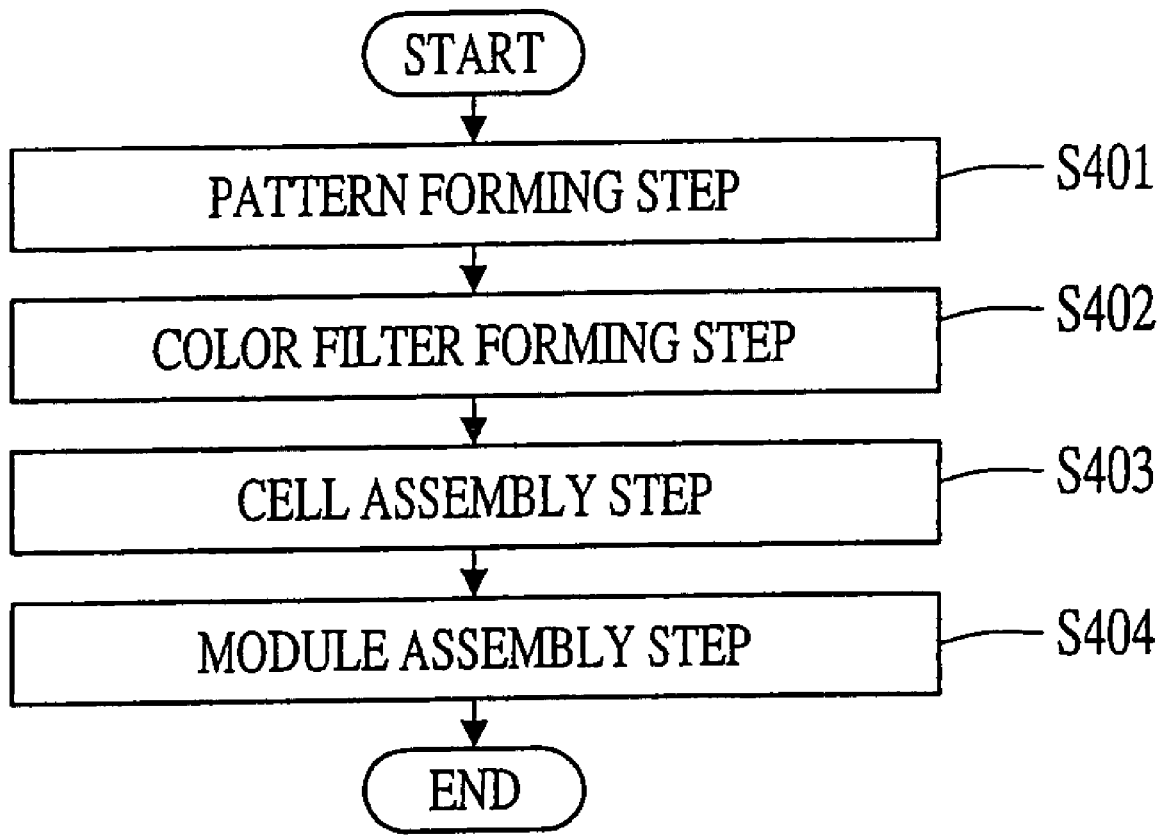
FIG. 13 is a flow chart of a method for obtaining a semiconductor element as a micro device.

Furthermore, in the exposure apparatus of the above-described embodiments, liquid crystal display elements may be obtained as the micro device by forming a predetermined pattern (circuit pattern, electrode pattern, etc.) on a plate (glass substrate). An exemplary method is explained below with reference to a flow chart shown in FIG. 13. In FIG. 13, in a pattern formation step 401, a so-called photolithography process is performed, in which a mask pattern is transferred and exposed onto a photosensitive substrate (a glass substrate or the like applied with resist) using the exposure apparatus in the above-described embodiments. By this photolithography process, a predetermined pattern that may include a large number of electrodes or the like is formed on the photosensitive substrate. Thereafter, the predetermined pattern is formed on the substrate as the exposed substrate proceeds with developing, etching, and resist removal processes. Then, the color filter formation step 402 is performed.

Next, in the color filter formation step 402, a color filter is formed, in which a large number of groups of three dots corresponding to R (red), G (green) and B (blue) is arranged in a matrix, or in which a plurality of groups of three strip filters corresponding to R, G and B, is arranged in the horizontal scan line direction. Then, after the color filter formation step 402, a cell assembly step 403 is performed. In the cell assembly step 403, a liquid crystal panel (liquid crystal cell) is assembled using the substrate having the predetermined pattern that is obtained in the pattern formation step 401 and the color filter obtained in the color filter formation step 402.

In the cell assembly step 403, the liquid crystal panel (liquid crystal cell) is manufactured by, for example, injecting liquid crystal material between the substrate having the predetermined pattern that is obtained in the pattern formation step 401 and the color filter obtained in the color filter formation step 402. Then, in a module assembly step 404, various parts, such as an electric circuitry and a backlight, that perform display operation for the assembled liquid crystal panel (liquid crystal cell) and provided to complete the process. According to the above-described method for manufacturing liquid crystal display elements, liquid crystal display elements having extremely micro circuit patterns can be obtained with good throughput.

In the embodiment shown in FIG. 1, the mask is illuminated superimposingly by collecting the light from the secondary light source by the condenser optical system 9. However, this invention is not limited to this. As shown in the exemplary modification shown in FIG. 16, an illumination field diaphragm (mask blind) and a relay optical system that forms an image of the illumination field diaphragm on the mask M may be arranged in the light path between the condenser optical system 9 and the mask M. In this case, the condenser optical system 9 illuminates the illumination field diaphragm superimposingly by collecting the light from the secondary light source. Therefore, the relay optical system forms on the mask M an image of an opening (light transmissive part) of the illumination field diaphragm.

Furthermore, in the above-described embodiments, KrF excimer laser light (wavelength: 248 nm) or ArF excimer laser light (wavelength: 193 nm) is used as the exposure light. However, the invention is not limited to this. This invention may be applied to other appropriate laser light sources, such as an $F_2$ laser light source that provides laser light at a wavelength of 157 nm, and light sources other than laser light sources, such as a lamp light source that provides ultraviolet light, such as i-line, g-line and h-line. Moreover, in the above-described embodiments, this invention is explained with respect to a projection exposure apparatus equipped with an illumination optical system as an example. However, this invention may be applied to a general illumination optical system for illuminating an illuminated surface other than a mask.

In addition, in the above-described embodiment, a so-called immersion method is used, in which the light path between the projection optical system and the photosensitive substrate is filled with a medium (typically liquid) having a refractivity greater than 1.1. In this case, as the method that fills the light path between the projection optical system and the photosensitive substrate with liquid, a method disclosed in International Publication No. WO99/49504 that locally fills with liquid, a method disclosed in Japanese Laid-Open Patent Application No. 6-124873 that moves a stage holding a substrate that is the object of exposure in a liquid tank, and a method disclosed in Japanese Laid-Open Patent Application No. 10-303114 that forms a liquid tank having a predetermined depth on a stage and holds a substrate therein, may be used. The disclosure of WO99/49504 is incorporated herein by reference in its entirety.

As the liquid, it is preferable to use one that has transmissivity for the exposure light, has a high refractivity, and is stable for a photoresist applied on the projection optical system and/or substrate. For example, purified water and deionized water may be used when KrF excimer laser light or ArF excimer laser light is used as the exposure light. Moreover, fluorinated liquid, such as fluorinated oil or fluoropolyether (PFPE), which can transmit $F_2$ laser light, may be used as the liquid when the $F_2$ laser light is used as the exposure light.

Furthermore, this invention may be used in a twin-stage type exposure apparatus disclosed in Japanese Laid-Open Patent Application Nos. 10-163099 and 10-214783 (and corresponding U.S. Pat. No. 6,400,441, the disclosure of which is incorporated herein by reference in its entirety), and PCT Publication No. 2000-505958 (and corresponding U.S. Pat. No. 5,969,441, the disclosure of which is incorporated herein by reference in its entirety), which provides two stages that hold processed substrates, such as wafers, separately and are independently movable in the XY directions.

As described above, in the illumination optical system of this invention, the polarized state of the light that illuminates the illuminated surface may be switched between a specified polarized state (e.g., linearly polarized state) and nonpolarized state by the function of the polarized state switching device structured from a half-wave plate and a depolarizer (nonpolarized element). Therefore, when the illumination optical system of this invention is installed an exposure apparatus, for example, excellent illumination conditions can be achieved by changing the polarized state of the illumination light while controlling the loss of light amount in accordance with the characteristics of mask patterns.

Moreover, in the exposure apparatus that uses the illumination optical system and exposure method of this invention, because excellent illumination conditions may be achieved by changing the polarized state of the illumination light in accordance with the characteristics of the pattern on the mask M, excellent exposure can be performed under the excellent illumination conditions achieved in accordance with the characteristics of the patterns on the mask M. Therefore, excellent devices at a high throughput can be manufactured.

While the invention has been described with reference to preferred embodiments thereof, it is to be understood that the invention is not limited to the preferred embodiments or constructions. The invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. An illumination optical system for use with an exposure apparatus including a projection optical system and that illuminates a pattern onto an illuminated surface with light including a predetermined polarized state supplied from a light source, the illumination optical system comprising:
    a light directing device that directs the light from the light source to the illuminated surface, the light directing device being positioned in a light path between the light source and the illuminated surface;
    a pupil intensity distribution forming device that forms a predetermined light intensity distribution at a position conjugate to a pupil of the projection optical system or a position adjacent thereto;
    a pupil intensity distribution changing device that changes at least one of a shape and a size of the predetermined light intensity distribution, and that changes at least one of the shape and the size of the predetermined light intensity distribution in accordance with pattern characteristics of the pattern;
    a polarized state fluctuation correcting device that corrects fluctuations in the polarized state on the illuminated surface, the polarized state fluctuation correcting device being positioned in the light path between the light source and the illuminated surface; and
    a polarized state changing device that is positioned in the light path between the light source and the illuminated surface and changes the polarized state of the light that illuminates the illuminated surface in accordance with at least one of the shape and the size of the predetermined light intensity distribution.

2. The illumination optical system of claim 1, wherein the polarized state fluctuation correcting device comprises:
    a polarized state adjusting device that adjusts the polarized state on the illuminated surface, the polarized state adjusting device being positioned in the light path between the light source and the illuminated surface;
    a polarization monitor that detects the polarized state of the light, the polarization monitor being positioned in the light path between the light source and the illuminated surface; and
    a controller that controls the polarized state adjusting device in accordance with an output from the polarization monitor.

3. The illumination optical system of claim 2, wherein the polarized state adjusting device comprises an adjustable phase plate positioned in the light path between the light source and the polarization monitor.

4. The illumination optical system of claim 1, wherein the light directing device comprises an optical member including a characteristic that changes the polarized state of incident light that the light directing device ejects.

5. The illumination optical system of claim 4, wherein the optical member is formed by a crystal optical material.

6. The illumination optical system of claim 1, wherein the polarized state fluctuation correcting device corrects fluctuations in the polarized state on the illuminated surface, which originates in a light transmissive member in the light directing device.

7. The illumination optical system of claim 6, wherein the light transmissive member is formed by a crystal optical material.

8. The illumination optical system of claim 7, wherein the light transmissive member is formed by a cubic system crystal material and positioned in the light path between the light source and the illuminated surface, the light transmissive member being configured such that a traveling direction of the light becomes closer to a crystal orientation <111> or <100> than to a crystal orientation <110>.

9. The illumination optical system of claim 8, wherein
    the polarized state fluctuation correcting device comprises
        a polarized state adjusting device that is positioned in the light path between the light source and the illuminated surface and that adjusts the polarized state on the illuminated surface, and
    the light transmissive member is formed by a cubic system crystal material and is positioned in the light path between the light source and the polarized state adjusting device, the light transmissive member being configured such that a traveling direction of the light becomes closer to a crystal orientation <111> or <100> than to a crystal orientation <110>.

10. The illumination optical system of claim 8, wherein the light transmissive member includes an optical member fixedly positioned in the light path, and an optical axis of the optical member is configured to substantially match the crystal orientation <111> or <100>.

11. The illumination optical system of claim 8, wherein the light transmissive member includes a rectangular prism as a rear surface reflection mirror,
   an incident surface and an exit surface of the rectangular prism are configured to substantially match a crystal plane {100}, and
   a reflection surface of the rectangular prism is configured to substantially match a crystal plane {110}.

12. The illumination device of claim 8, wherein the light transmissive member includes a plane parallel plate for moving light entering along the optical axis in parallel, the light transmissive member being provided in the light path and inclinable with respect to the optical axis, and
   the optical axis of the plane parallel plate is configured to substantially match the crystal orientation <100>.

13. The illumination optical system of claim 1, wherein the polarized state fluctuation correction device corrects time-lapse fluctuations of the polarized state on the illuminated surface.

14. The illumination optical system of claim 1, wherein the polarized state fluctuation correct device kinematically holds an optical element disposed in the light path between the light source and the illuminated surface.

15. An exposure apparatus, comprising the illumination optical system of claim 1.

16. The exposure apparatus of claim 15, further comprising:
   a projection optical system positioned in the light path between a first plane at which a mask is positioned, and a second plane at which a photosensitive substrate is positioned, the projection optical system forming an image of a pattern on the mask onto the second plane.

17. The exposure apparatus of claim 16, wherein
   the polarized state changing device comprises a polarized state switching device that switches the polarized state of the light that illuminates the illuminated surface between a predetermined polarized state and a nonpolarized state, and
   the polarized state switching device switches between the predetermined polarized state and the nonpolarized state in accordance with a change in at least one of the shape and the size of the predetermined light intensity distribution.

18. The exposure apparatus of claim 16, wherein
   the pupil intensity distribution forming device forms two areas including a high light intensity distribution that are spaced away from each other along a pitch direction of a line-and-space pattern formed on the mask, and
   the polarized state changing device sets the polarized state of the light that illuminates the illuminated surface from the two areas including a high light intensity distribution to a linearly polarized state that includes a polarization plane in a direction orthogonal to the pitch direction.

19. The exposure apparatus of claim 18, wherein the two areas including a high light intensity distribution are formed symmetrically about the optical axis of the illumination optical system, and
   a value σo defined by a ratio φo/φp satisfies the following condition:

$0.7 \leq \sigma o$ where φo is a diameter of a circle about the optical axis that circumscribes the two areas including a high light intensity distribution, and φp is a diameter of the pupil plane.

20. The exposure apparatus of claim 18, wherein the two areas including a high light intensity distribution are formed symmetrically about the optical axis of the illumination optical system, and
   a value σo defined by a ratio φo/φp and φi defined by a ratio φi/φp satisfy the following condition:

$0.5 \leq \sigma o / \sigma i$ where φo is a diameter of a circle about the optical axis that circumscribes the two areas including a high light intensity distribution, φp is a diameter of the pupil plane, and φi is a diameter of a circle about the optical axis that inscribes the two areas including a high light intensity distribution.

21. The exposure apparatus of claim 16, wherein
   the pupil intensity distribution forming device forms one area including a high light intensity distribution substantially about the optical axis of the illumination optical system, and
   the polarized state changing device sets the polarized state of the light that illuminates the illuminated surface from the one area including a high light intensity distribution to the linearly polarized state that includes a polarization plane in a direction substantially orthogonal to the pitch direction of the line-and-space pattern formed on a phase shift mask as the mask.

22. The exposure apparatus of claim 21, wherein a value σo that is defined by a ratio φo/φp satisfies the following condition:

$\sigma o \leq 0.4$ where φo is a size of the one area including a high light intensity distribution, and φp is a diameter of the pupil plane.

23. An exposure method, comprising:
   illuminating a mask through the illumination optical system of claim 1; and
   exposing an image of the pattern onto a photosensitive substrate positioned on the illuminated surface.

24. The exposure method of claim 23, further comprising:
   forming the image of the pattern using a projection optical system;
   forming a predetermined light intensity distribution at a position conjugate to a pupil of the projection optical system or a position adjacent thereto; and
   changing at least one of a shape or a size of the predetermined light intensity distribution.

25. The exposure method of claim 24, wherein the changing the at least one of a shape or a size of the predetermined light intensity distribution changes at least one of the shape and the size of the predetermined light intensity distribution in accordance with the pattern characteristics;
   the exposure method further comprises changing a polarized state of the light that illuminates the illuminated surface in accordance with a change in the at least one of the shape and the size of the predetermined light intensity distribution.

26. The exposure method of claim 25, wherein the forming the predetermined light intensity distribution forms two areas including a high light intensity distribution spaced away from each other along a pitch direction of a line-and-space pattern, the exposure method further comprising setting the polarized state of the light that illuminates the illuminated surface from the two areas including a high light intensity distribution to a linearly polarized state that includes a polarization plane in a direction substantially orthogonal to the pitch direction.

27. The exposure method of claim 26, wherein
the two areas including a high light intensity distribution are formed symmetrically about the optical axis of the illumination optical system, and
a value σo defined by a ratio φo/φp satisfies the following condition:

$0.7 \leq \sigma o$ where φo is a diameter of a circle about the optical axis that circumscribes the two areas including a high light intensity distribution, and φp is a diameter of the pupil plane.

28. The exposure method of claim 26, wherein
the two areas including a high light intensity distribution are formed symmetrically about the optical axis of the illumination optical system, and
a value σo defined by a ratio φo/φp and φi defined by a ratio φi/φp satisfy the following condition:

$0.5 \leq \sigma i / \sigma o$ where φo is a diameter of a circle about the optical axis that circumscribes the two areas including a high light intensity distribution, φp is a diameter of the pupil plane, and φi is a diameter of a circle about the optical axis that inscribes the two areas including a high light intensity distribution.

29. An illumination optical system that illuminates an illuminated surface with light including a predetermined polarized state supplied from a light source, comprising:
a light directing device that directs the light from the light source to the illuminated surface, the light directing device being positioned in a light path between the light source and the illuminated surface; and
a polarized state fluctuation correcting device that corrects fluctuations in the polarized state on the illuminated surface, which originates in a light transmissive member formed by a cubic system crystal material in the light directing device, the light transmissive member is positioned in the light path between the light source and the illuminated surface, the polarized state fluctuation correcting device being positioned in the light path between the light source and the illuminated surface,
wherein the light transmissive member includes a rectangular prism as a rear surface reflection mirror,
an incident surface and an exit surface of the rectangular prism are configured to substantially match a crystal plane {100}, and
a reflection surface of the rectangular prism is configured to substantially match a crystal plane {110}.

30. An illumination optical system that illuminates an illuminated surface with light including a predetermined polarized state supplied from a light source, comprising:
a light directing device that directs the light from the light source to the illuminated surface, the light directing device being positioned in a light path between the light source and the illuminated surface; and
a polarized state fluctuation correcting device that corrects fluctuations in the polarized state on the illuminated surface, which originates in a light transmissive member formed by a cubic system crystal material in the light directing device, the light transmissive member is positioned in the light path between the light source and the illuminated surface, the polarized state fluctuation correcting device being positioned in the light path between the light source and the illuminated surface,
wherein the light transmissive member includes a plane parallel plate for moving light entering along the optical axis in parallel, the light transmissive member being provided in the light path and inclinable with respect to the optical axis, and
the optical axis of the plane parallel plate is configured to substantially match the crystal orientation <100>.

* * * * *